(12) United States Patent
Peng et al.

(10) Patent No.: US 11,764,277 B2
(45) Date of Patent: Sep. 19, 2023

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventors: Yu-Fan Peng, New Taipei (TW); Yuan-Ching Peng, Hsinchu (TW); Yu-Bey Wu, Hsinchu (TW); Yu-Shan Lu, Zhubei (TW); Ying-Yan Chen, Hsinchu (TW); Yi-Cheng Li, Yunlin County (TW); Szu-Ping Lee, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 42 days.

(21) Appl. No.: 17/339,107

(22) Filed: Jun. 4, 2021

(65) Prior Publication Data

US 2022/0393012 A1 Dec. 8, 2022

(51) Int. Cl.
*H01L 21/8234* (2006.01)
*H01L 29/66* (2006.01)
(Continued)

(52) U.S. Cl.
CPC ............... *H01L 29/42392* (2013.01); *H01L 21/823418* (2013.01); *H01L 21/823431* (2013.01);
(Continued)

(58) Field of Classification Search
CPC ..... H01L 21/823431; H01L 21/823821; H01L 21/823481; H01L 21/823878; H01L 29/42392; H01L 29/0673; H01L 29/78696; H01L 29/66439; H01L 29/775; H01L 29/66545; H01L 29/66795; H01L 29/785–7851; H01L 27/0086; H01L 27/1211; H01L 27/0924
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 106128958 A * 11/2016 ..... H01L 21/823821
DE 102020110169 A1 * 5/2021 ............. B82Y 40/00

*Primary Examiner* — Errol V Fernandes
*Assistant Examiner* — Jeremy J Joy
(74) *Attorney, Agent, or Firm* — Birch, Stewart, Kolasch & Birch, LLP

(57) ABSTRACT

A method for manufacturing a semiconductor structure includes forming a fin over a substrate, wherein the fin includes first semiconductor layers and second semiconductor layers alternating stacked. The method also includes forming an isolation feature around the fin, forming a dielectric feature over the isolation feature, forming a cap layer over the fin and the dielectric feature, oxidizing the cap layer to form an oxidized cap layer, forming source/drain features passing through the cap layer and in the fin, removing the second semiconductor layers in the fin to form nanostructures, and forming a gate structure wrapping around the nanostructures.

20 Claims, 48 Drawing Sheets

(51) Int. Cl.
*H01L 29/423* (2006.01)
*H01L 29/06* (2006.01)
*H01L 29/78* (2006.01)

(52) U.S. Cl.
CPC ............ *H01L 21/823468* (2013.01); *H01L 21/823481* (2013.01); *H01L 29/0653* (2013.01); *H01L 29/0673* (2013.01); *H01L 29/6656* (2013.01); *H01L 29/6681* (2013.01); *H01L 29/66545* (2013.01); *H01L 29/7851* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 * | 3/2017 | Ching .................. H01L 21/283 |
| 10,403,550 B2 * | 9/2019 | Chiang ................ H01L 27/092 |
| 2017/0104061 A1 * | 4/2017 | Peng .................. H01L 29/42392 |
| 2017/0110554 A1 * | 4/2017 | Tak ................... H01L 29/42392 |
| 2017/0154958 A1 * | 6/2017 | Fung ................. H01L 29/42392 |
| 2019/0088553 A1 * | 3/2019 | Van Dal ........... H01L 21/02532 |
| 2020/0135849 A1 * | 4/2020 | Chiang ............ H01L 29/78696 |
| 2020/0144394 A1 * | 5/2020 | Wu ................... H01L 21/31116 |
| 2020/0152770 A1 * | 5/2020 | Jang .................... H01L 29/0673 |
| 2020/0243666 A1 * | 7/2020 | Ching ................ H01L 27/0886 |
| 2020/0328123 A1 * | 10/2020 | Liu ........................ B82Y 10/00 |
| 2022/0359764 A1 * | 11/2022 | Ju ....................... H01L 29/0653 |

\* cited by examiner

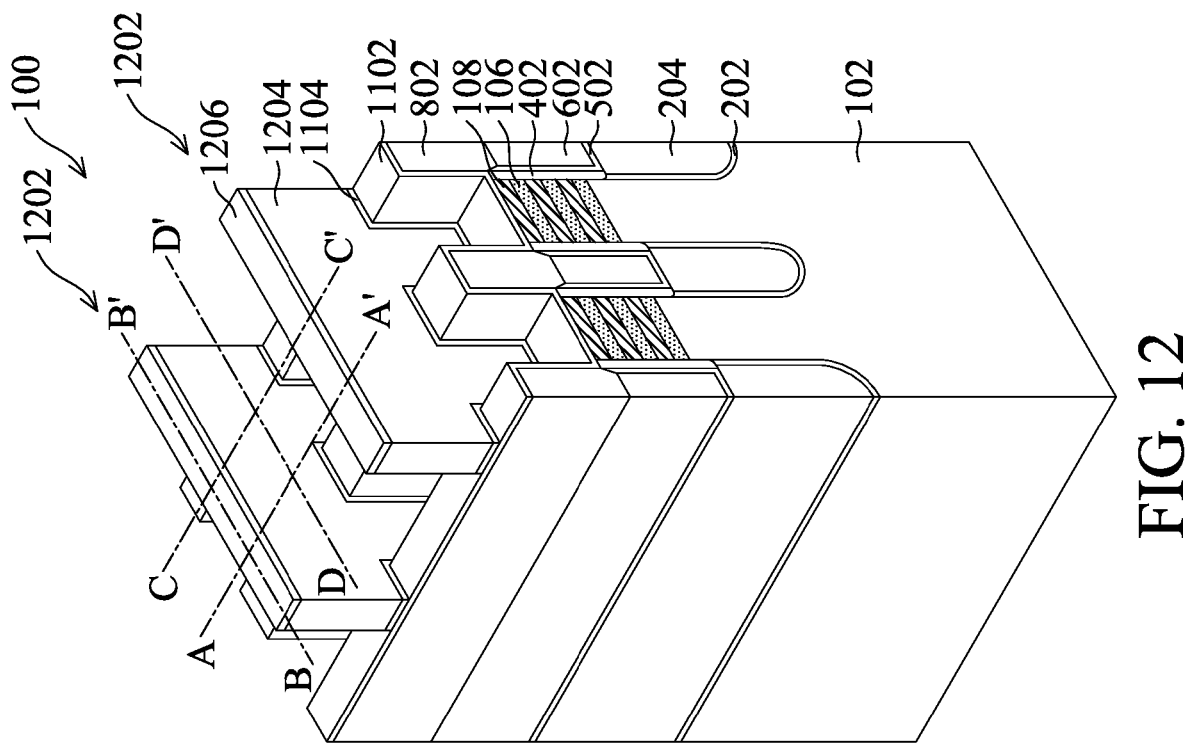
FIG. 12
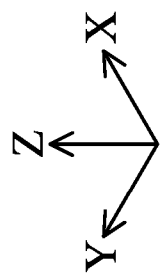

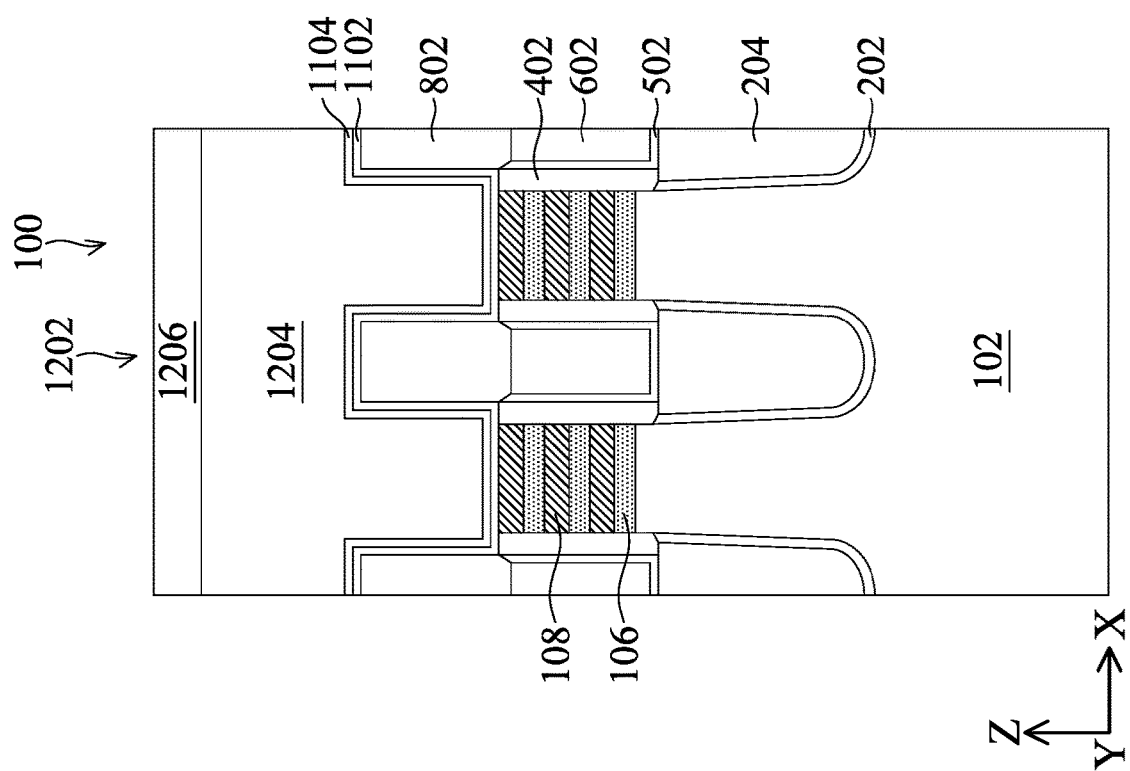
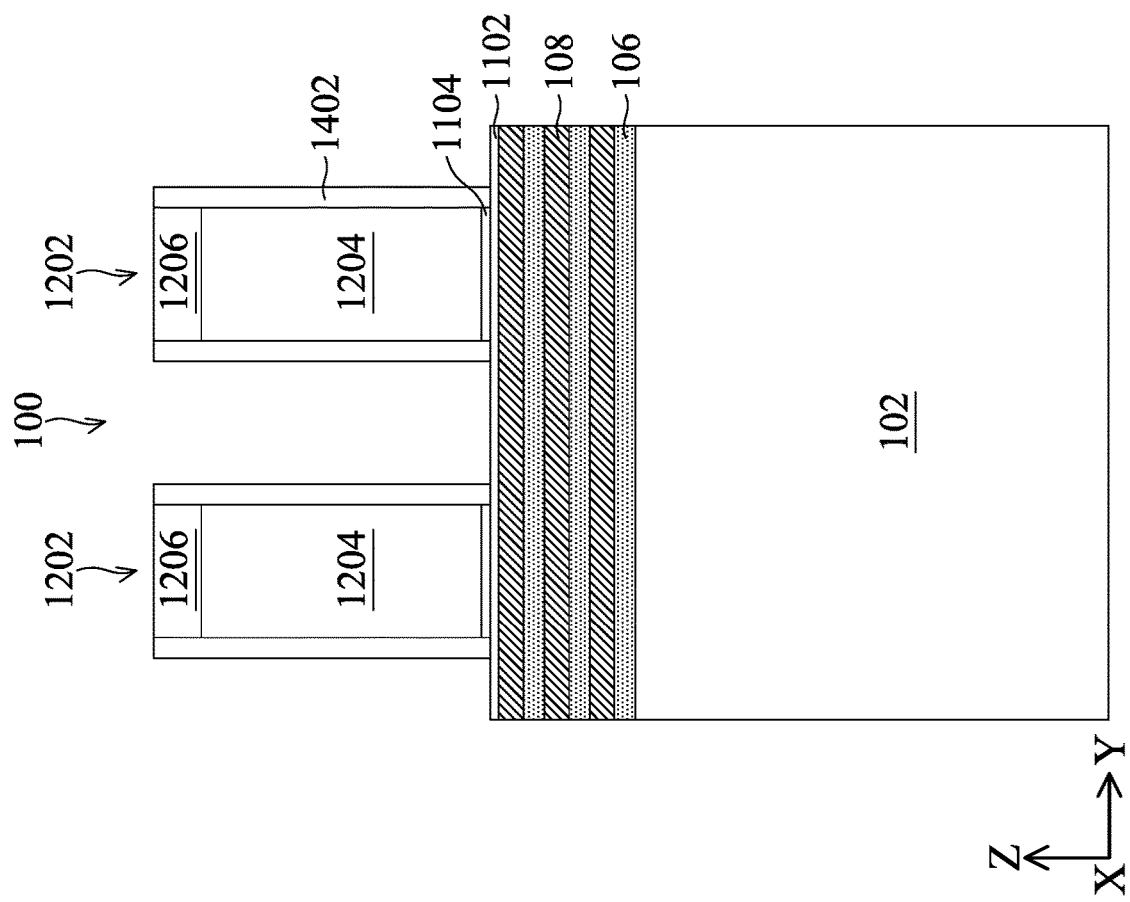
FIG. 15A
FIG. 15B

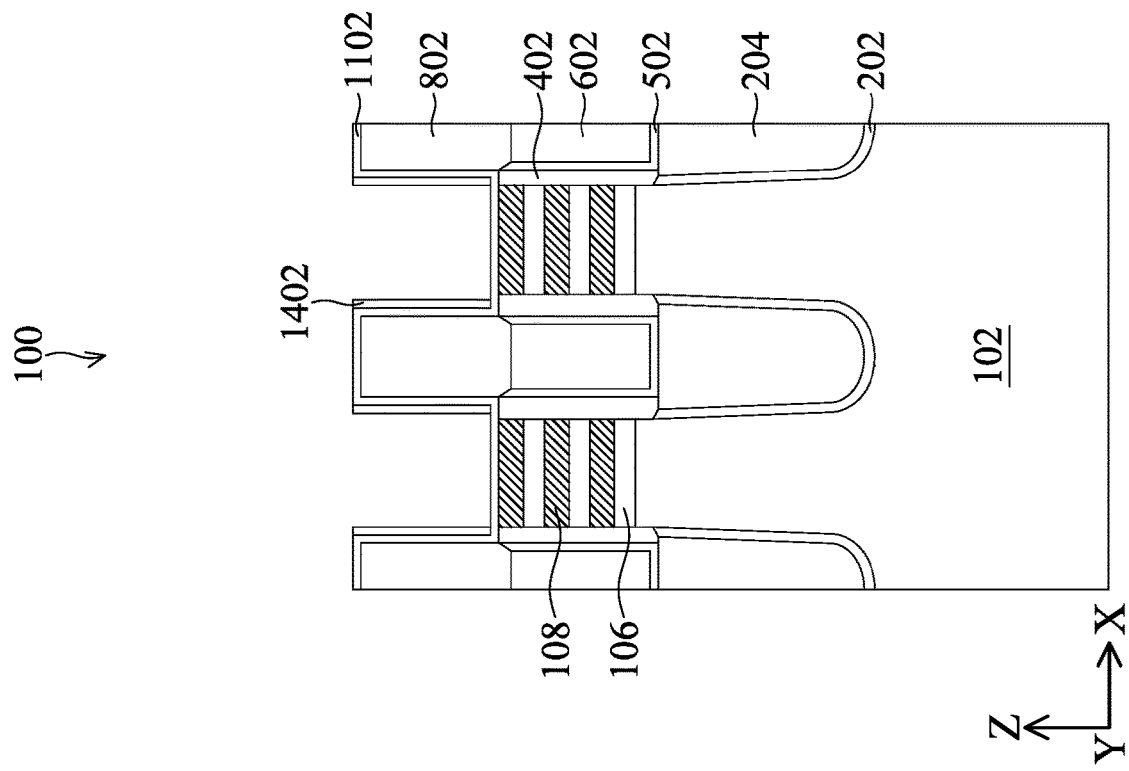
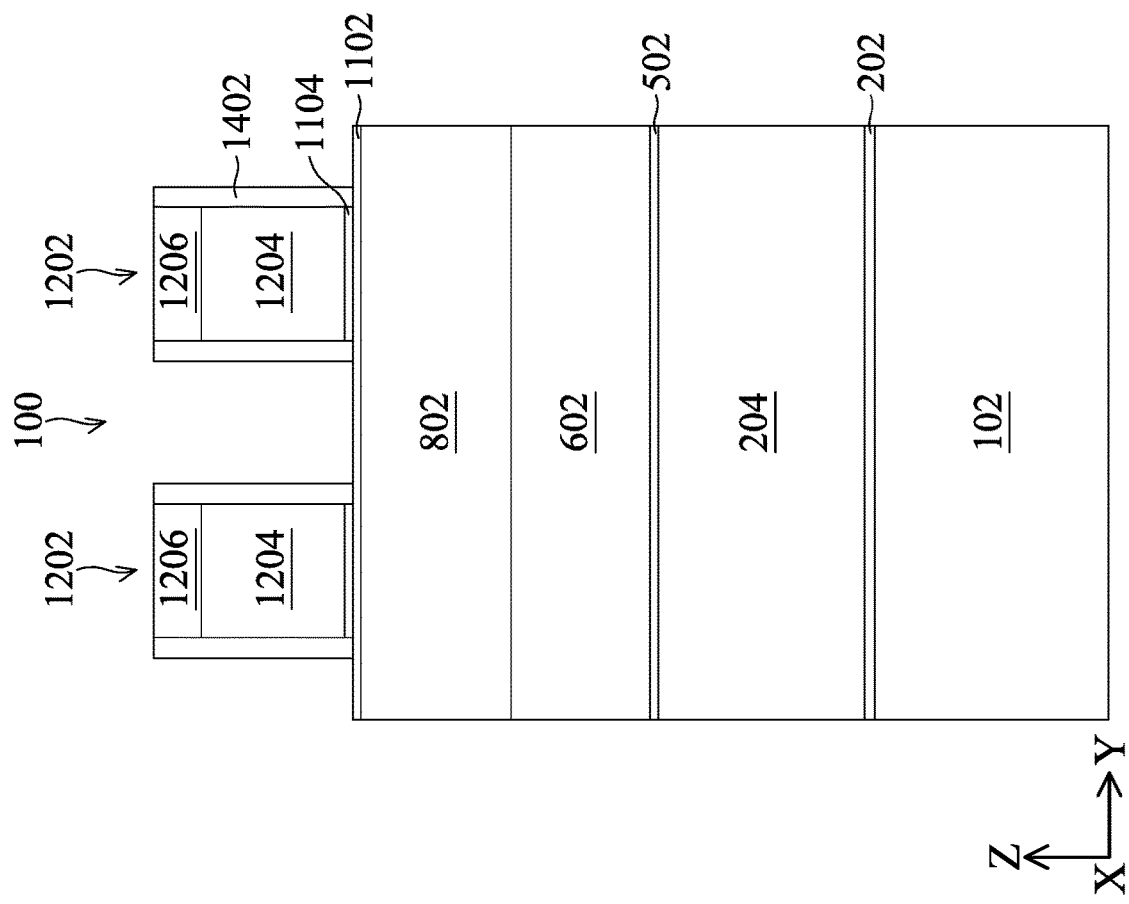
FIG. 15D
FIG. 15C

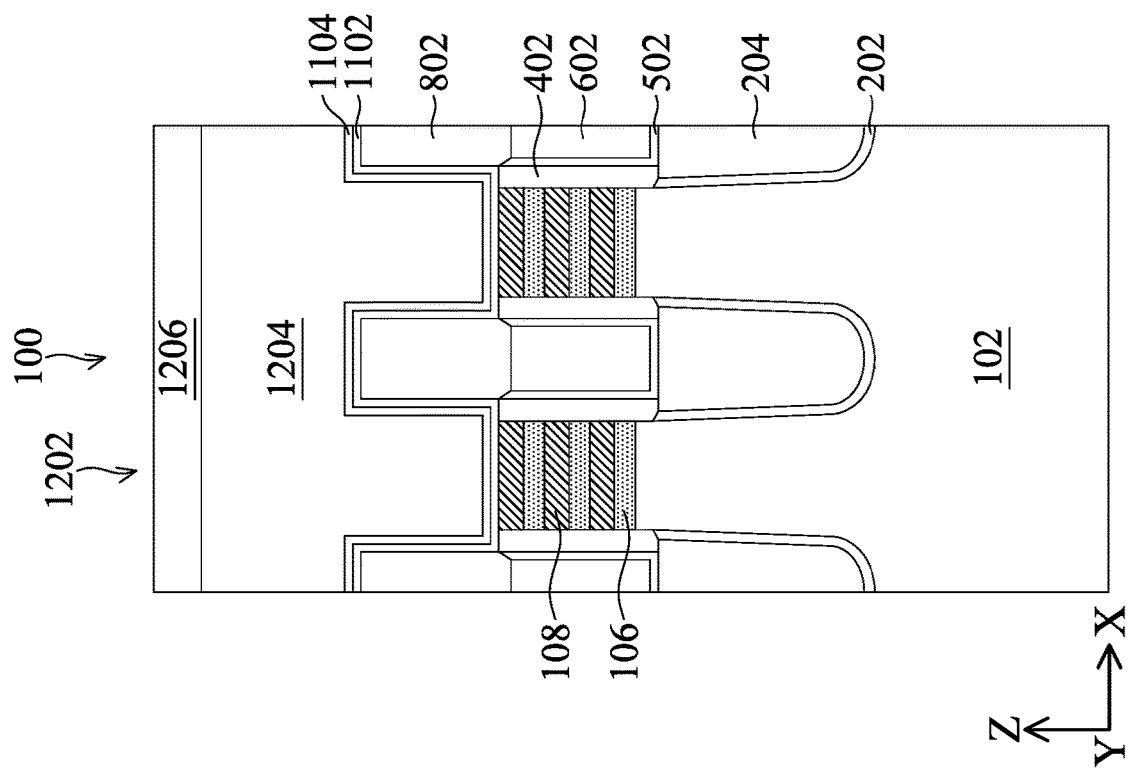
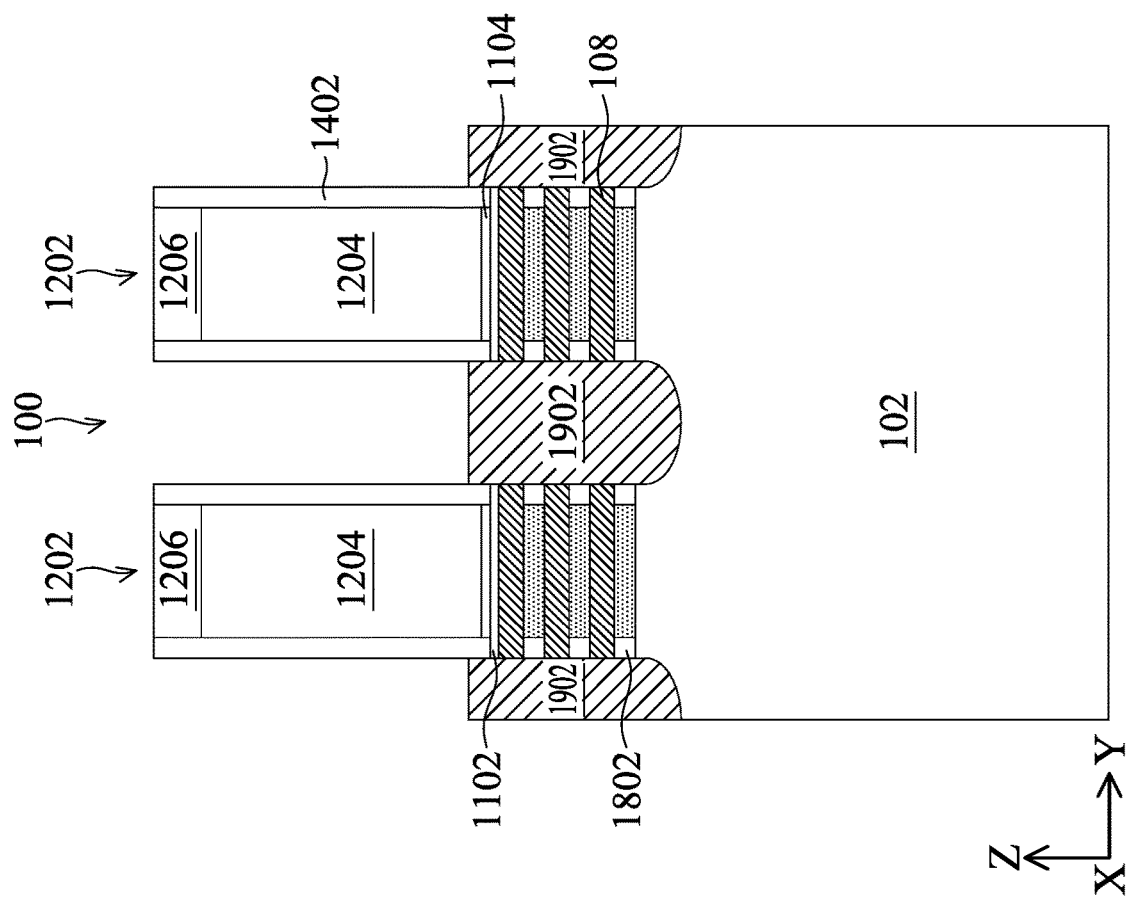
FIG. 19A
FIG. 19B

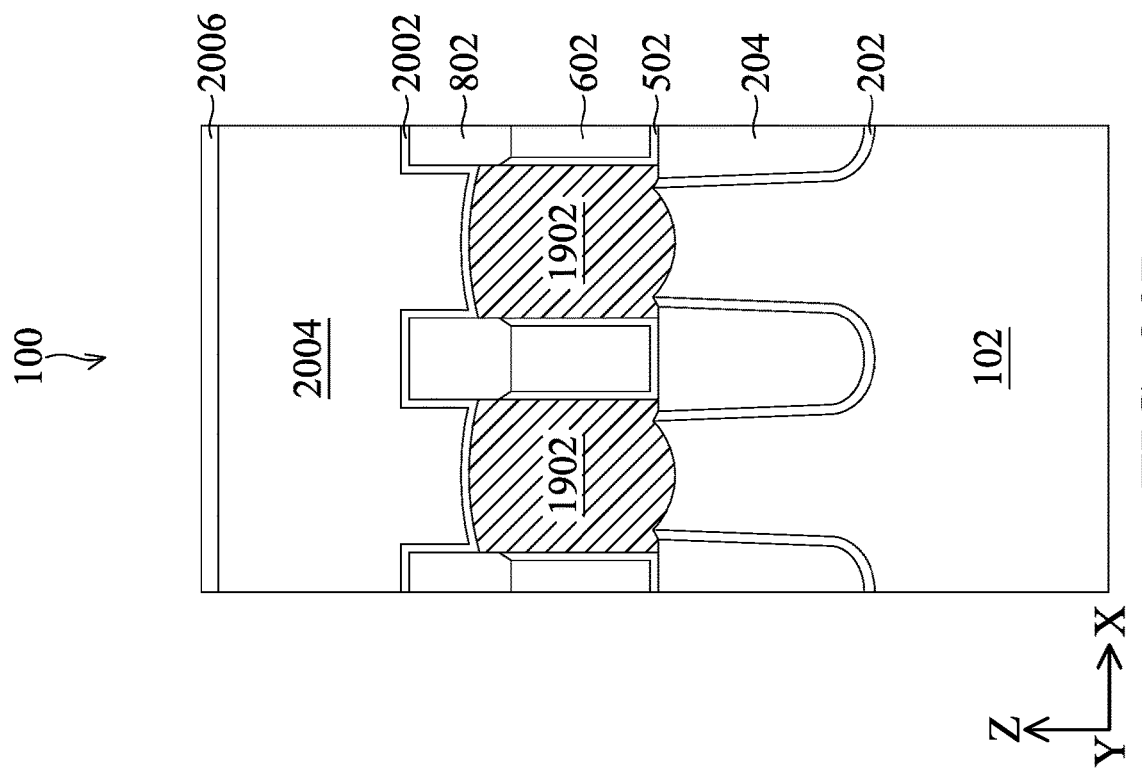
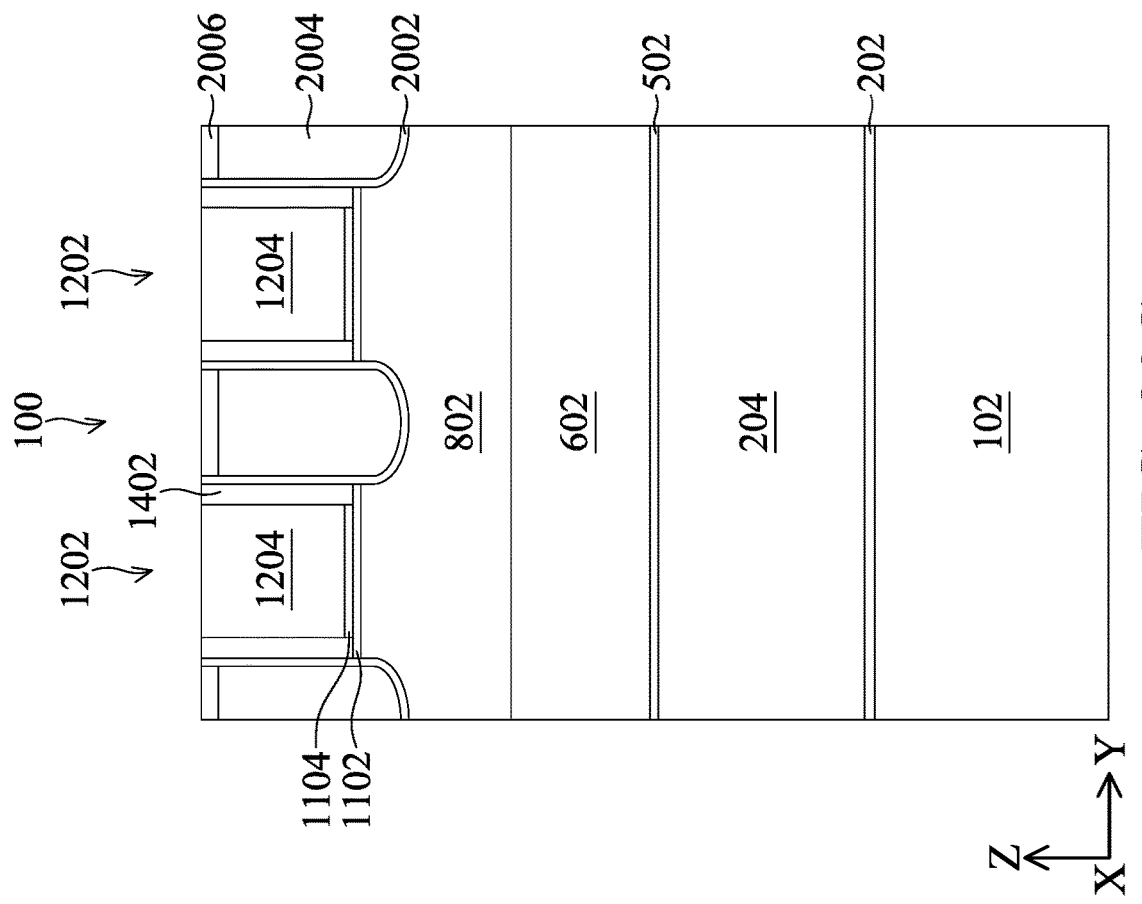

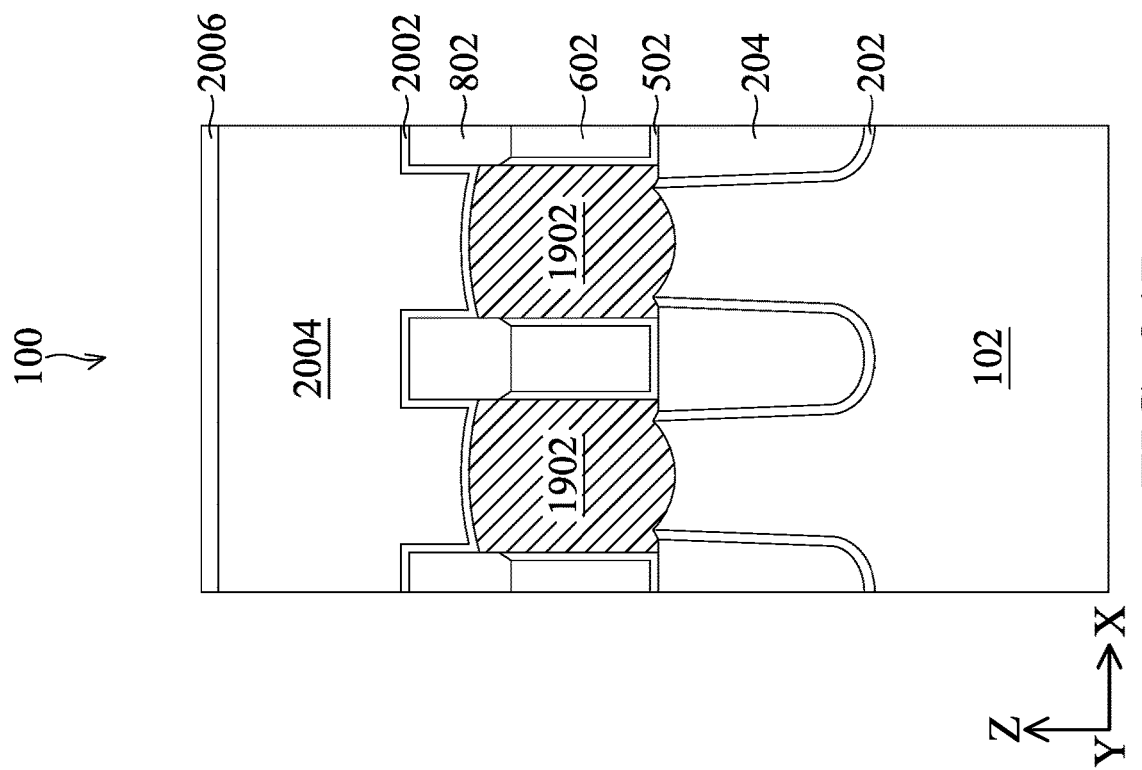
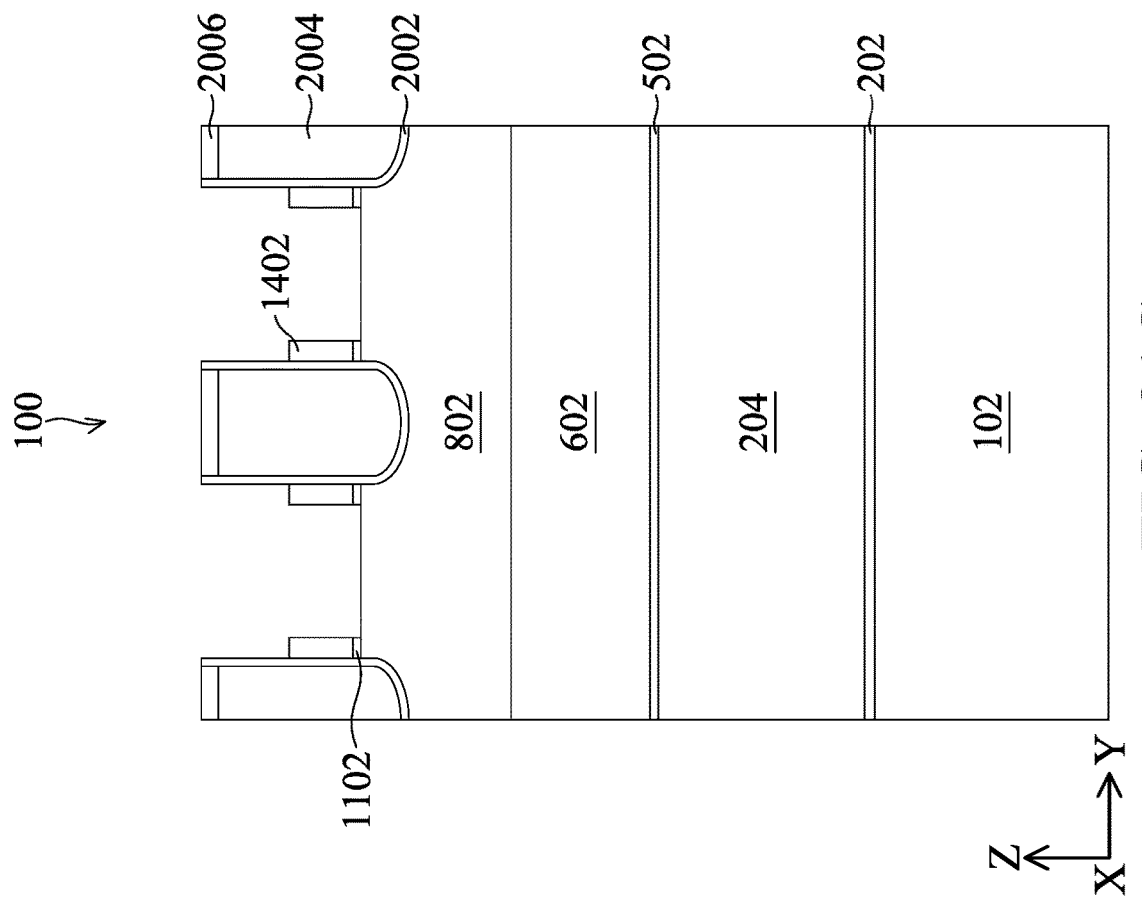
FIG. 21D
FIG. 21C

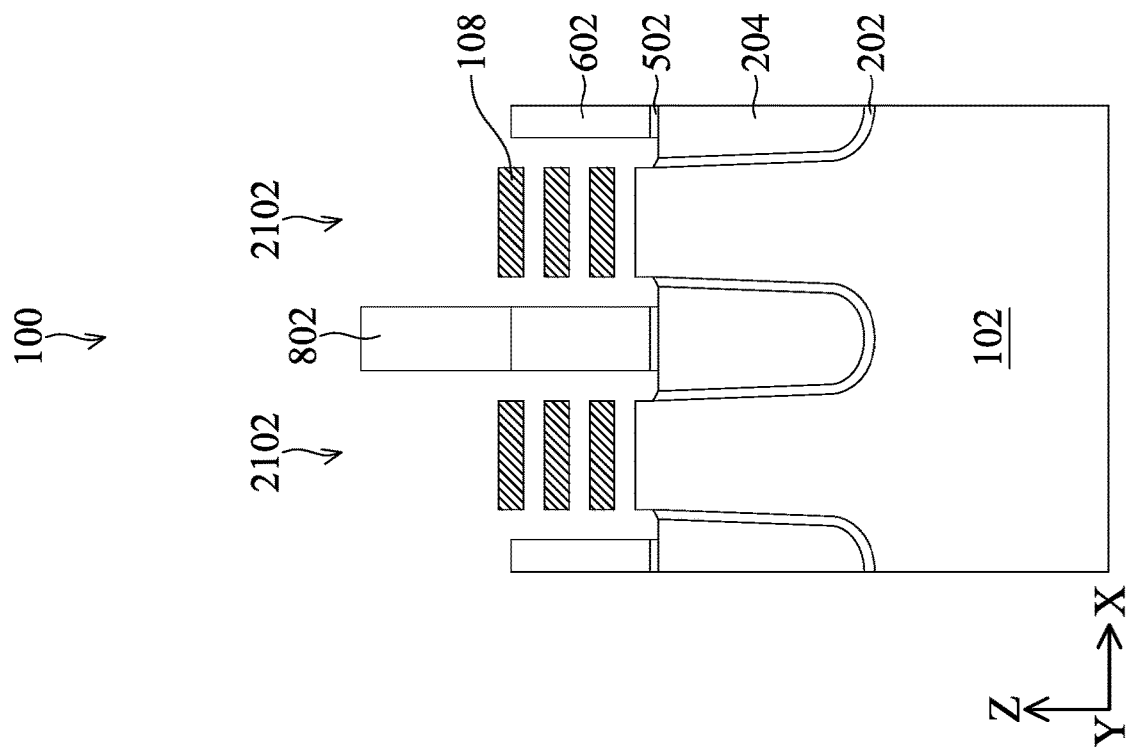
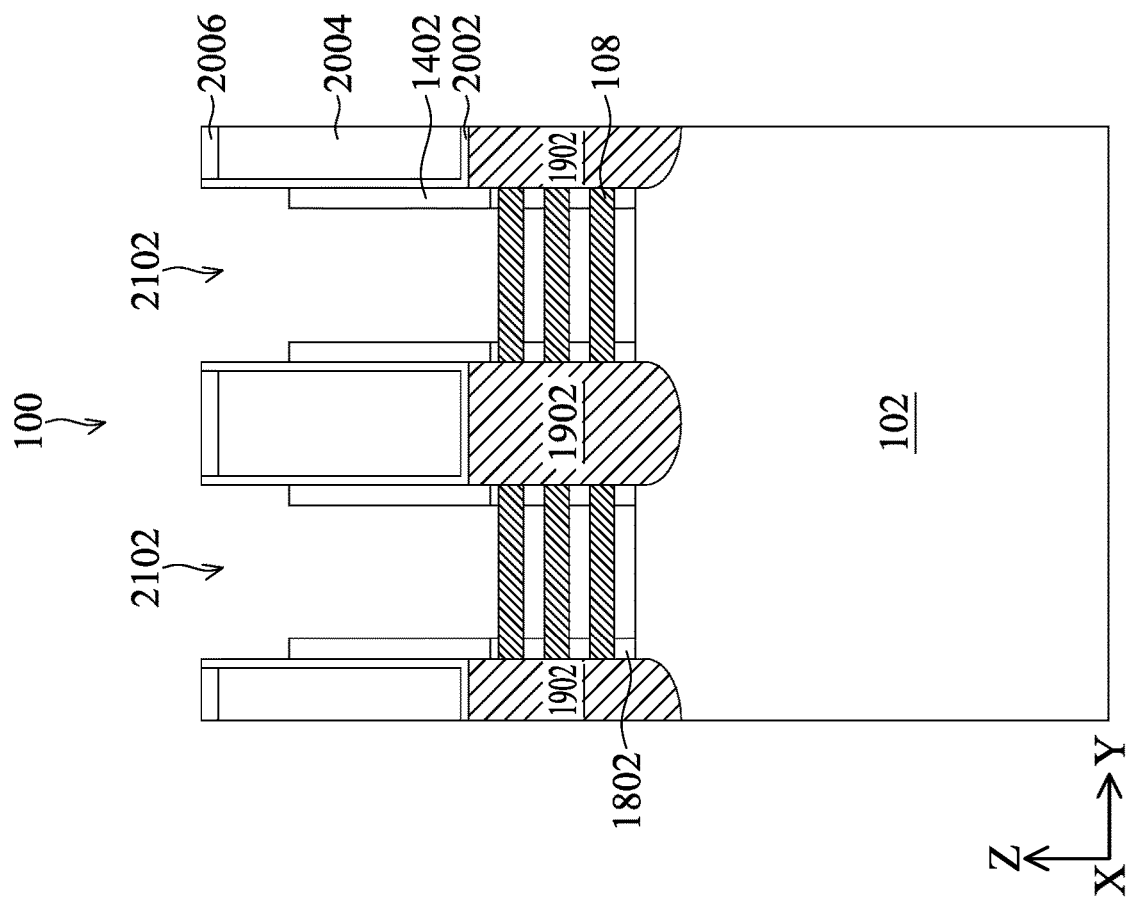

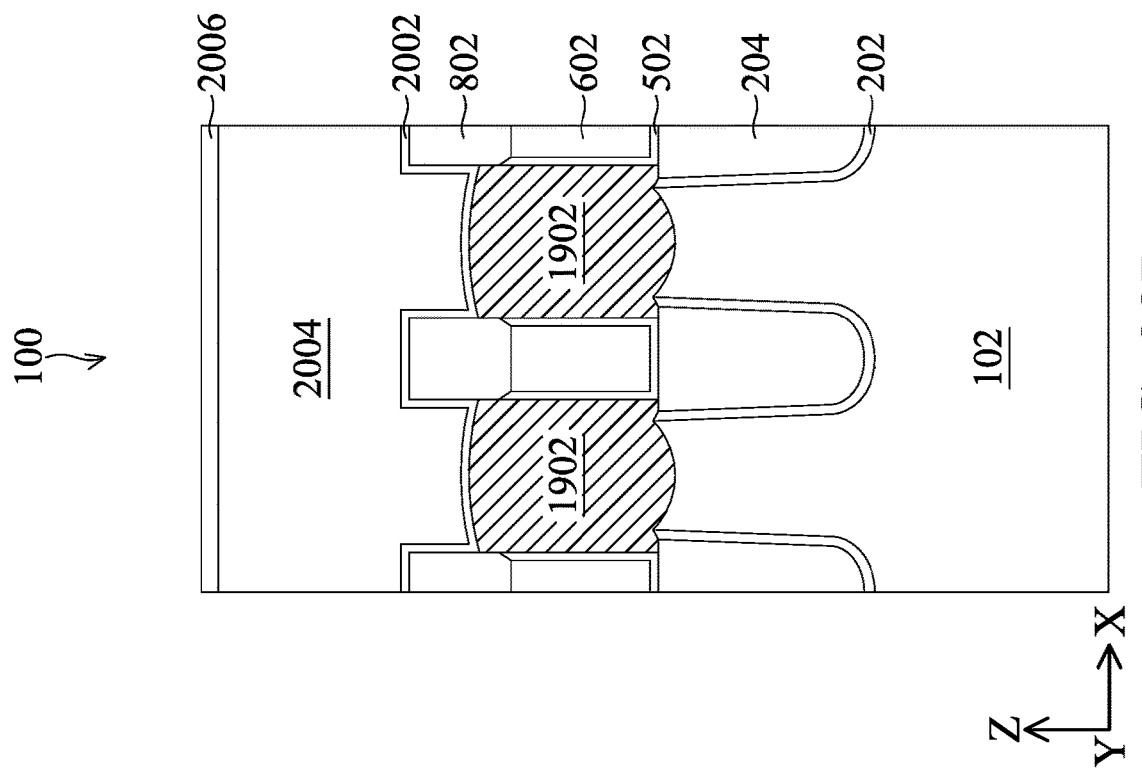
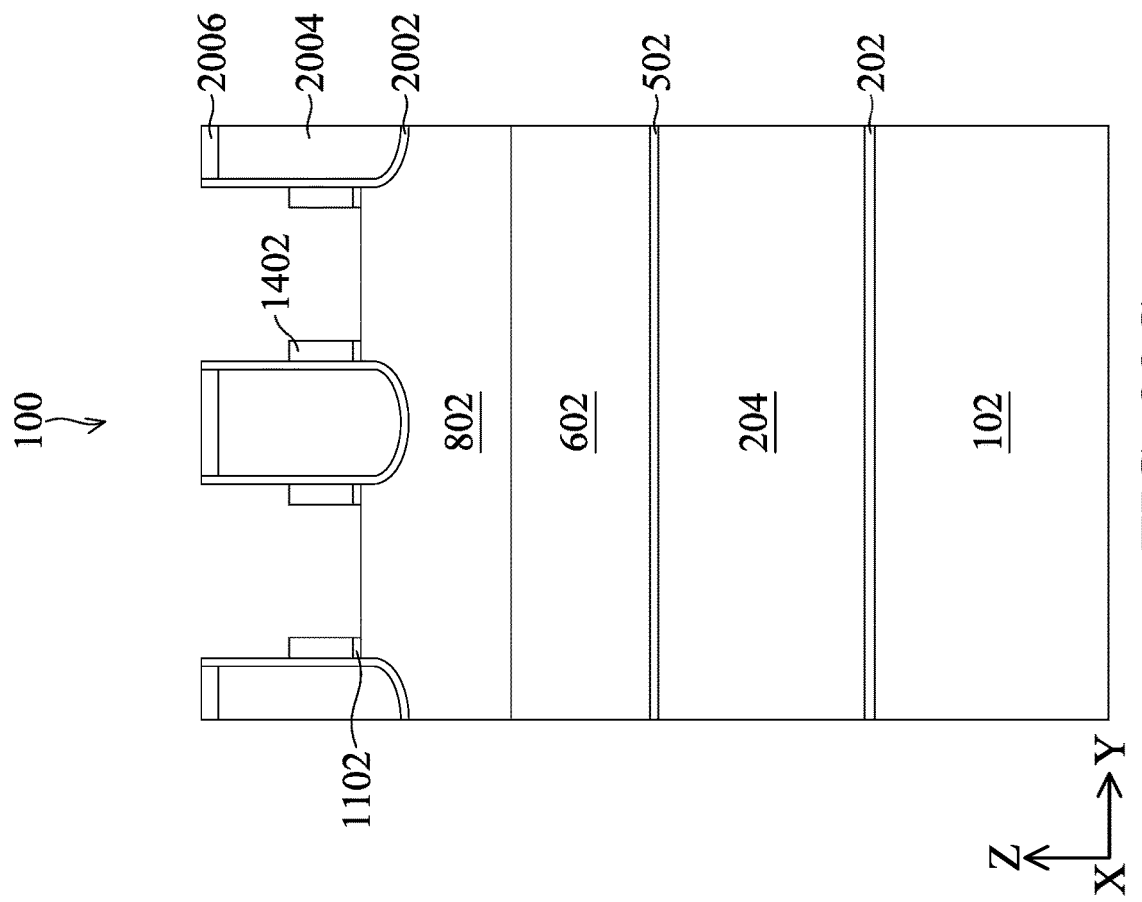
FIG. 22D
FIG. 22C

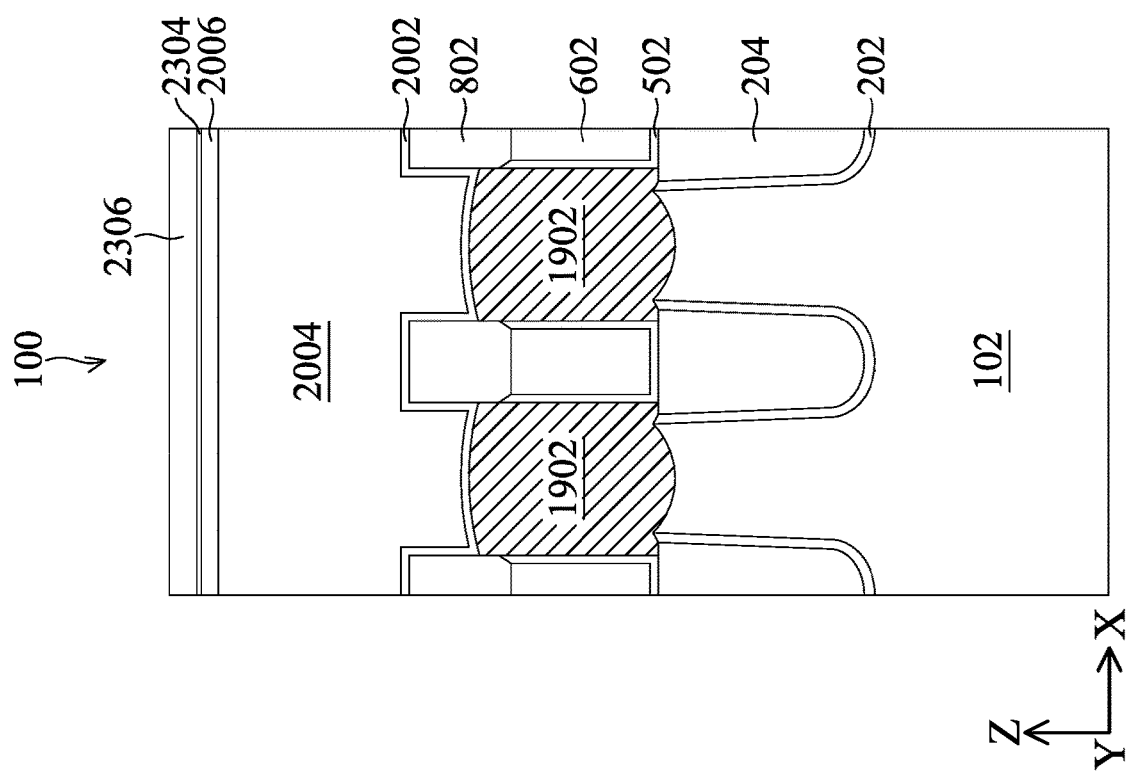
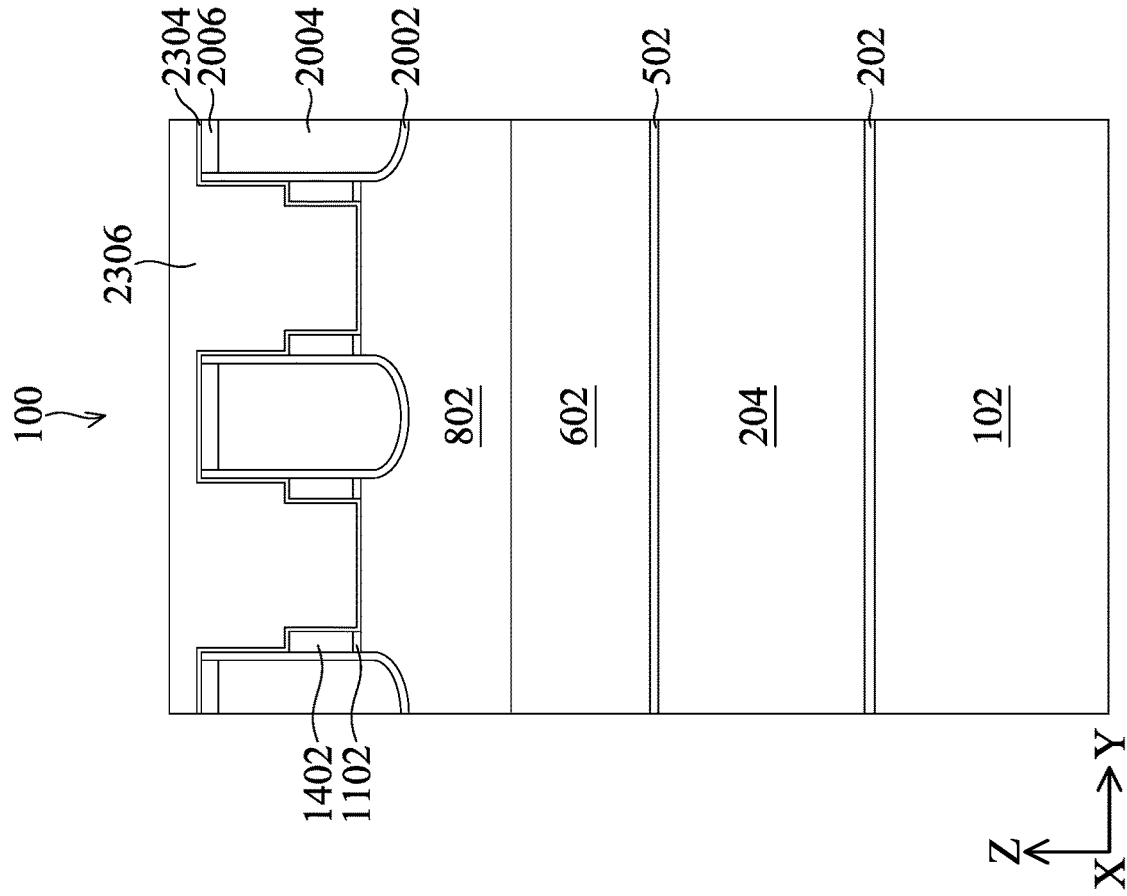
FIG. 23C
FIG. 23D

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins. However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12, 14 are isometric views of an embodiment of a workpiece of the present disclosure constructed at various fabrication stages, in accordance with some embodiments.

FIGS. 1B, 2B, 3B, 4B, 5B, 6B, 7B, 8B, 9B, 10B, 11B, 13A, 15A, 16A, 17A, 18A, 19A, 20A, 21A, 22A, 23A, 24A, and 25A are cross-sectional views of an embodiment of a workpiece of the present disclosure constructed at various fabrication stages along line A-A', in accordance with some embodiments.

FIGS. 1C, 2C, 3C, 4C, 5C, 6C, 7C, 8C, 9C, 10C, 11C, 13B, 15B, 16B, 17B, 18B, 19B, 20B, 21B, 22B, 23B, 24B, and 25B are cross-sectional views of an embodiment of a workpiece of the present disclosure constructed at various fabrication stages along line B-B', in accordance with some embodiments.

FIGS. 13C, 15C, 16C, 17C, 18C, 19C, 20C, 21C, 22C, 23C, 24C, and 25C are cross-sectional views of an embodiment of a workpiece of the present disclosure constructed at various fabrication stages along line C-C', in accordance with some embodiments.

FIGS. 13D, 15D, 16D, 17D, 18D, 19D, 20D, 21D, 22D, 23D, 24D, and 25D are cross-sectional views of an embodiment of a workpiece of the present disclosure constructed at various fabrication stages along line D-D', in accordance with some embodiments.

DETAILED DESCRIPTION

Figure 1A:
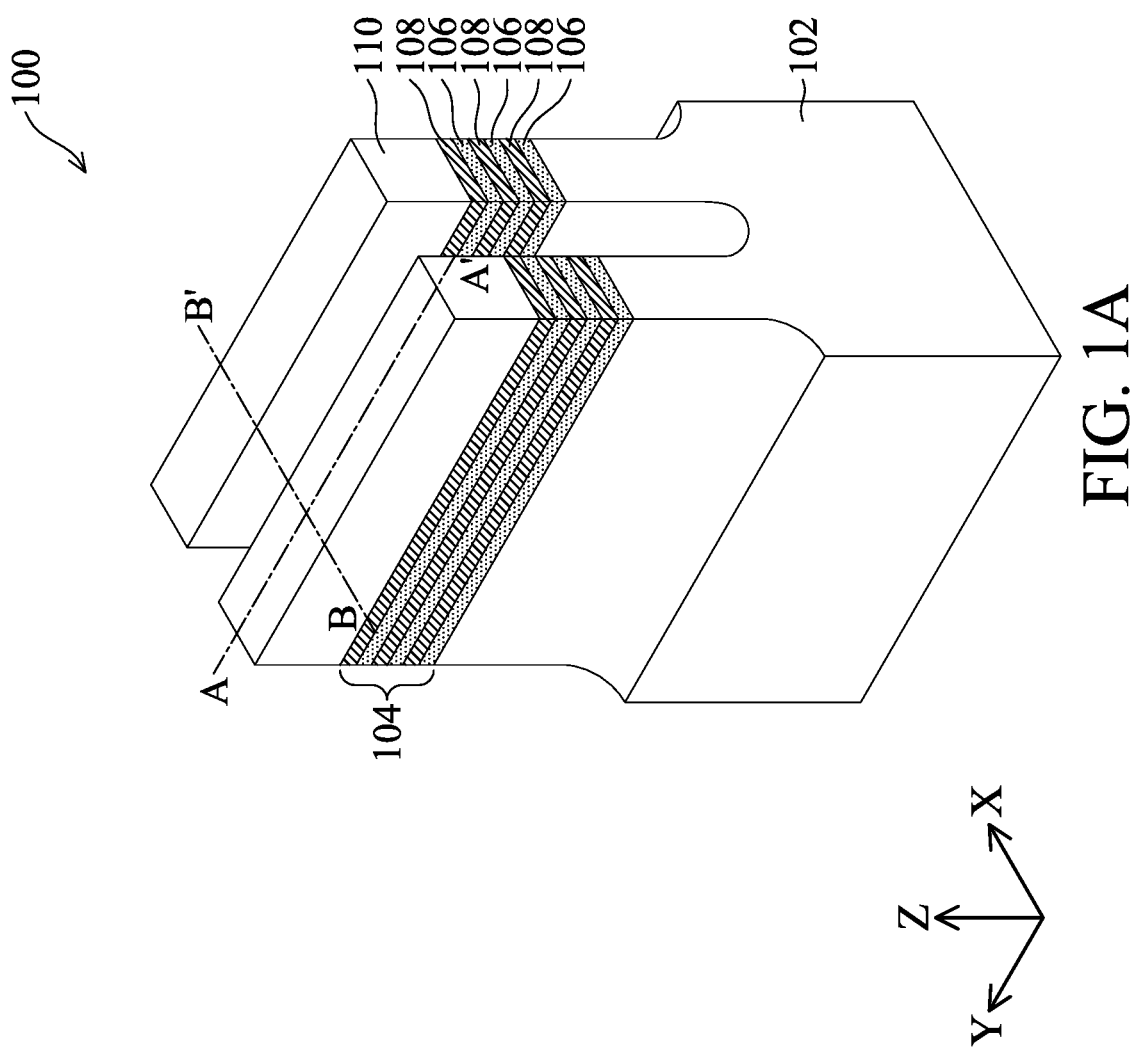

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional gate-all-around (GAA) FETs, in an integrated circuit (IC) structure. Generally, a GAA FET may include a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures preventing a undesired epitaxial (epi) layer when source/drain epi layers are grown. The details of the structure and fabrication methods of the present disclosure are described below in conjunction with the accompanying drawings, which illustrate the process of making GAA devices, according to some embodiments.

Figure 1C:
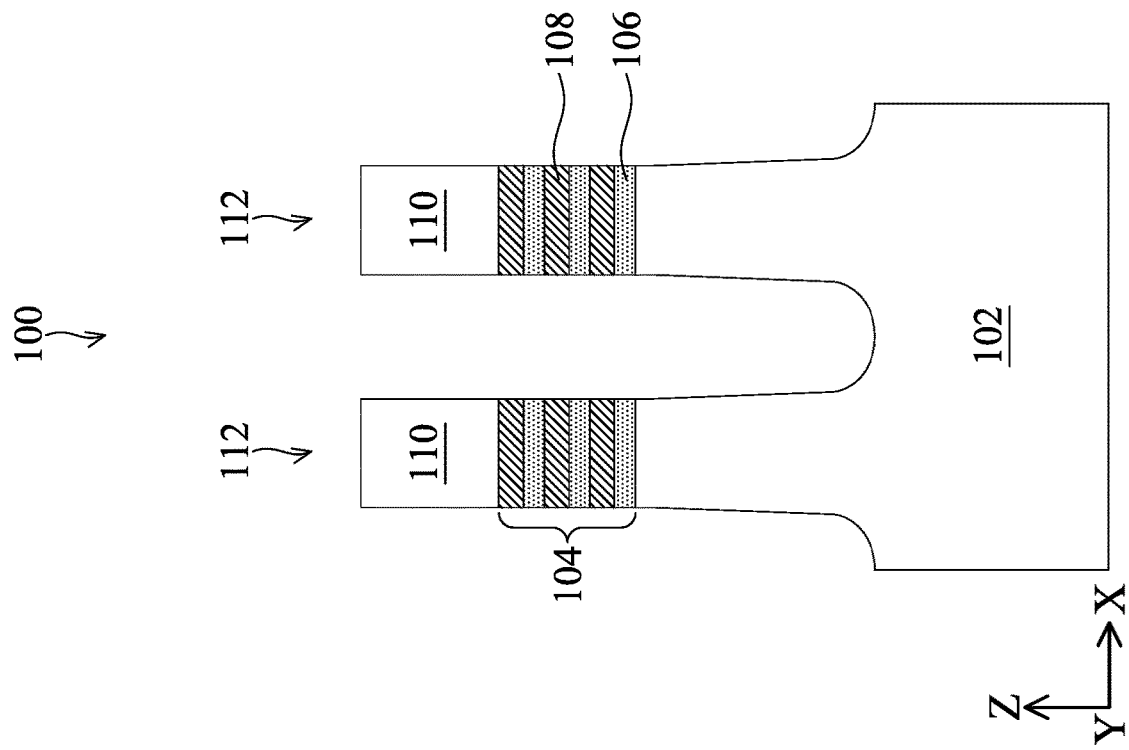
Figure 1B:
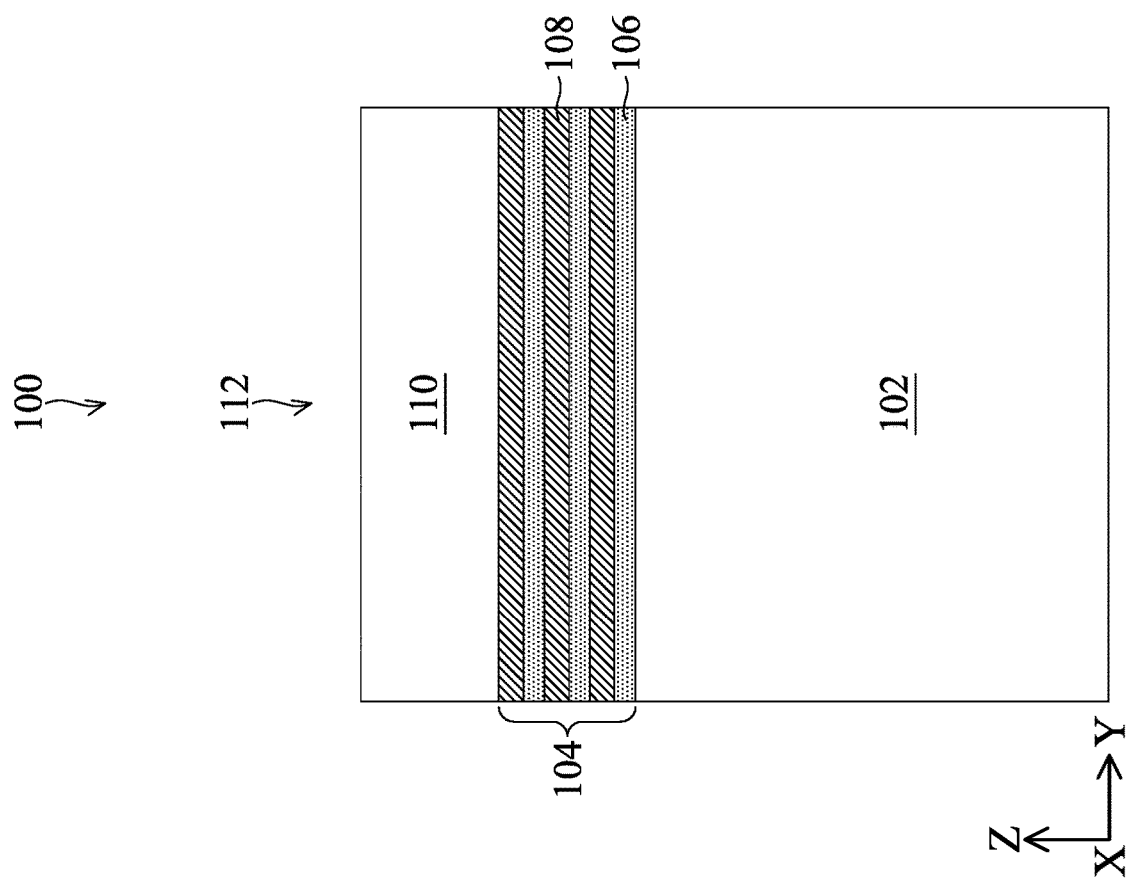

Referring to FIGS. 1A to 1C, a workpiece 100 is provided. As shown in FIGS. 1A, 1B and 1C, the workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5\times10^{16}$ cm$^{-3}$ to about $5\times10^{19}$ cm$^{-3}$, and p-type wells have a p-type dopant concentration of about $5\times10^{16}$ cm$^{-3}$ to about $5\times10^{19}$ cm$^{-3}$.

Still referring to FIGS. 1A to 1C, the stack 104 includes semiconductor layers 106 and 108, and the semiconductor layers 106 and 108 are alternating stacked in a Z-direction. The semiconductor layers 108 and the semiconductor layers 106 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers. In some embodiments, the semiconductor layers 106 and 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104. It should be noted that three (3) layers of the semiconductor layers 106 and three (3) layers of the semiconductor layers 108 are alternately and vertically arranged (or stacked) as shown in FIGS. 1A to 1C, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104. For patterning purposes, the workpiece 100 may also include a hard mask layer 110 over the stack 104. The hard mask layer 110 may be a single layer or a multilayer. In some embodiments, the hard mask layer 110 is a single layer and includes a silicon germanium layer. In some embodiments, the hard mask layer 110 is a multi-layer and includes a silicon nitride layer and a silicon oxide layer over the silicon nitride layer. In some other embodiments, the hard mask layer 110 is a multi-layer and includes a silicon germanium layer and a silicon layer over the silicon germanium layer.

The substrate 102, the stack 104 and the hard mask layer 110 are then patterned to form fins 112. As shown in FIGS. 1A to 1C, each of the fins 112 includes a base portion formed from a portion of the substrate 102 and a stack portion formed from the stack 104 over the base portion. The fins 112 each extends lengthwise in a Y-direction and extend vertically in the Z-direction over the substrate 202. The fins 112 may be patterned using suitable processes including double-patterning or multi-patterning processes. For example, in some embodiment, a material layer is formed over a substrate and patterned using a photolithography process. Spacers are formed alongside the patterned material layer using a self-aligned process. The material layer is then removed, and the remaining spacers, or mandrels, may then be used to pattern the fins 112 by etching the stack 104 and the substrate 102. The etching process may include dry etching, wet etching, reactive ion etching (RIE), and/or other suitable processes.

Figure 2A:
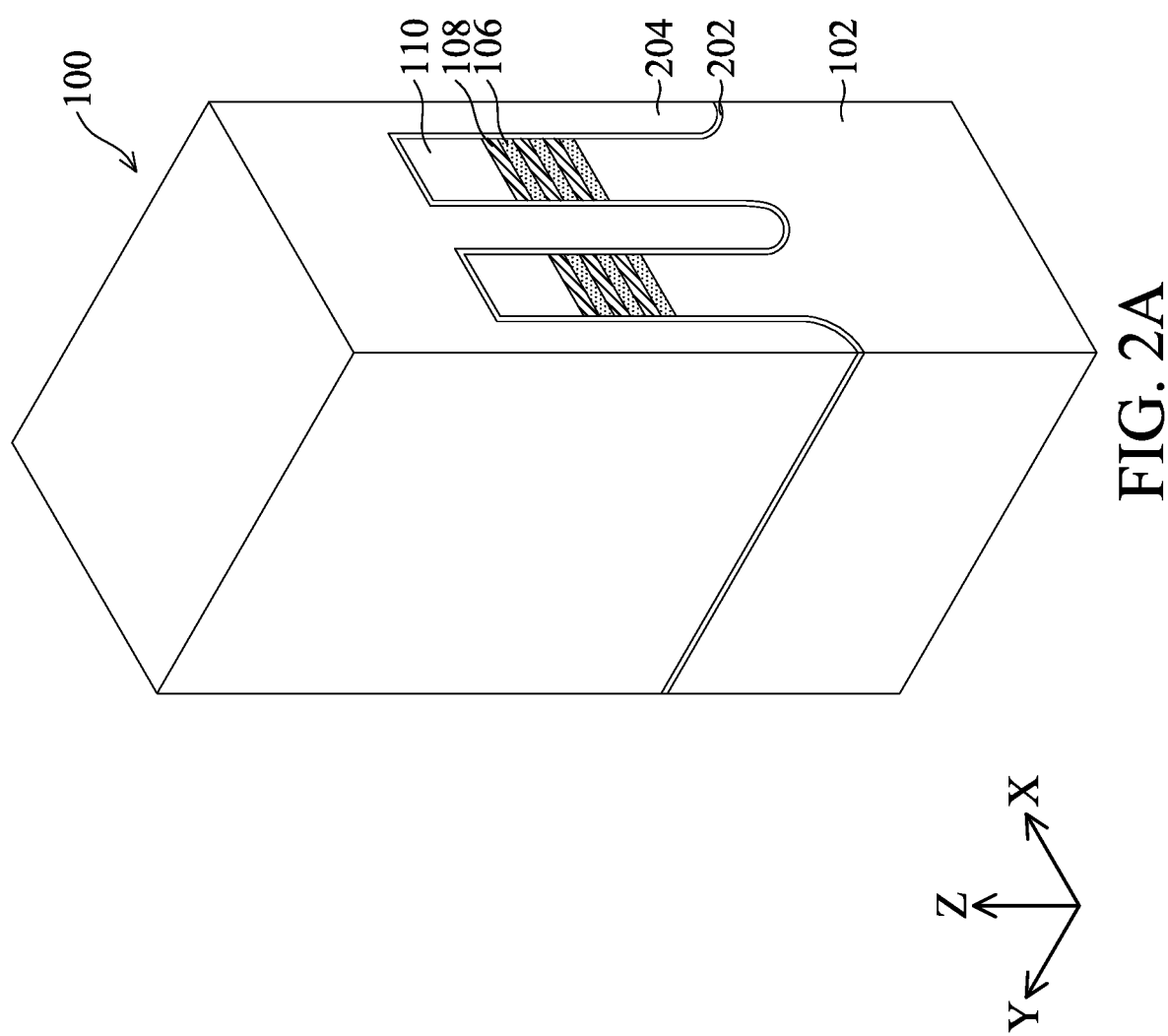
Figure 2C:
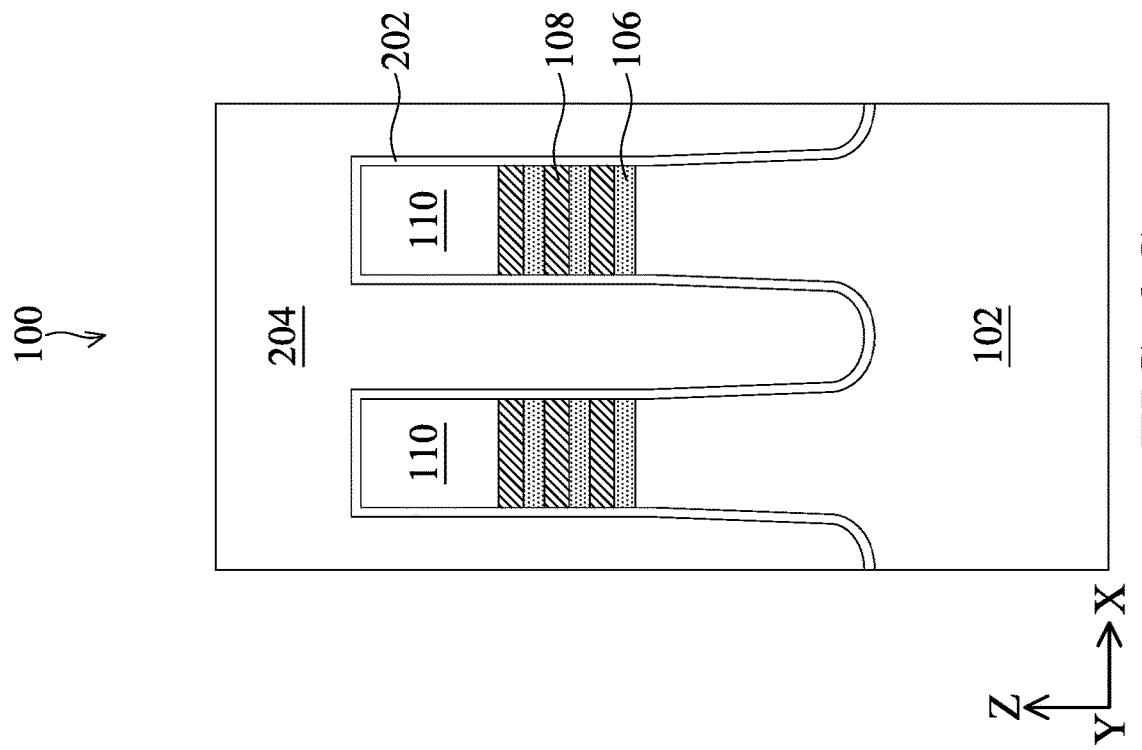
Figure 2B:
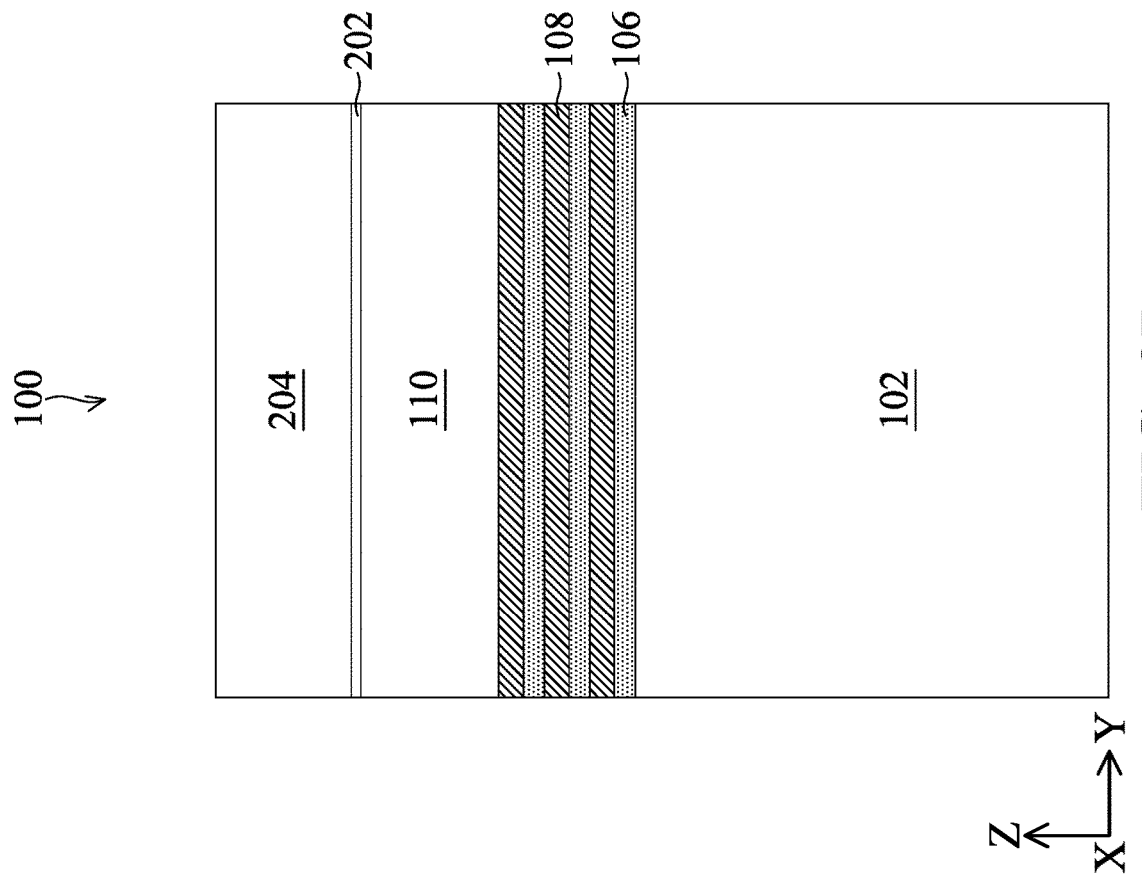
Figure 3A:
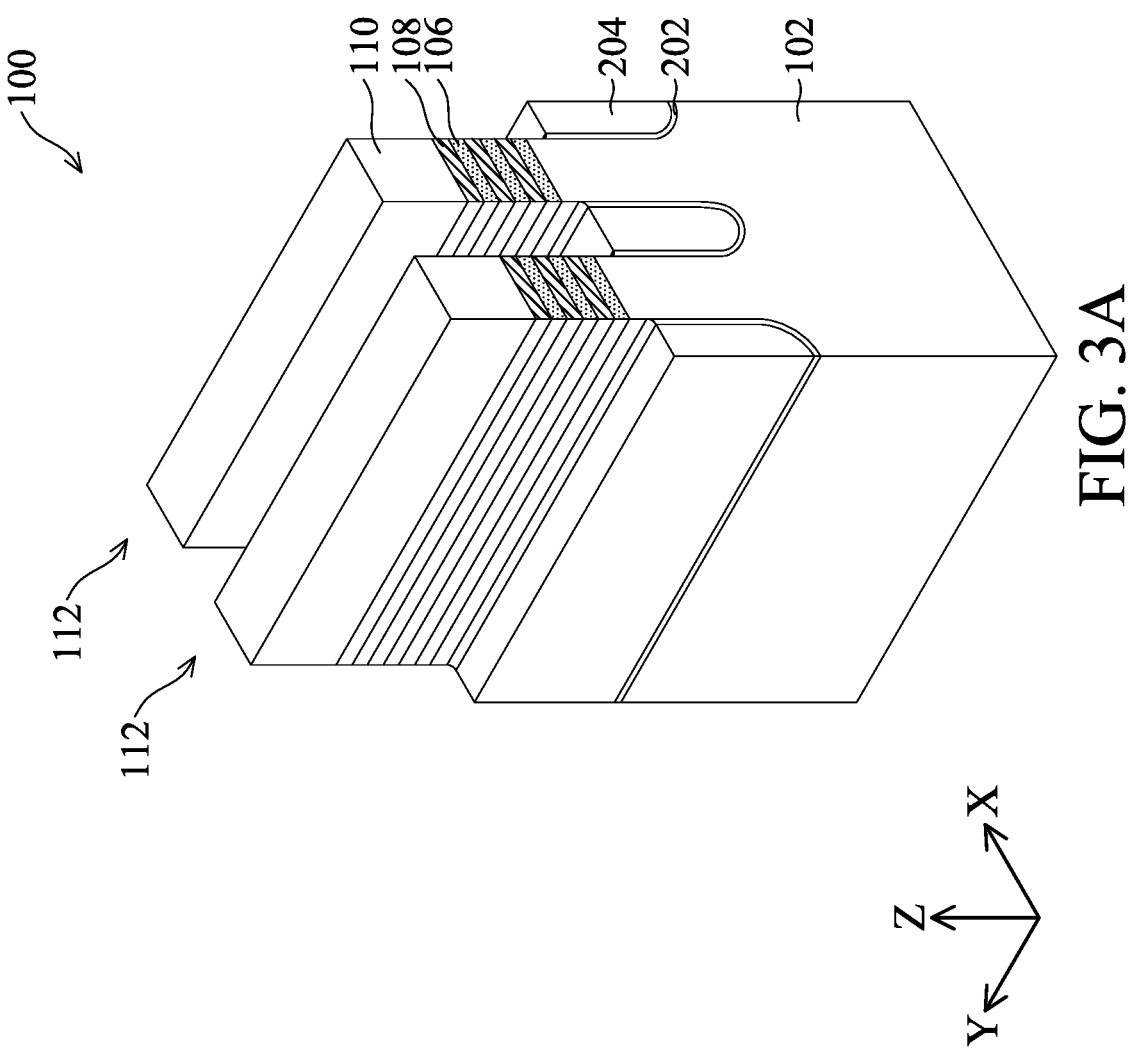
Figure 3C:
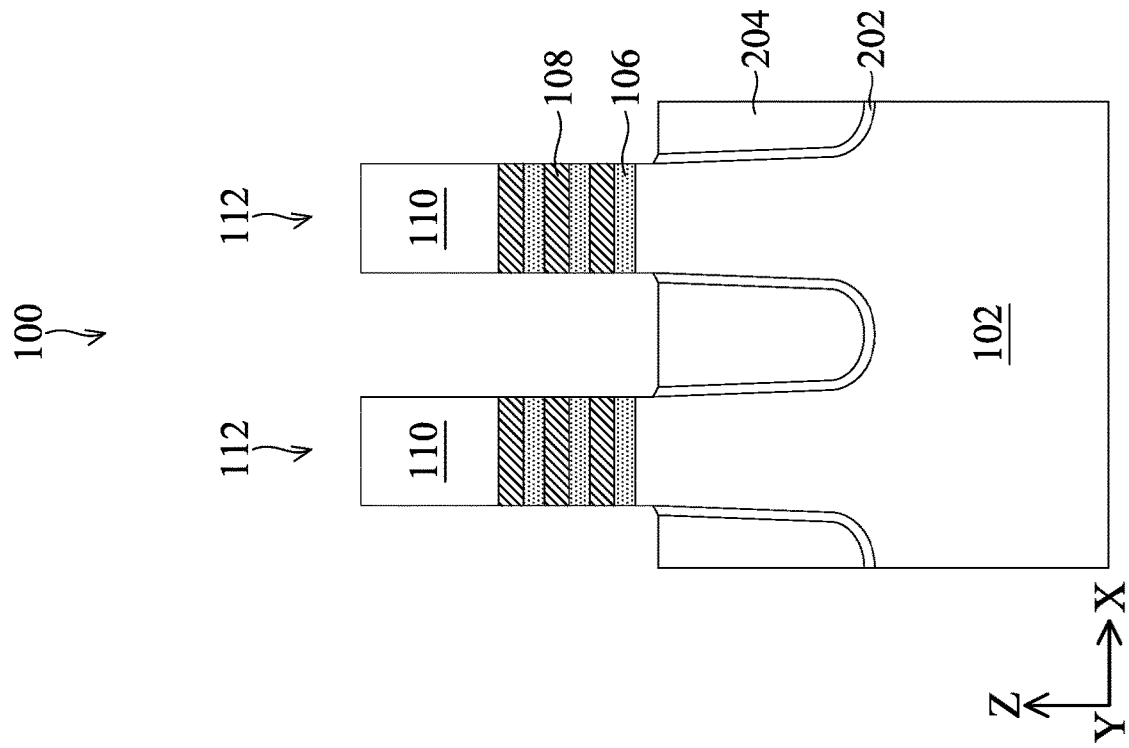
Figure 3B:
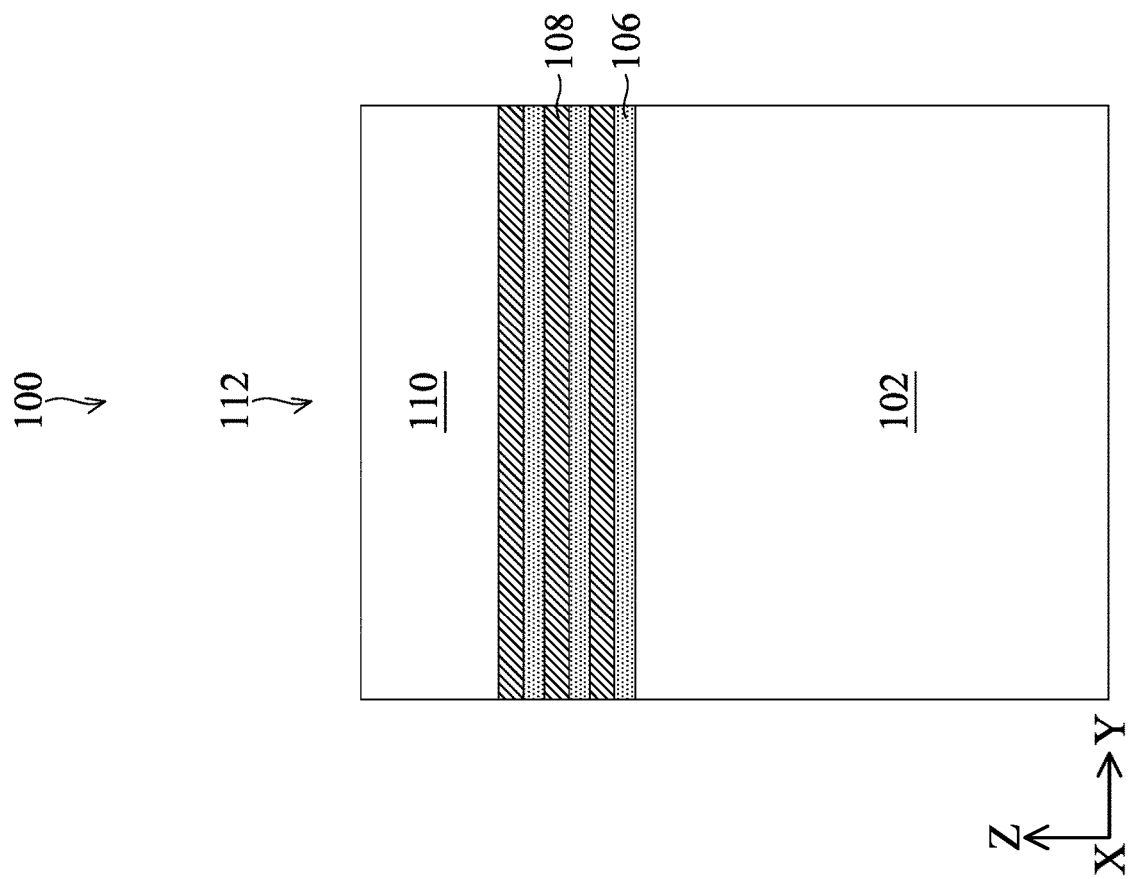

Referring to FIGS. 2A to 2C and 3A to 3C, an isolation feature 204 is formed. After the fins 112 are formed, the isolation feature 204 shown in FIGS. 3A and 3C is formed between neighboring fins 112. In some aspects, the isolation feature 204 is extending in the Y-direction and arranged with the fins 112 in an X-direction. In some other aspects, the isolation feature 204 is formed around the fins 112. The isolation feature 204 may also be referred to as shallow trench isolation (STI) feature. In some embodiments, a dielectric material for the isolation feature 204 is first deposited over the workpiece 100, filling the trenches between fins 112 with the dielectric material, as shown in FIGS. 2A to 2C. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until top surfaces of the hard mask layer 110 is exposed (not shown). Referring then to FIGS. 3A to 3C, the planarized dielectric material is further recessed by a dry etching process, a wet etching process, and/or a combination thereof to form the isolation feature 204. As shown in FIGS. 3A and 3C, the stack portions of the fins 112 rise above the isolation feature 204 while the base portions are surrounded by the isolation feature 204. In some embodiments, in order to protect the semiconductor layers 106 from unintentional etching, a silicon liner 202 is conformally deposited over the fins 112 using ALD or CVD, as shown in FIGS. 2A to 2C. In some embodiments, the silicon liner 202 is epitaxially grown from the surfaces of the fins 112.

Figure 4A:
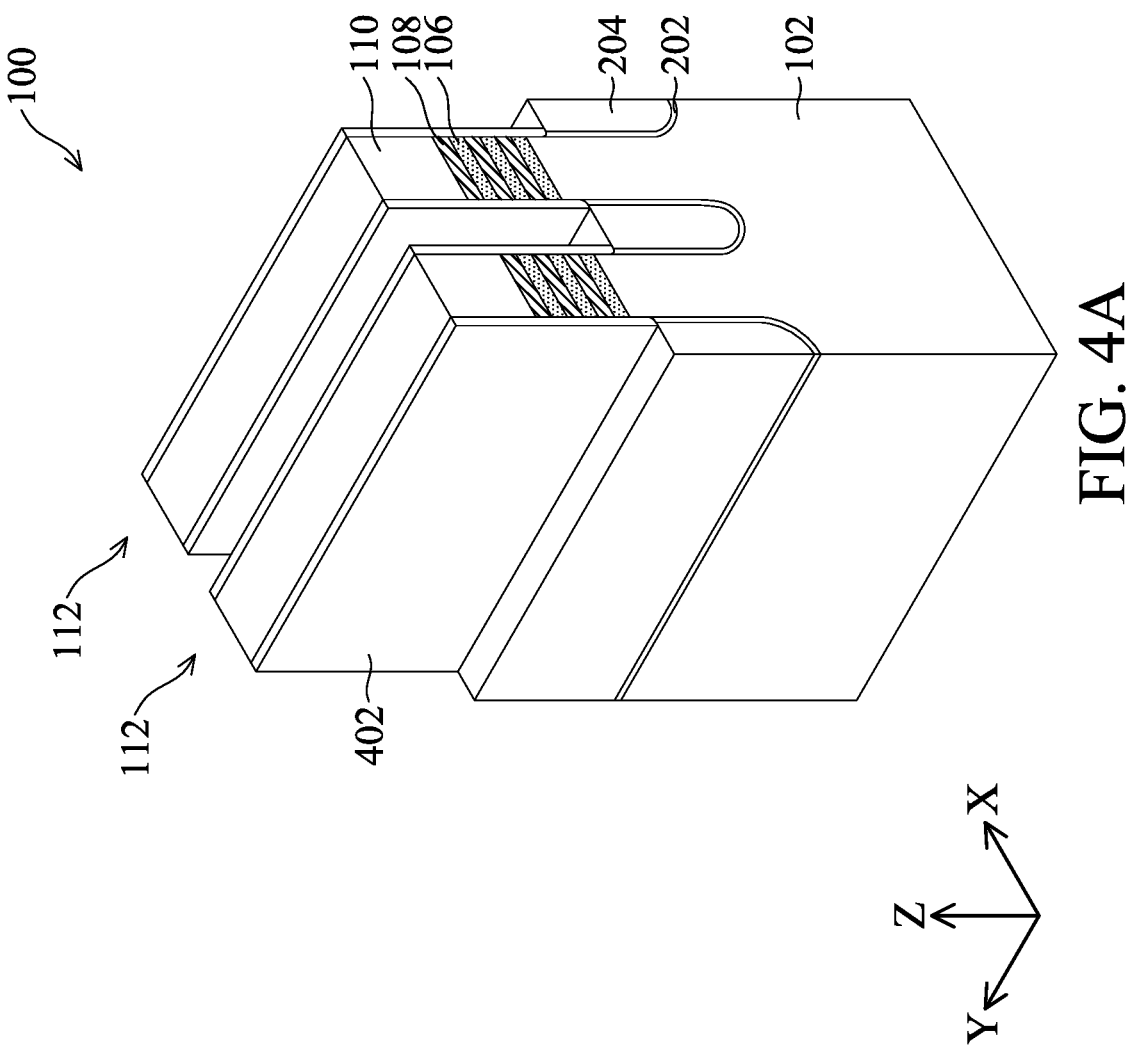
Figure 4C:
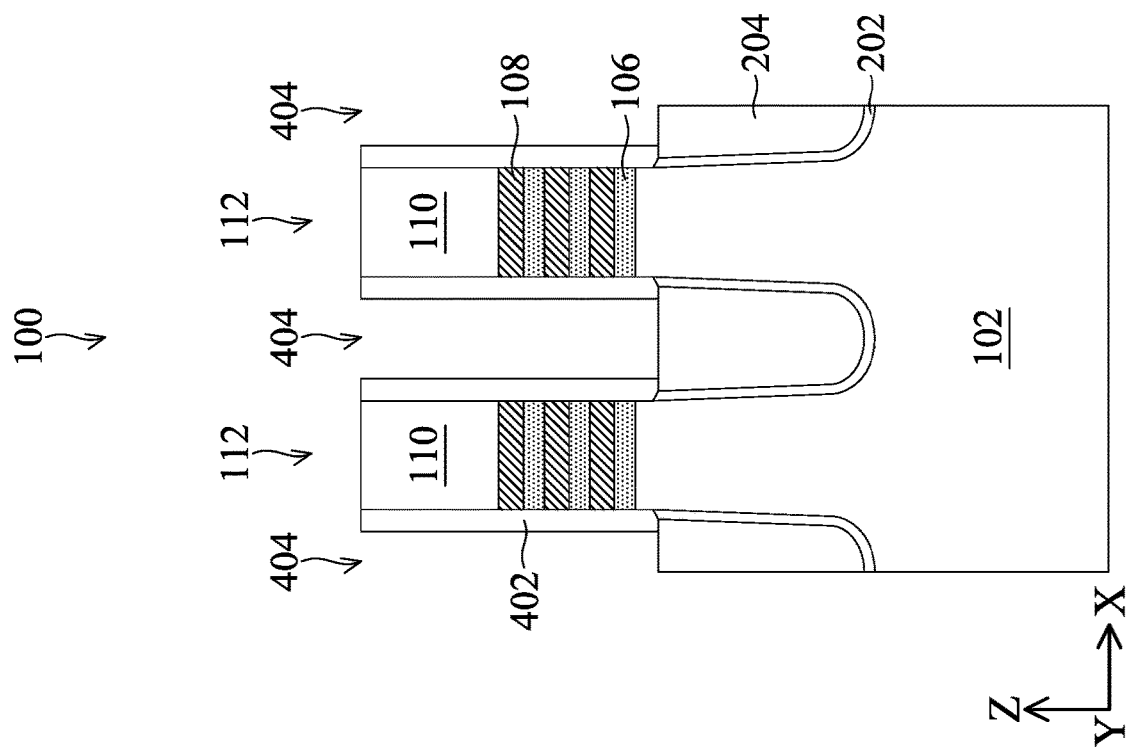
Figure 4B:
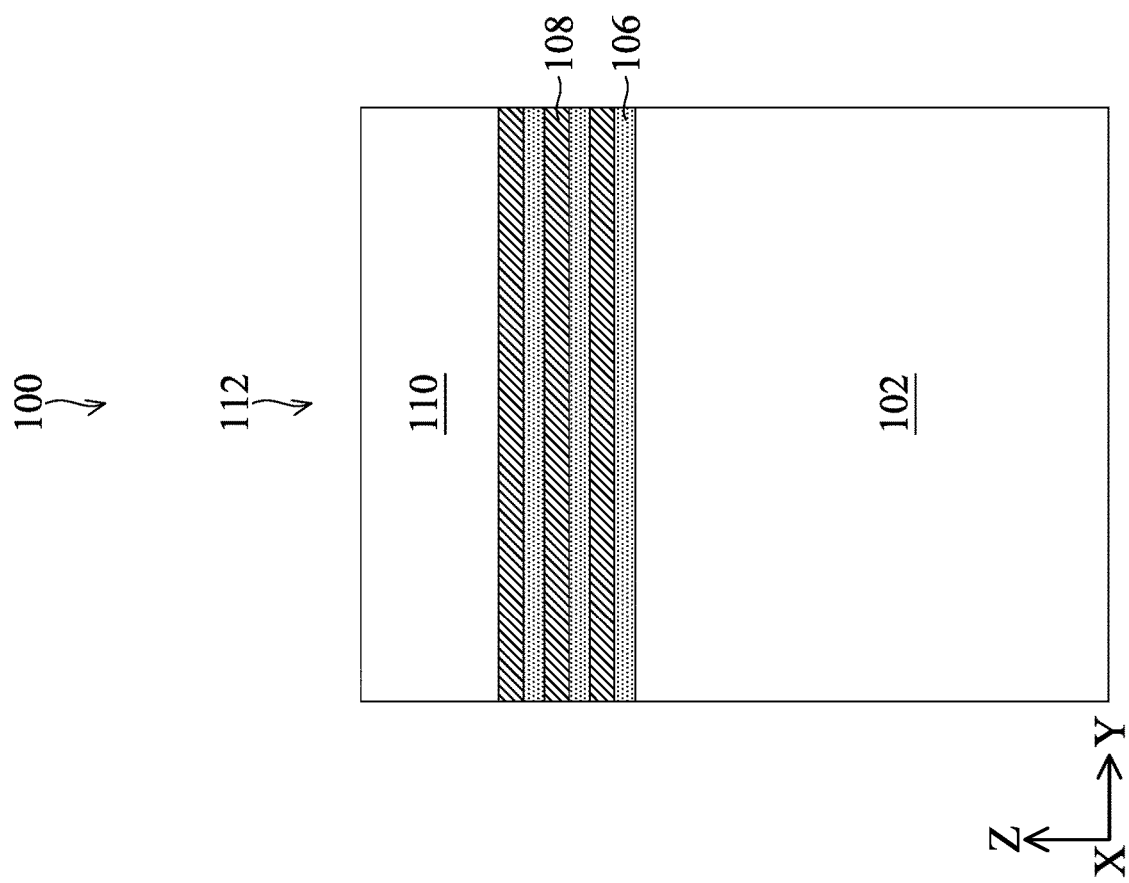

Referring to FIGS. 4A to 4C, a cladding layer 402 is formed on sidewalls of the fins 112 and sidewalls of the hard mask layer 110. In some embodiments, the cladding layer 402 may have a composition similar to that of the semiconductor layers 106. In some embodiments, the cladding layer 402 may be formed of silicon germanium (SiGe), just like the semiconductor layers 106. This common composition allows selective removal of the semiconductor layers 106 and the cladding layer 402 in a subsequent process (e.g., release process). In some embodiments, the formation of the cladding layer 402 may include conformally and epitaxially grow cladding material using VPE or MBE. In some alternative embodiments, the cladding material may be deposited using CVD, ALD, or other suitable deposition method. The cladding material is deposited on the sidewalls of the fins 112, the top surfaces and the sidewalls of the hard mask layer 110, and top surfaces of the isolation feature 204. After the cladding material is deposited, an etch back process is performed to remove the cladding material on the top surfaces of the hard mask layer 110 and the top surfaces of the isolation feature 204, so that the cladding layer 402 remains on the sidewalls of the fins 112 and the sidewalls of the hard mask layer 110.

An example etch back process may be a dry etch process that includes use of plasma of hydrogen bromide (HBr), oxygen ($O_2$), chlorine ($Cl_2$), or mixtures thereof. In some instances, the cladding layer 402 may have a thickness between about 5 nm and about 10 nm. As shown in FIGS. 4A to 4C, the top surfaces of the hard mask layer 110 are exposed and the isolation feature 204 are exposed in the trenches 404 after the etch back process.

Figure 5A:
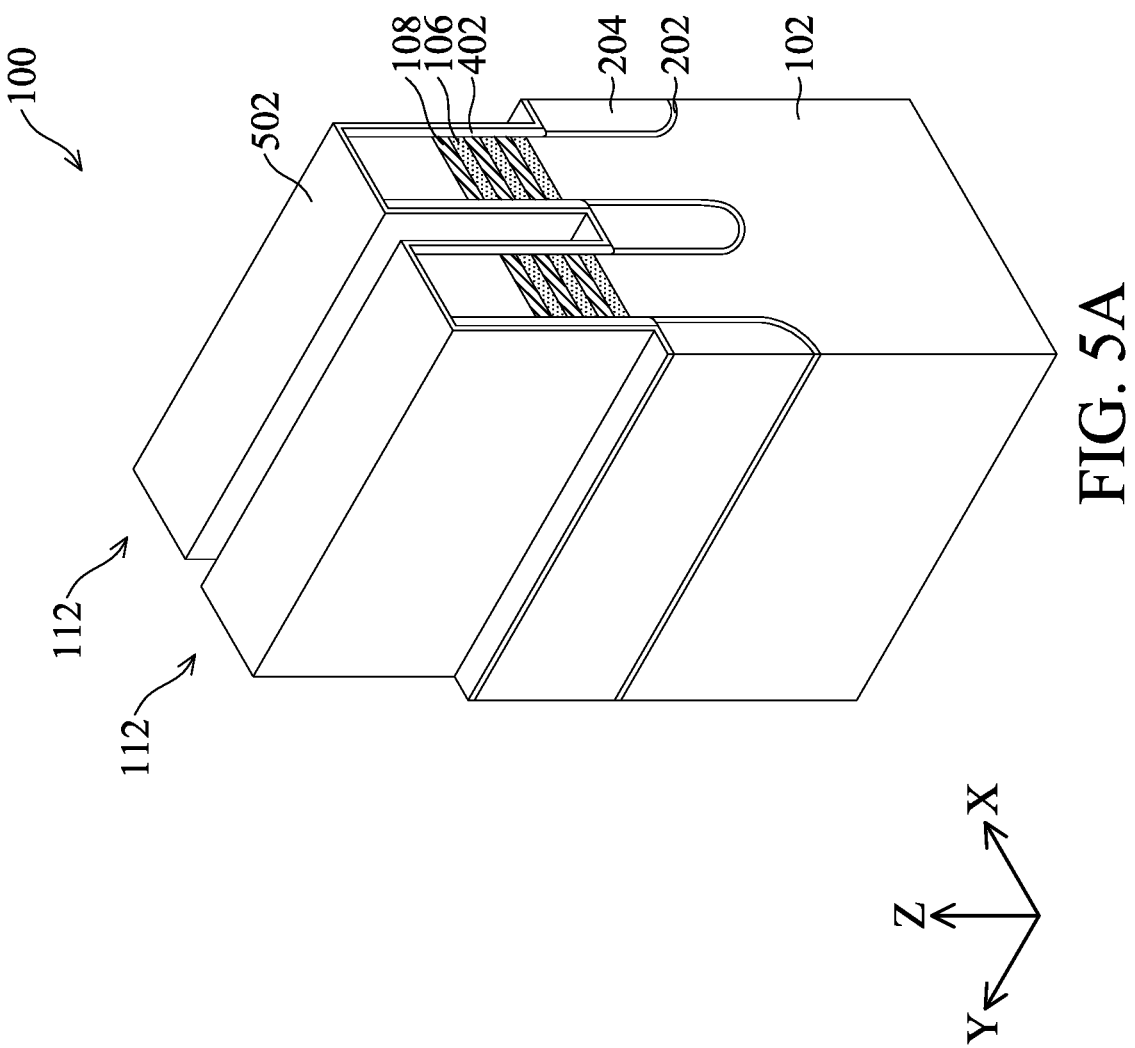
Figure 5C:
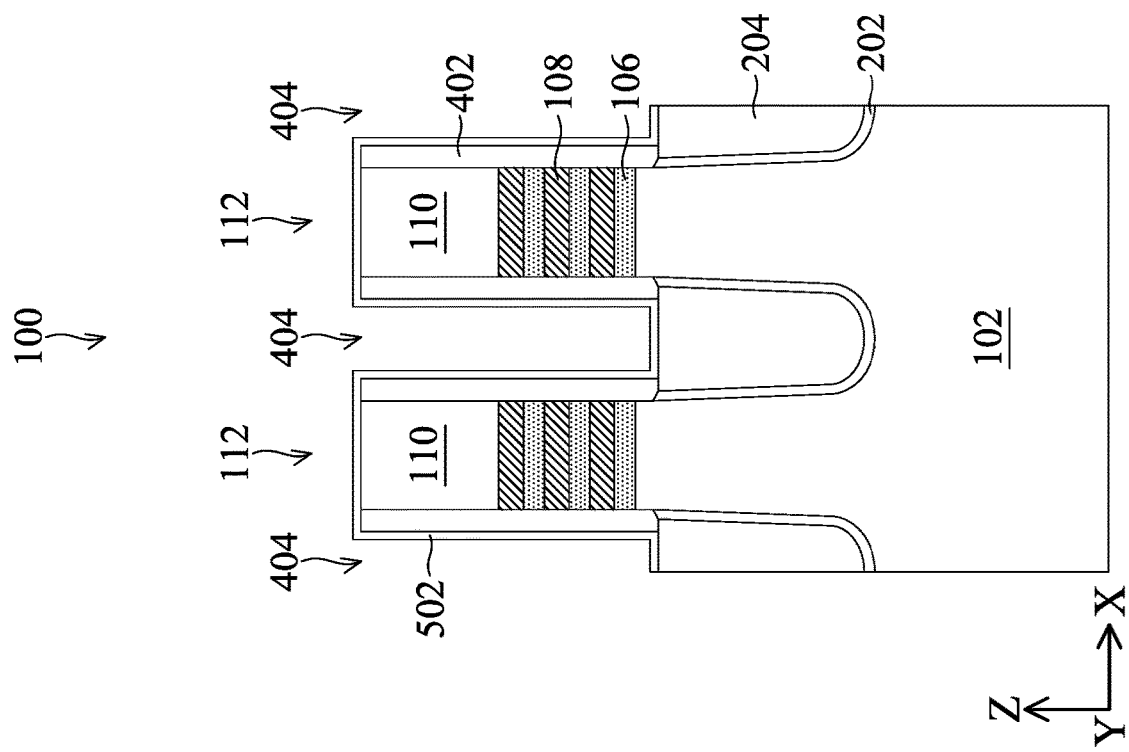
Figure 5B:
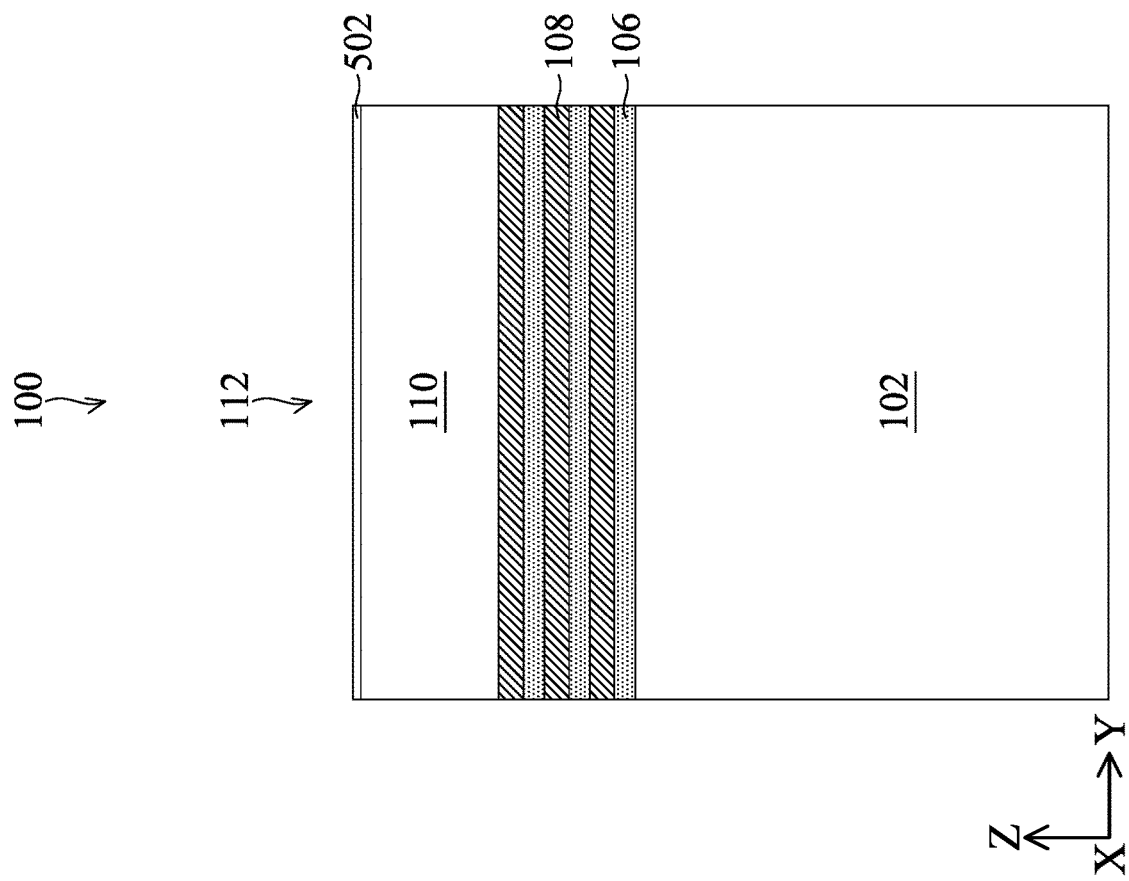

Referring to FIGS. 5A to 5C, a dielectric liner 502 is conformally formed over the fins 112, the isolation feature 204, and the cladding layer 402. In some embodiments, the dielectric liner 502 is formed of a dielectric material to allow selective etching of the cladding layer 402 without substantially damaging the dielectric liner 502. The dielectric liner 502 may include a high-k dielectric material, such as $HfO_2$, HfSiOx (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some implementations, the dielectric liner 502 may be deposited using CVD, physical vapor deposition (PVD), ALD, high-density plasma chemical vapor deposition (HDP-CVD), metalorganic chemical vapor deposition (MOCVD), RPCVD, plasma-enhanced chemical vapor deposition (PECVD), LPCVD, atomic layer chemical vapor deposition (ALCVD), atmospheric pressure chemical vapor deposition (APCVD), other suitable methods, or combinations thereof. As shown in FIGS. 5A to 5C, the dielectric liner 502 is also over the top surfaces of the hard mask layer 110 and on sidewalls and top surfaces of the cladding layer 402.

Figure 6A:
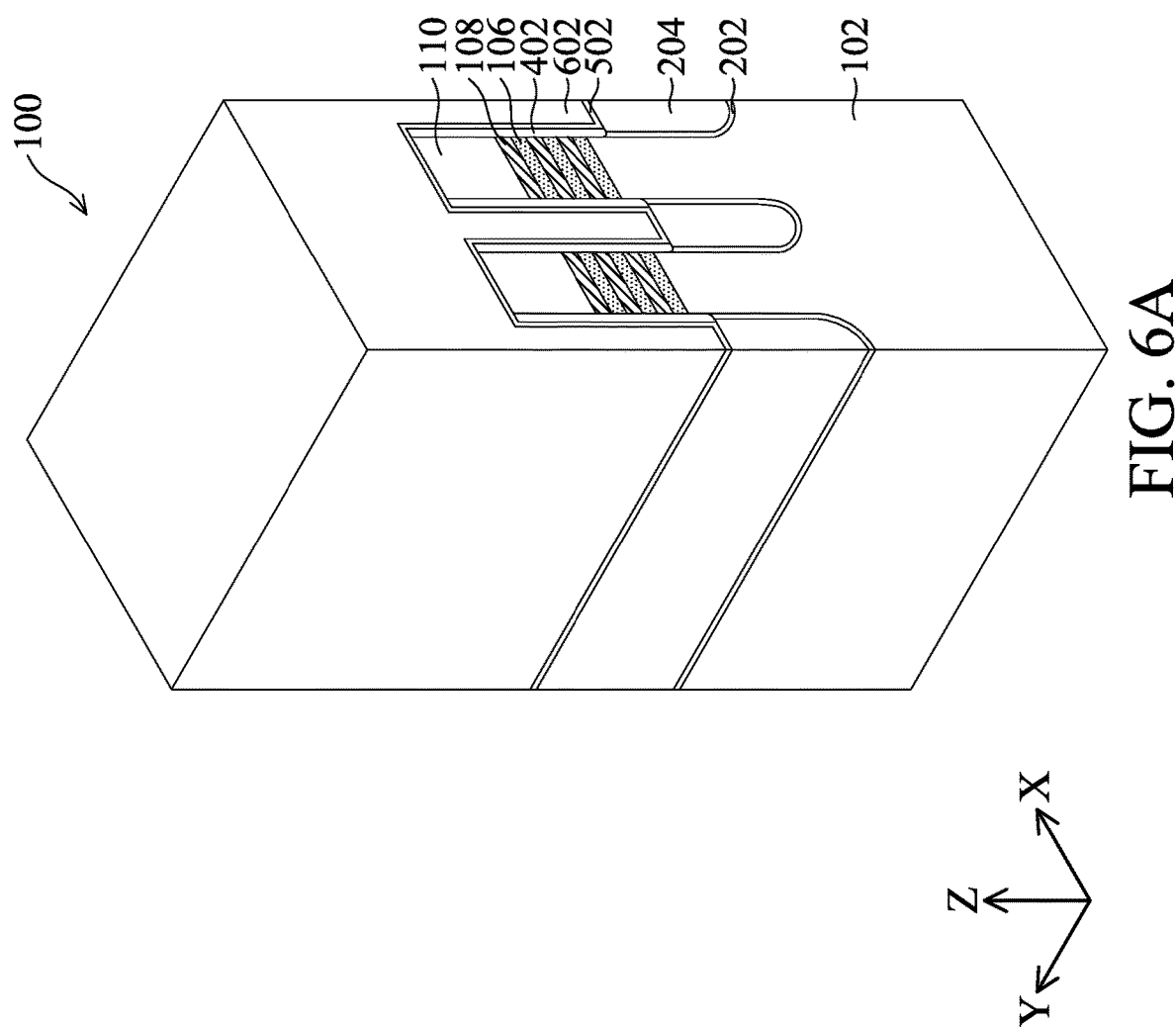
Figure 6C:
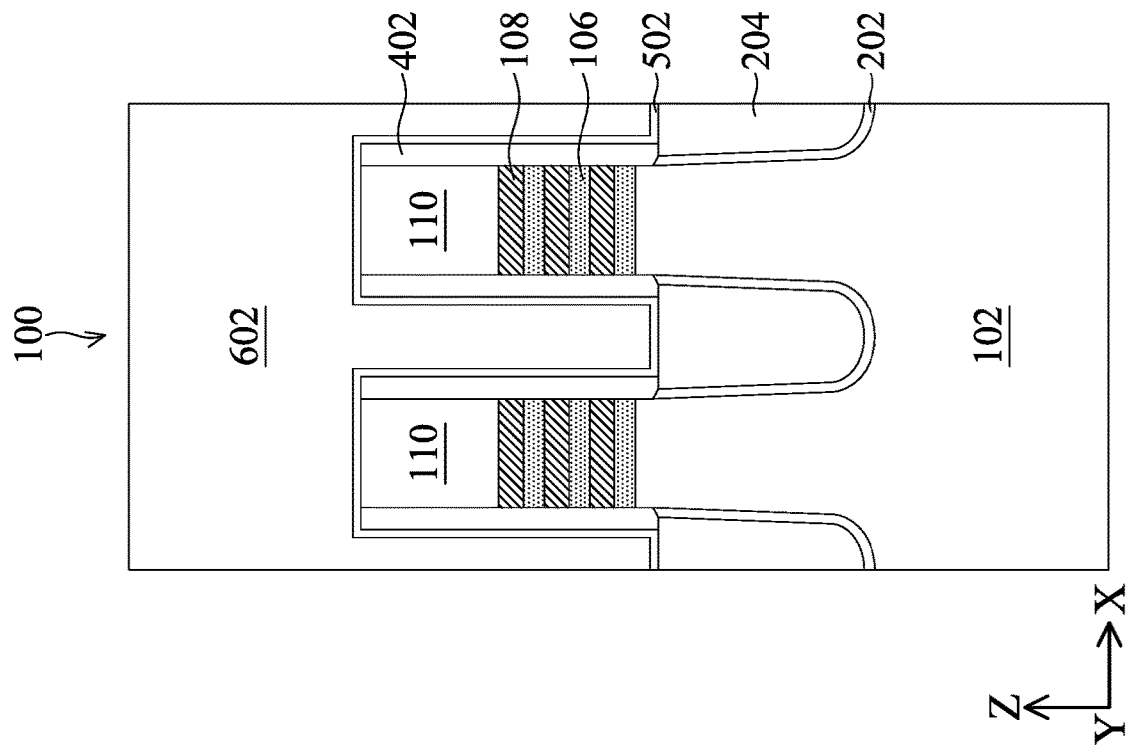
Figure 6B:
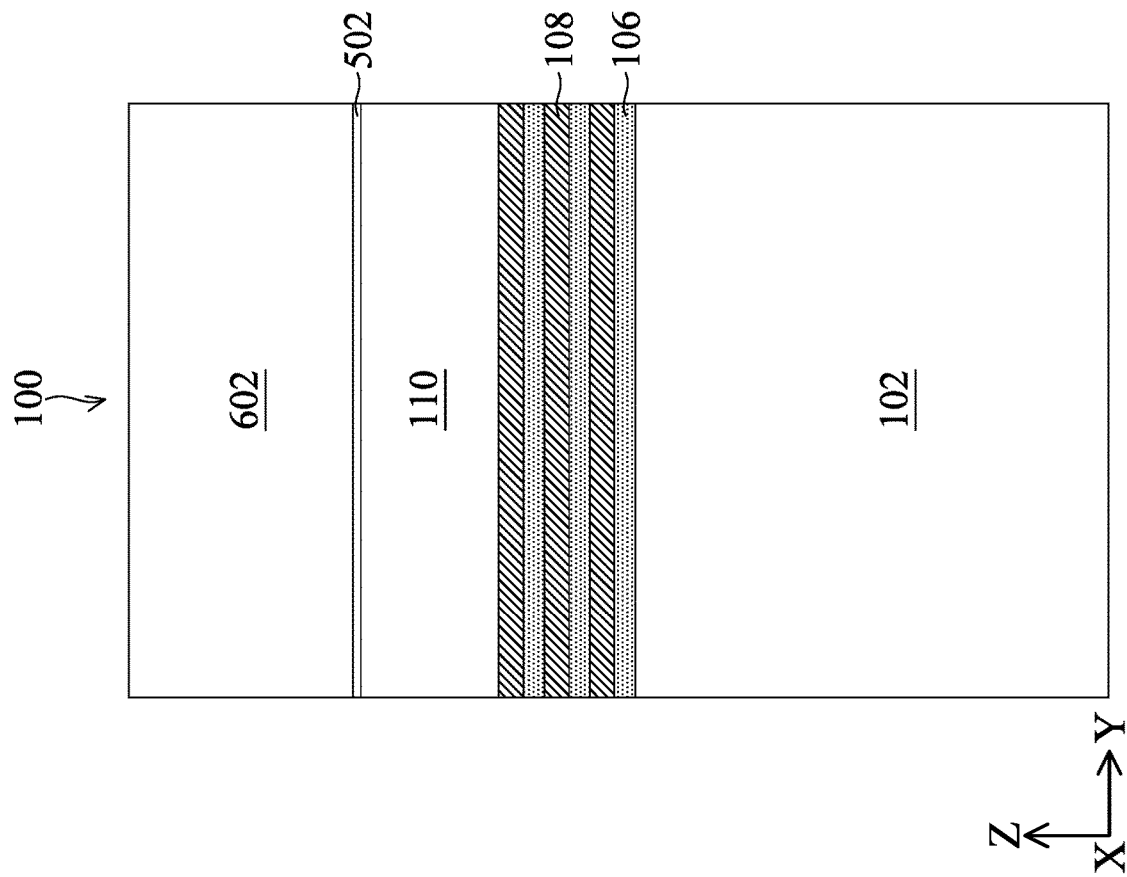

Referring to FIGS. 6A to 6C, a filler layer 602 is formed over the workpiece 100. Specifically, the filler layer 602 is formed to fill the trenches 404 and formed over the fins 112. In some embodiments, a composition of the filler layer 602 may be similar to a composition of the isolation feature 204. In some embodiments, the filler layer 602 includes a low-k dielectric material such as a dielectric material including Si, 0, N, and C (for example, silicon oxide ($SiO_2$), silicon nitride, silicon oxynitride, silicon oxy carbide, silicon oxy carbon nitride). In some embodiments, the dielectric fill layer 602 includes tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), other low-k dielectric materials, or combinations thereof. In these embodiments, the filler layer 602 may be deposited using CVD, SACVD, FCVD, ALD, PVD, spin-on coating, and/or other suitable process.

Figure 7A:
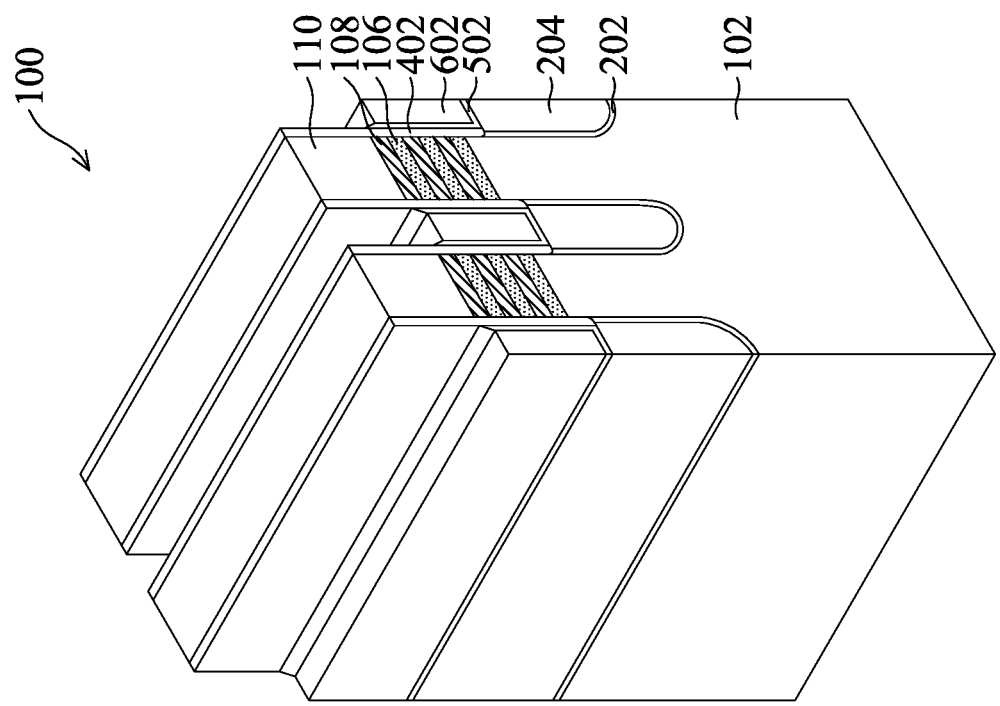
Figure 7C:
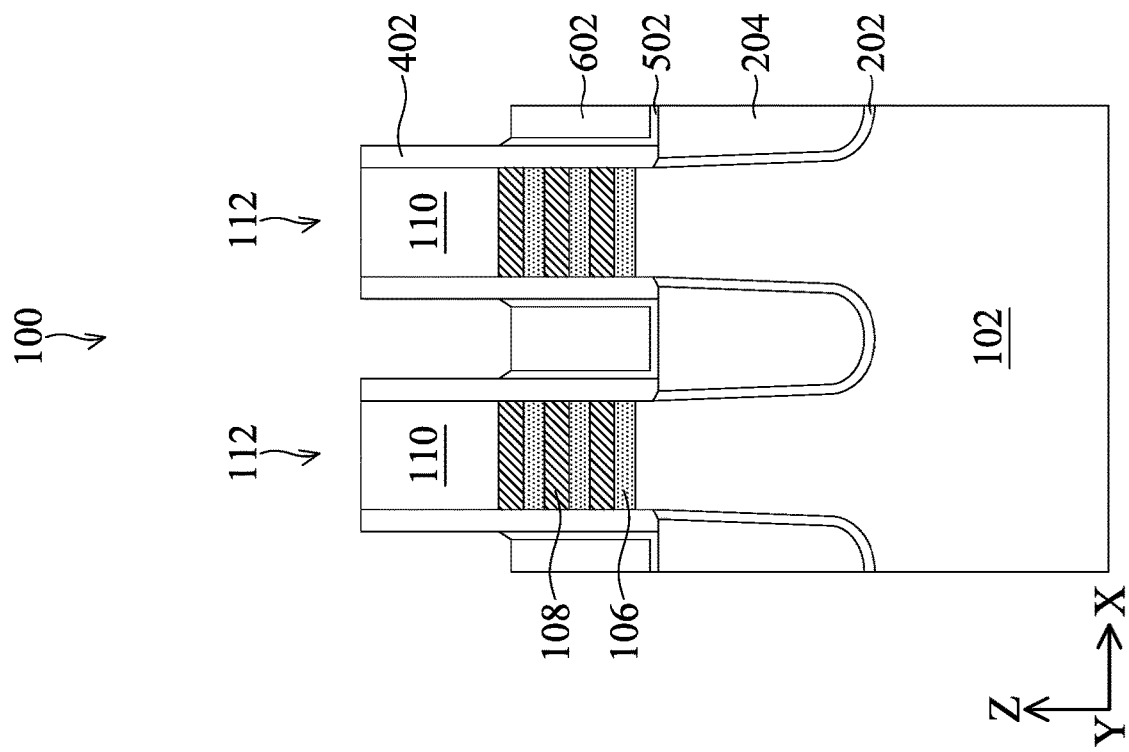
Figure 7B:
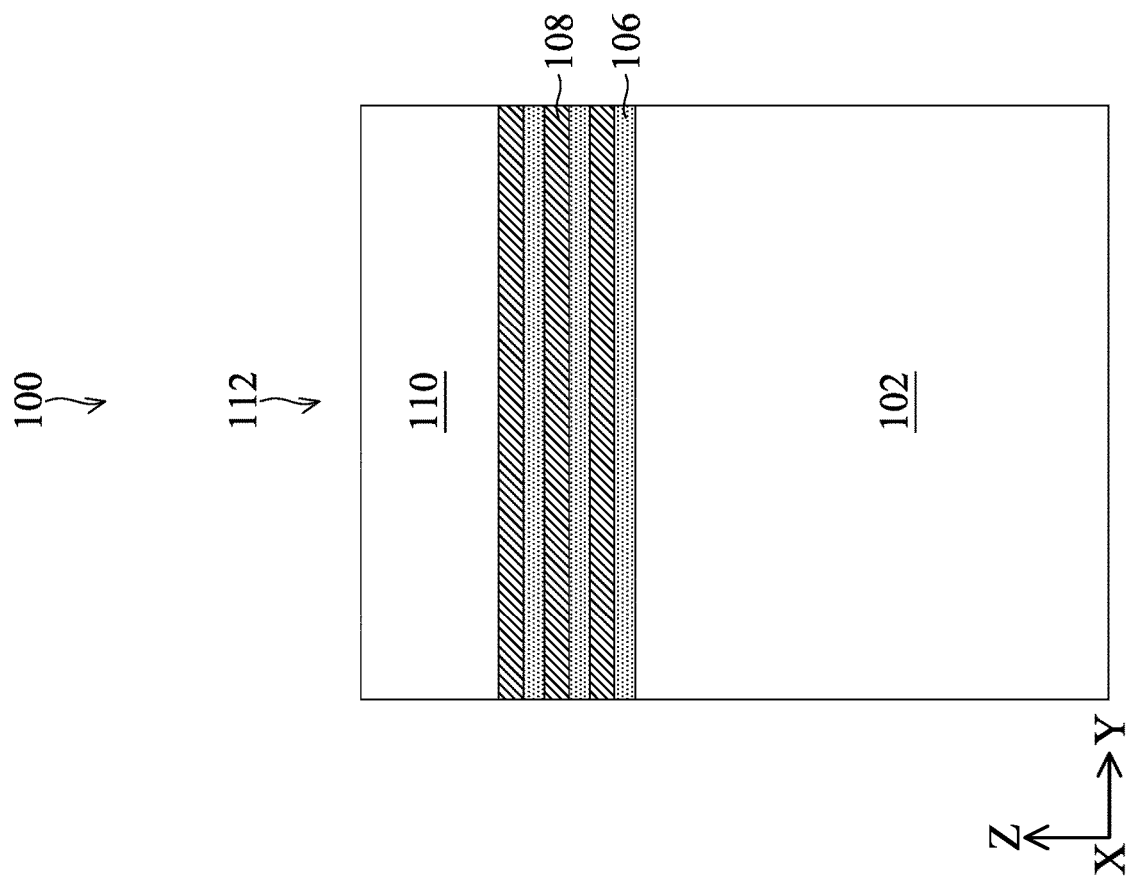

Referring to FIGS. 7A to 7C, the filler layer 602 and the dielectric liner 502 are planarized (e.g., by a CMP process) and recessed (e.g., by an etching process, a wet etching process, and/or a combination thereof). The filler layer 602 and dielectric liner 502 are recessed to have top surfaces below the top surfaces of the hard mask layer 110. In some embodiments, the top surfaces of the filler layer 602 or dielectric liner 502 is below the topmost surfaces of the semiconductor layers 108. In some other embodiments, the top surfaces of the filler layer 602 and dielectric liner 502 and the topmost surfaces of the semiconductor layers 108 are substantially coplanar. Similarly to isolation feature 204, the filler layer 602 is between or around neighboring fins 112. Specifically, the stack portions of the fins 112 are surrounded by the filler layer 602. In some aspects, the filler layer 602 also extends in the Y-direction and arranged with the fins 112 in the X-direction. The filler layer 602 may also be referred to as isolation feature or STI feature.

Figure 8A:
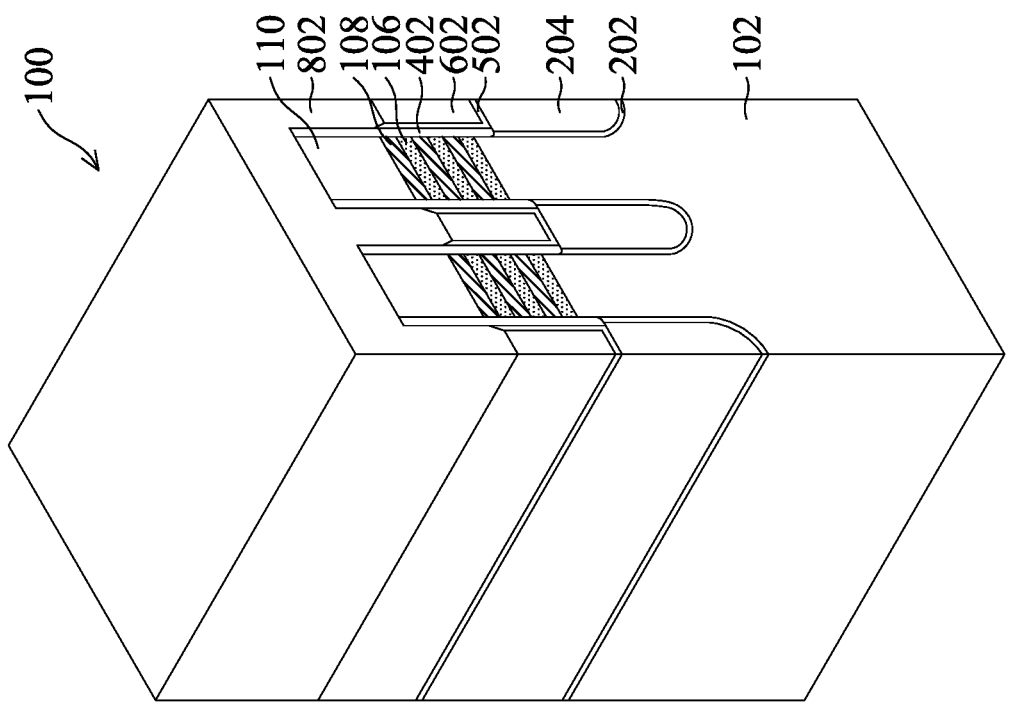
Figure 8C:
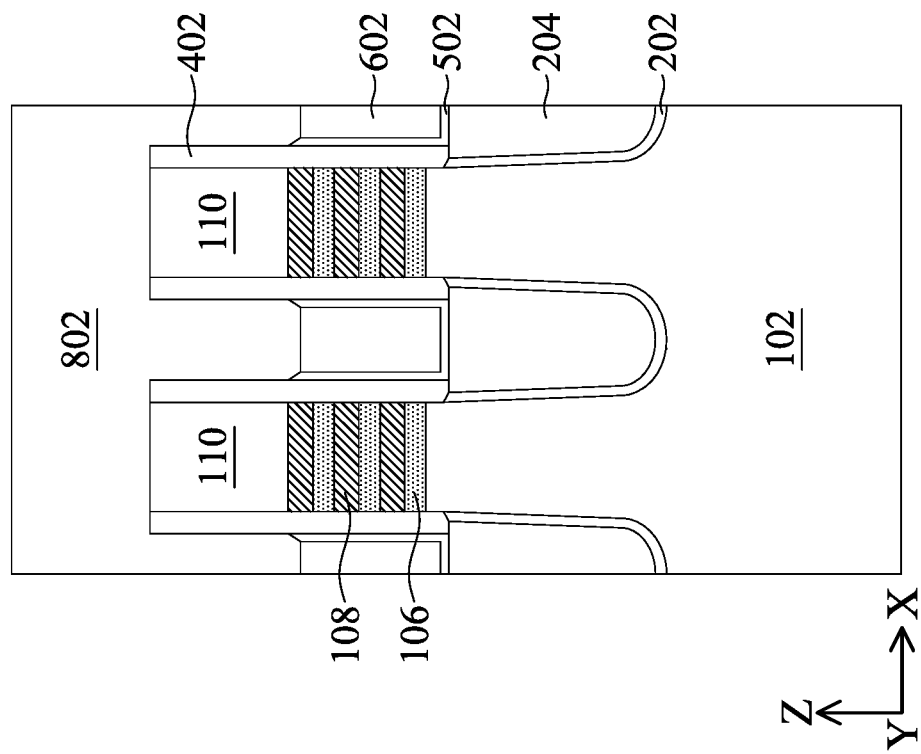
Figure 8B:
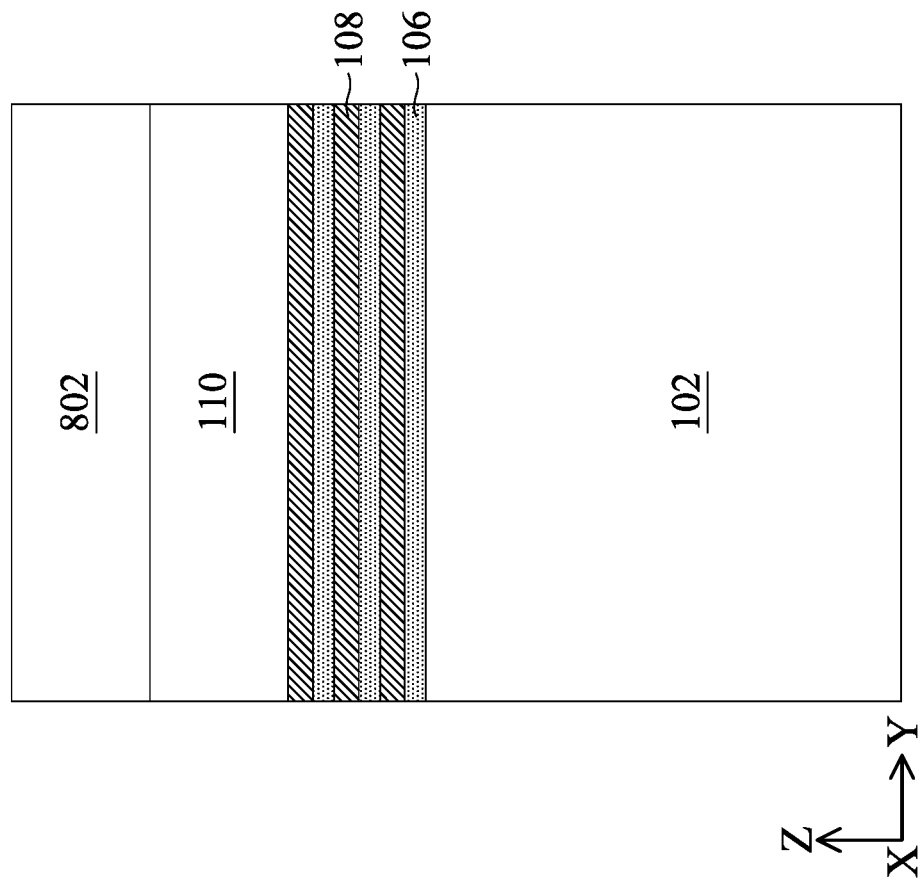

Referring to FIGS. 8A to 8C, a dielectric material of dielectric features 802 is formed over the workpiece 100. Specifically, the dielectric material is formed between and over the fins 112 and the cladding layer 402, and over the filler layer 602, the dielectric liner 502, and the hard mask layer 110. The dielectric material may include high-K dielectrics, such as $HfO_2$, HfSiOx (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some embodiments, the dielectric material may be deposited using ALD, CVD, PVD, oxidation-based deposition process, other suitable process, or combinations thereof.

Figure 9A:
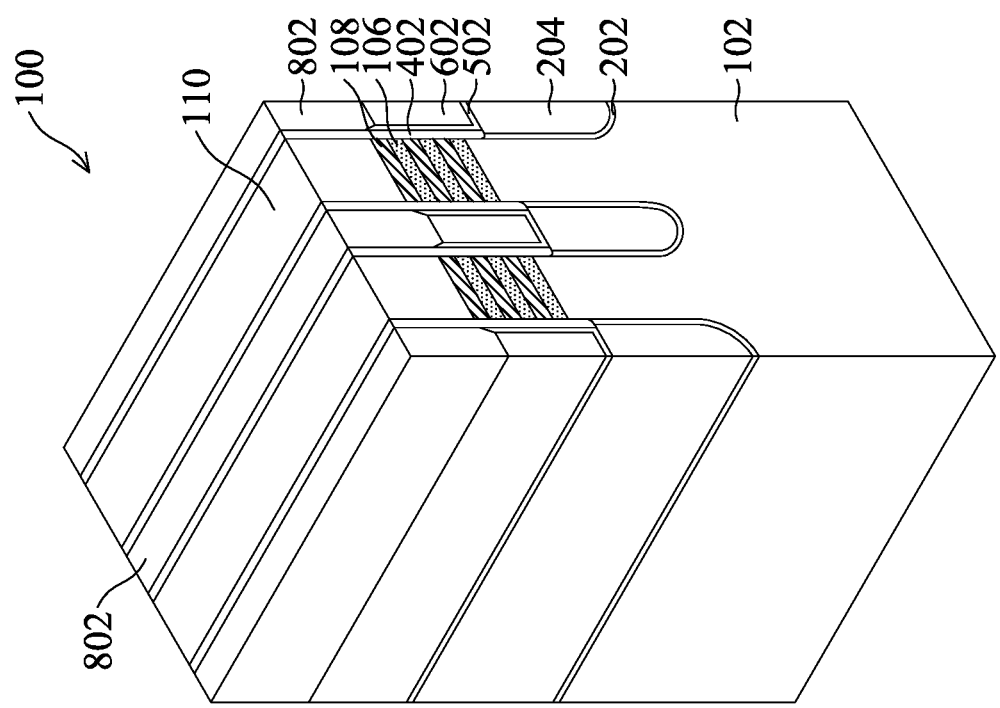
Figure 9C:
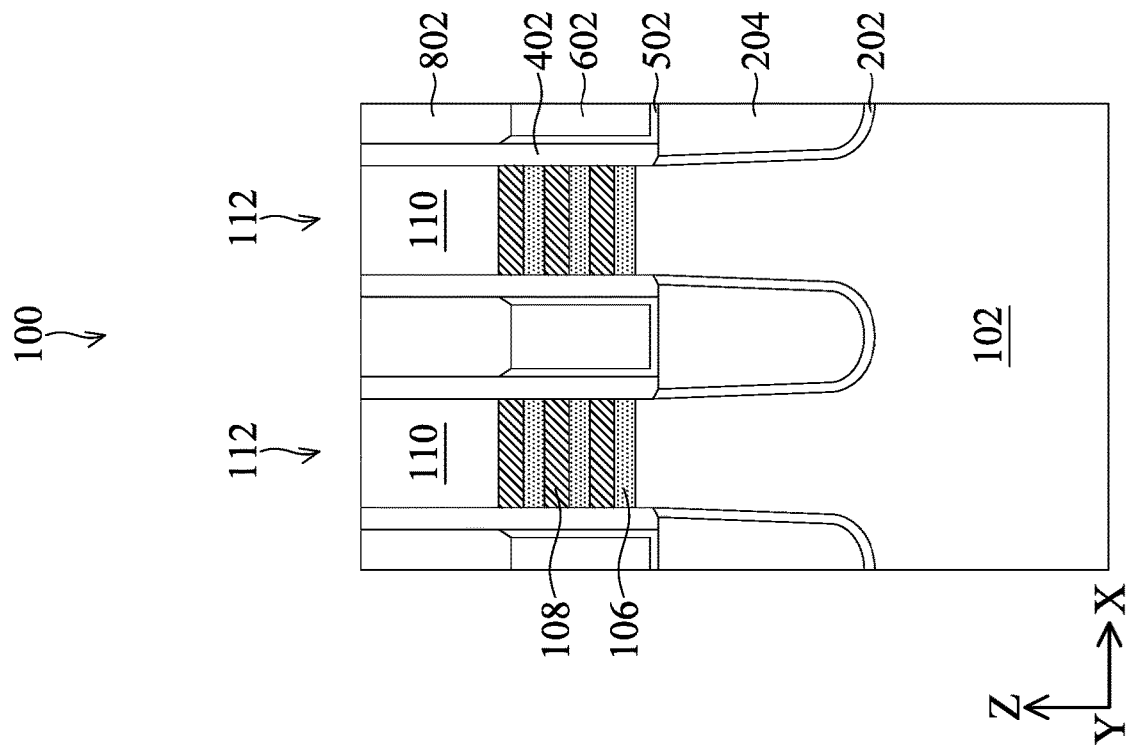
Figure 9B:
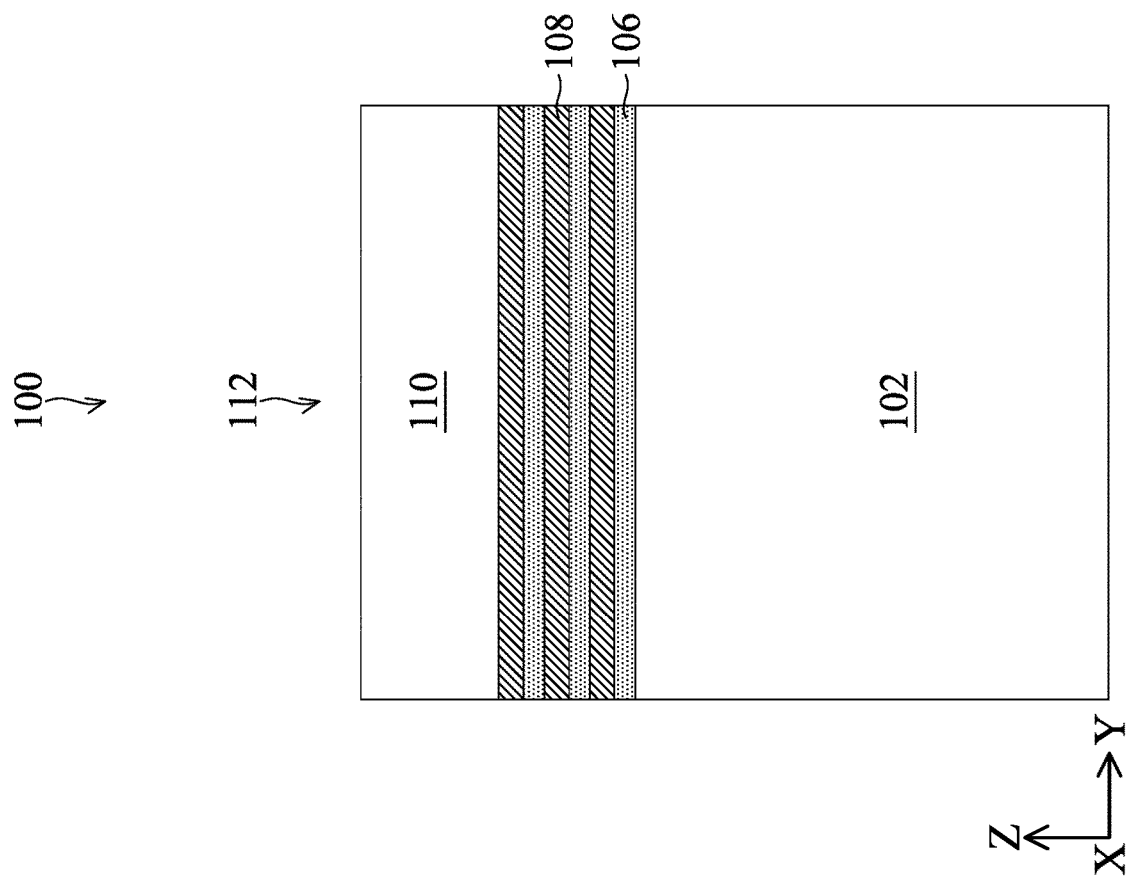

Referring to FIGS. 9A to 9C, a CMP process is performed to remove excess dielectric material over the hard mask layer 110 and the cladding layer 402 to form the dielectric features 802. The top surfaces of the hard mask layer 110 and top surfaces of the cladding layer 402 are exposed after the CMP process. Further, in some embodiments, the top surfaces of the hard mask layer 110, the cladding layer 402, and the dielectric feature 802 are substantially coplanar after the CMP process. The filler layer 602 is surrounded by the dielectric liner 502 and the dielectric feature 802. Similarly, in some aspects, dielectric features 802 extend in the Y-direction and arranged with the fins 112 in the X-direction.

Figure 10A:
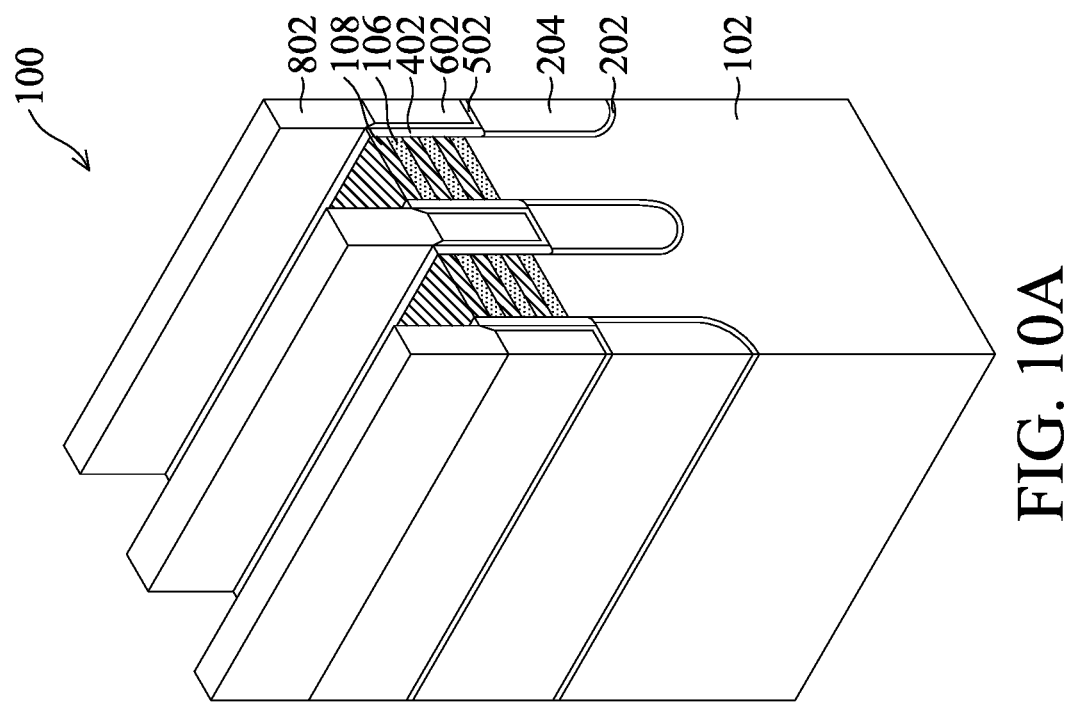
Figure 10C:
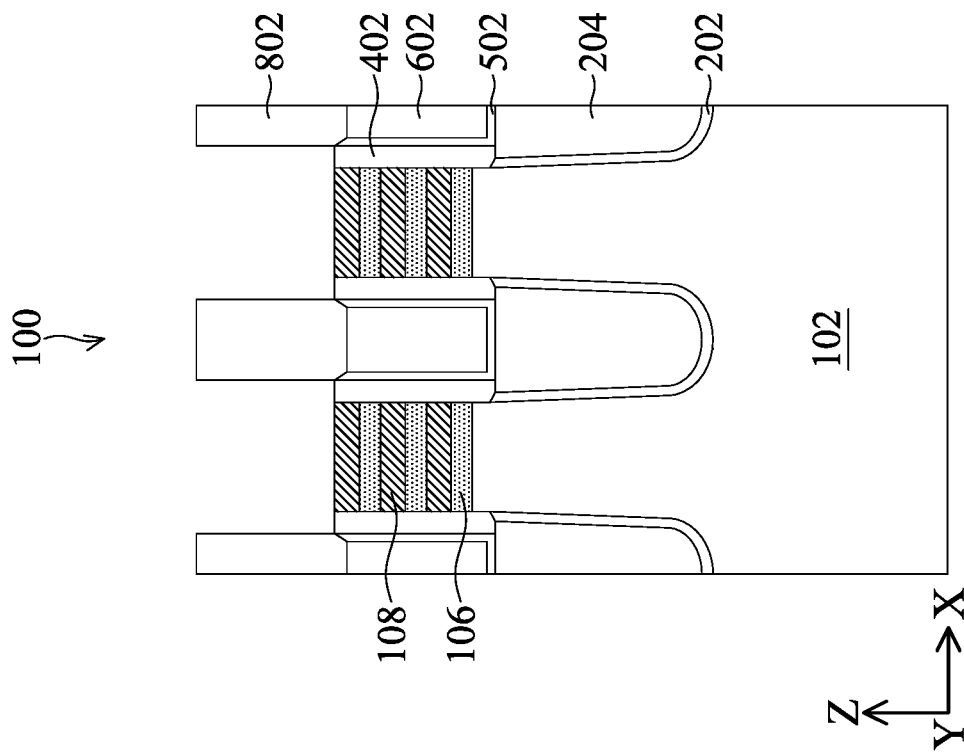
Figure 10B:
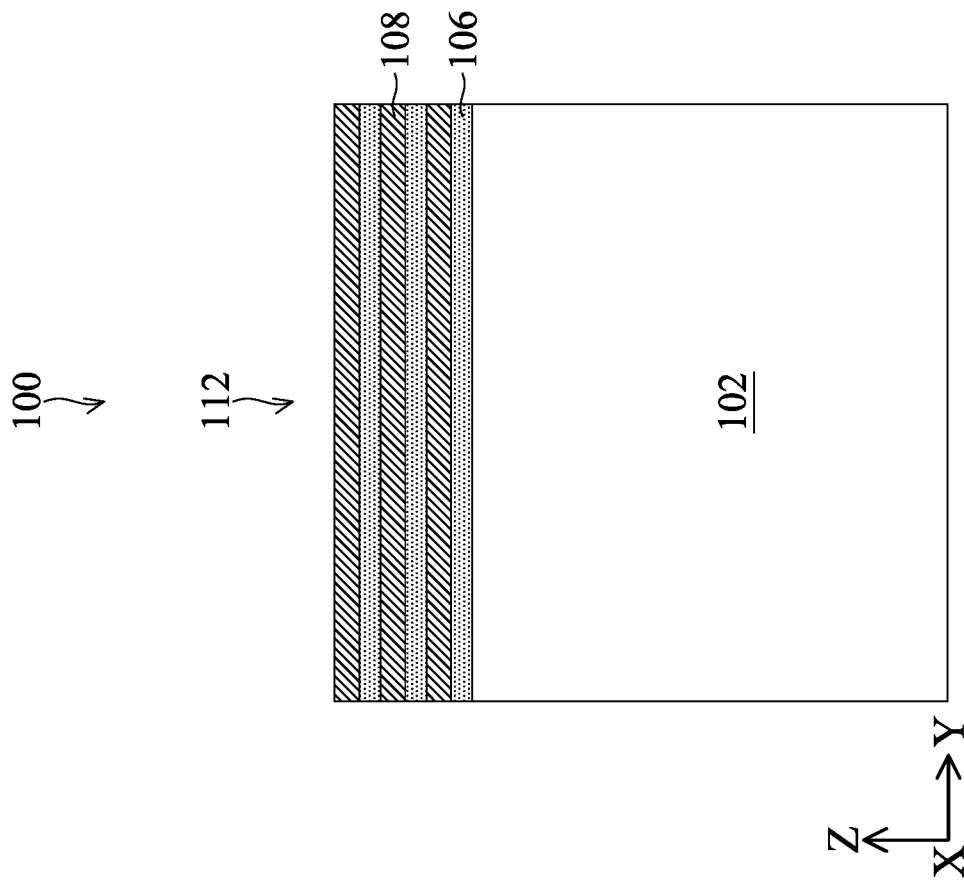

Referring to FIGS. 10A to 10C, after the CMP process, the workpiece 100 is anisotropically etched to selectively remove a portion of the cladding layer 402 and the hard mask layer 110 to expose the topmost semiconductor layer 108 (or the topmost surface of the semiconductor layers 108), without substantially damaging the dielectric features 802. The anisotropic etch process may include be a single stage etch process or a multi-stage etch process. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 11A:
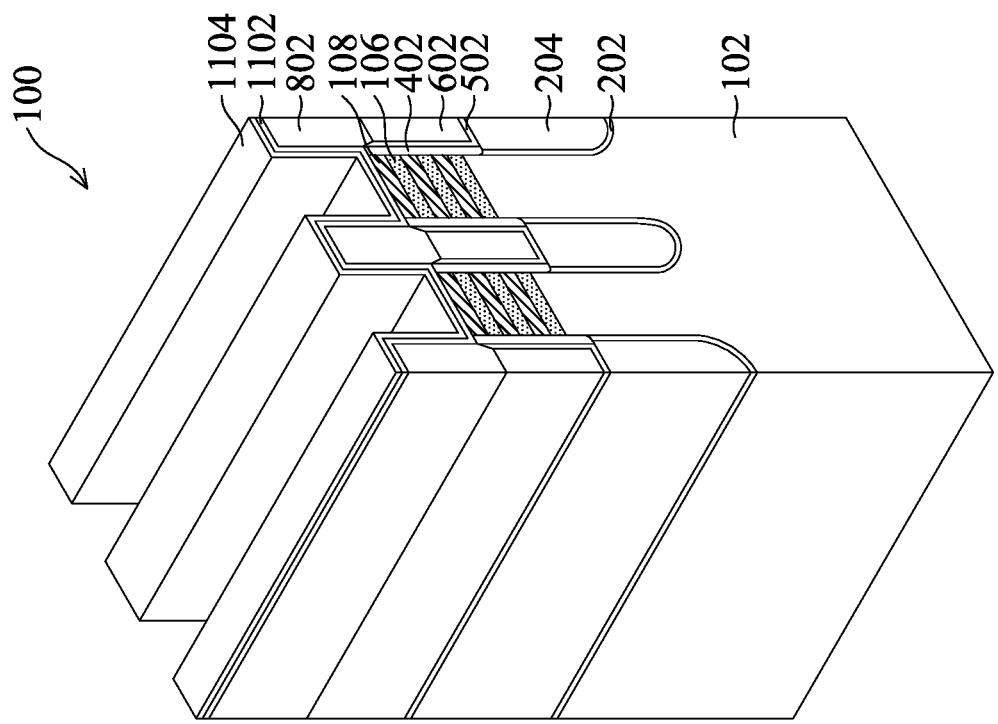
Figure 11C:
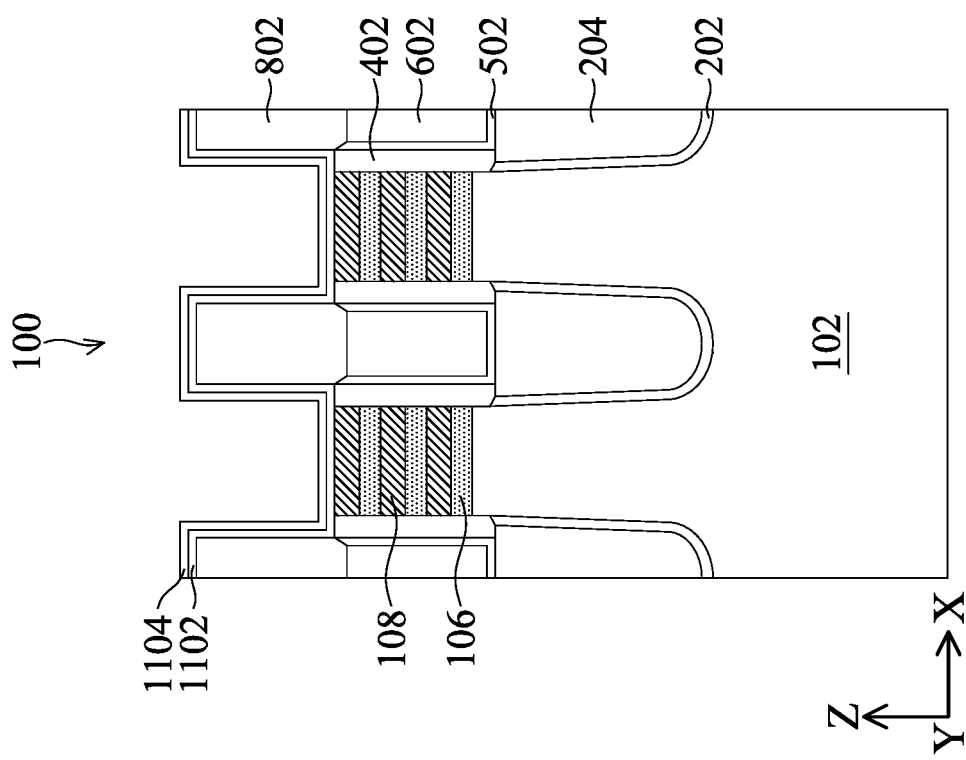
Figure 11B:
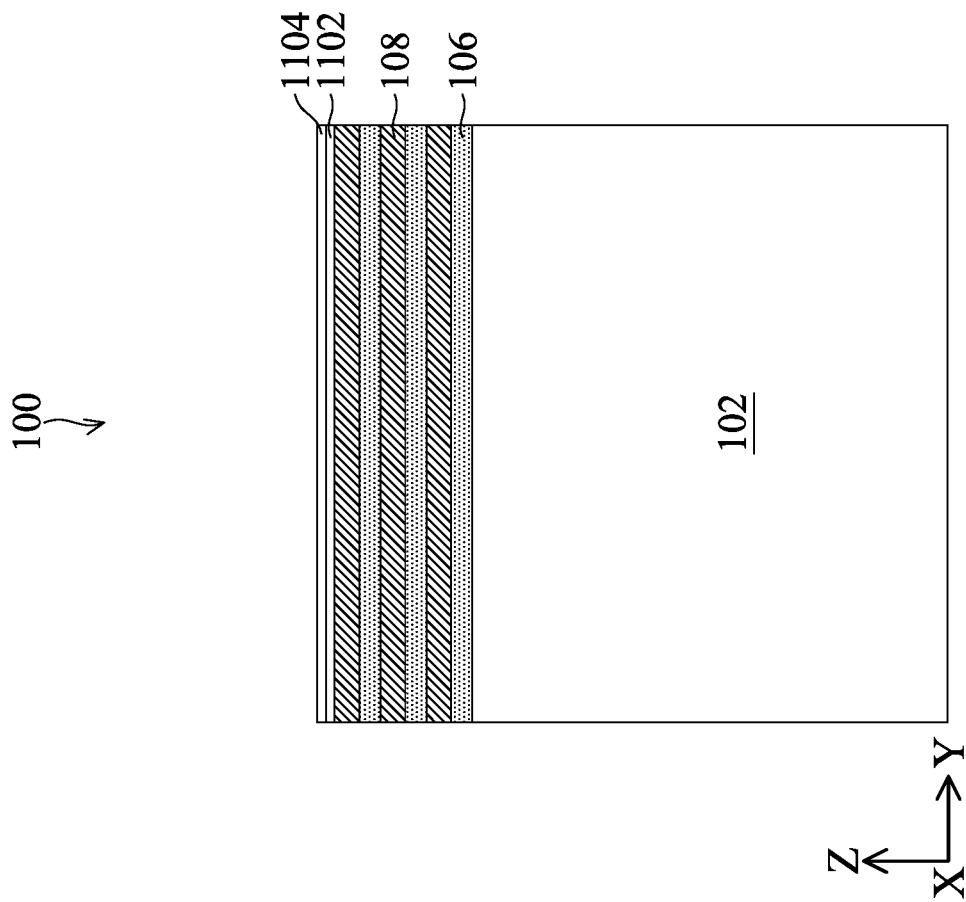

Referring to FIGS. 11A to 11C, a cap layer 1102 and an oxide layer 1104 over the cap layer 1102 are formed. Specifically, the cap layer 1102 is conformally formed over the fins 112 (over the topmost semiconductor layers 108, or the topmost surface thereof), the cladding layer 402, and the dielectric features 802 and formed on sidewalls of the dielectric features 802. The oxide layer 1104 is then conformally formed over the cap layer 1102, on sidewalls of the cap layer 1102, over the fins 112, and over the dielectric features 802. In some embodiments, the cap layer 1102 includes silicon (Si) and the oxide layer 1104 includes silicon oxide (SiO$_2$). The cap layer 1102 is formed by an epitaxial process for high quality. The oxide layer 1104 is Ion e by a PECVD process. In order to prevent the growth of an undesired epitaxial (epi) layer from the cap layer 1102 during the source/drain epi growth, the cap layer 1102 is formed to have a thickness in a range from about 0.5 nm to about 2 nm. In some embodiments, the cap layer 1102 is formed to have a thickness in a range from about 1 nm to about 5 nm at first, and then an upper portion of the cap layer 1102 is oxidized into an oxidized cap layer during the PECVD process for forming the oxide layer 1104, so that the cap layer 1102 is thinned. In other words, the oxide layer 1104 includes the oxidized cap layer formed form the cap layer 1102 and an oxide layer formed over the oxidized cap layer. In some embodiments, the oxide layer 1104 is formed by the PECVD process with about 150 Watt to 800 Watt, such process condition may oxidize the cap layer 1102. In some embodiments, the oxide layer 1104 is formed to have a thickness in a range from about 2 nm to about 5 nm. In some embodiments, during the PECVD process for forming the oxide layer 1104, the cap layer 1102 is fully oxidized into the oxidized cap layer to be a portion of the oxide layer 1104. As a result, the oxide layer 1104 is conformally formed over the topmost semiconductor layer 108 (or the topmost surface thereof), the cladding layer 402, and the dielectric features 802 and formed on sidewalls of the dielectric features 802. In some embodiments, the oxide layer 1104 is conformally formed over the topmost semiconductor layer 108 (or its topmost surface), the cladding layer 402, and the dielectric features 802 and formed on sidewalls of the dielectric features 802, without forming the cap layer 1102.

Figure 13B:
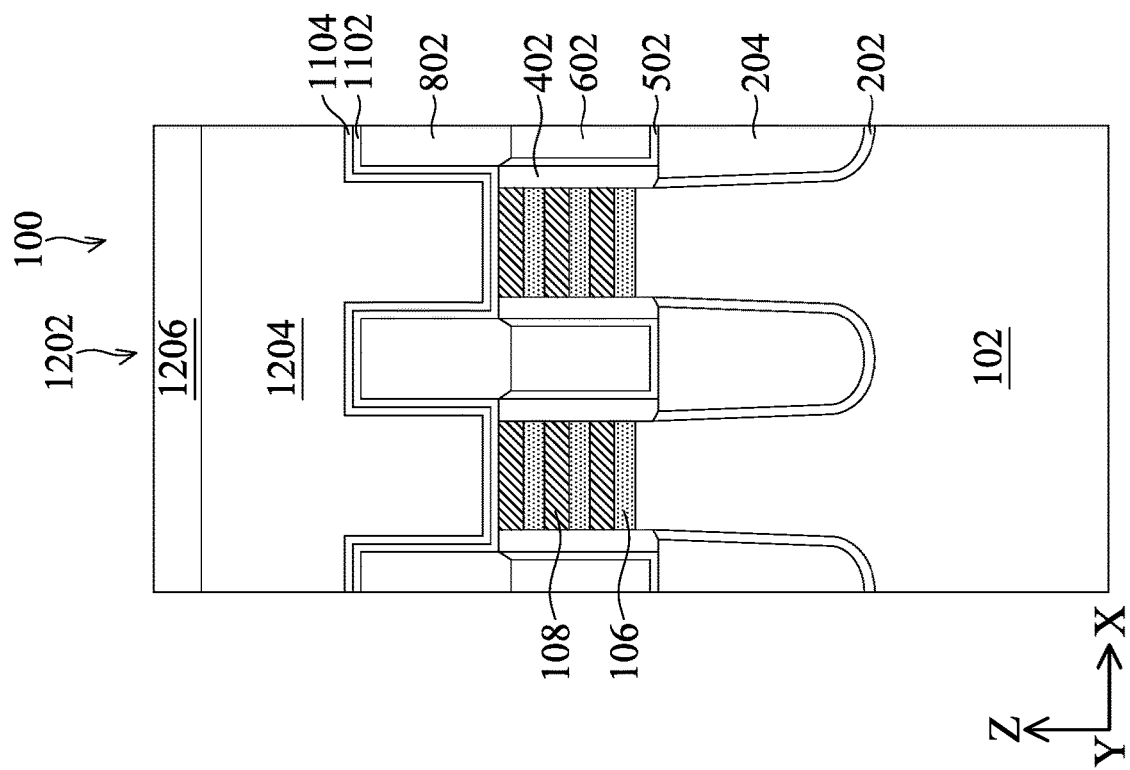
Figure 13A:
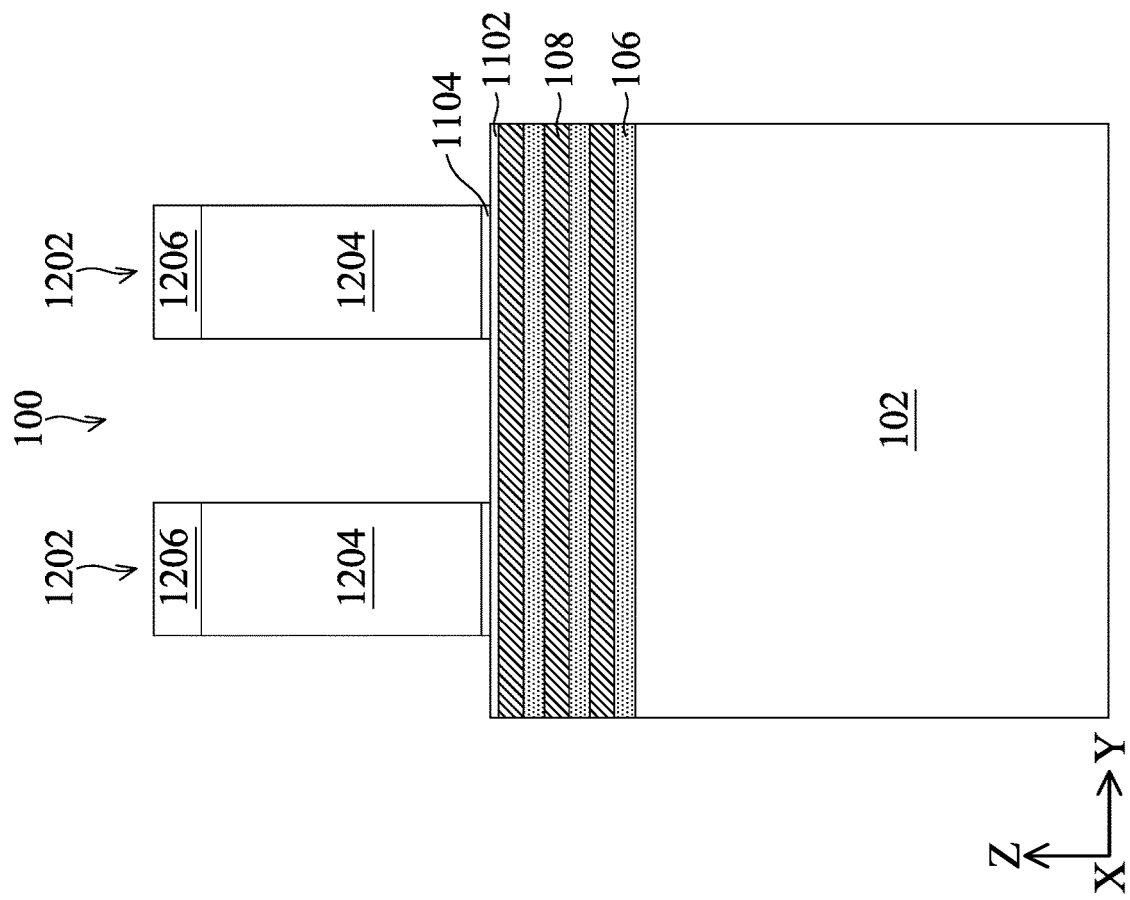
Figure 13D:
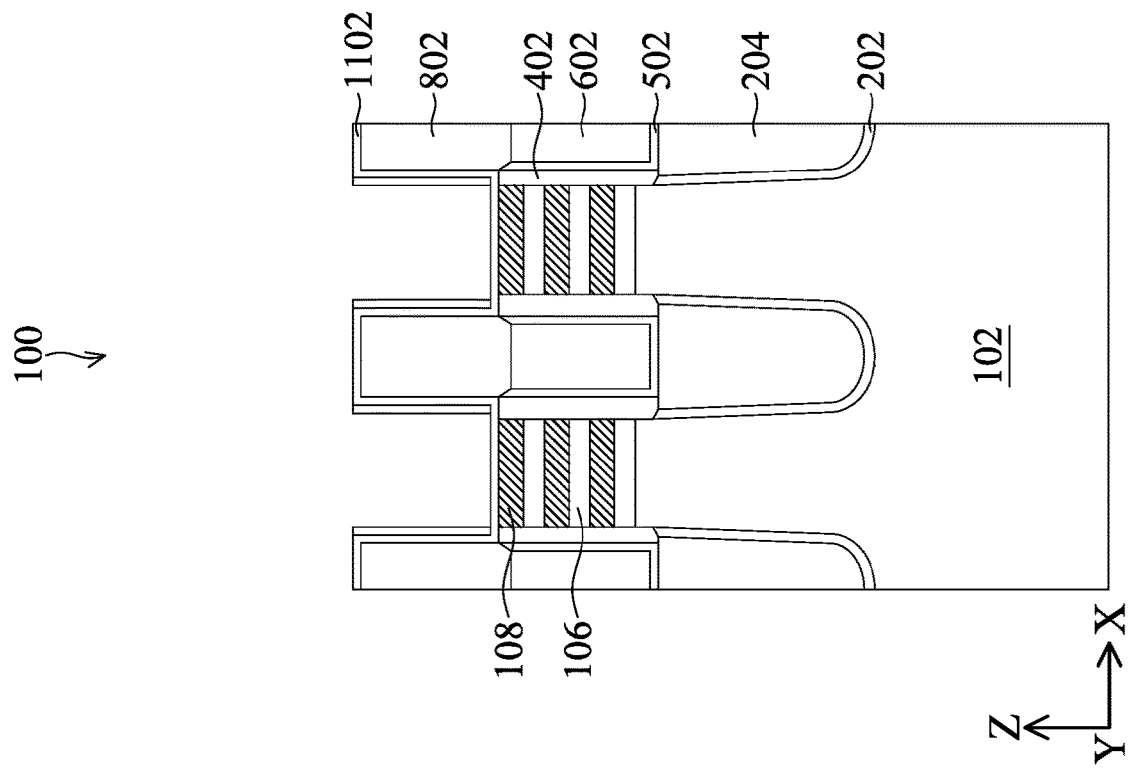
Figure 13C:
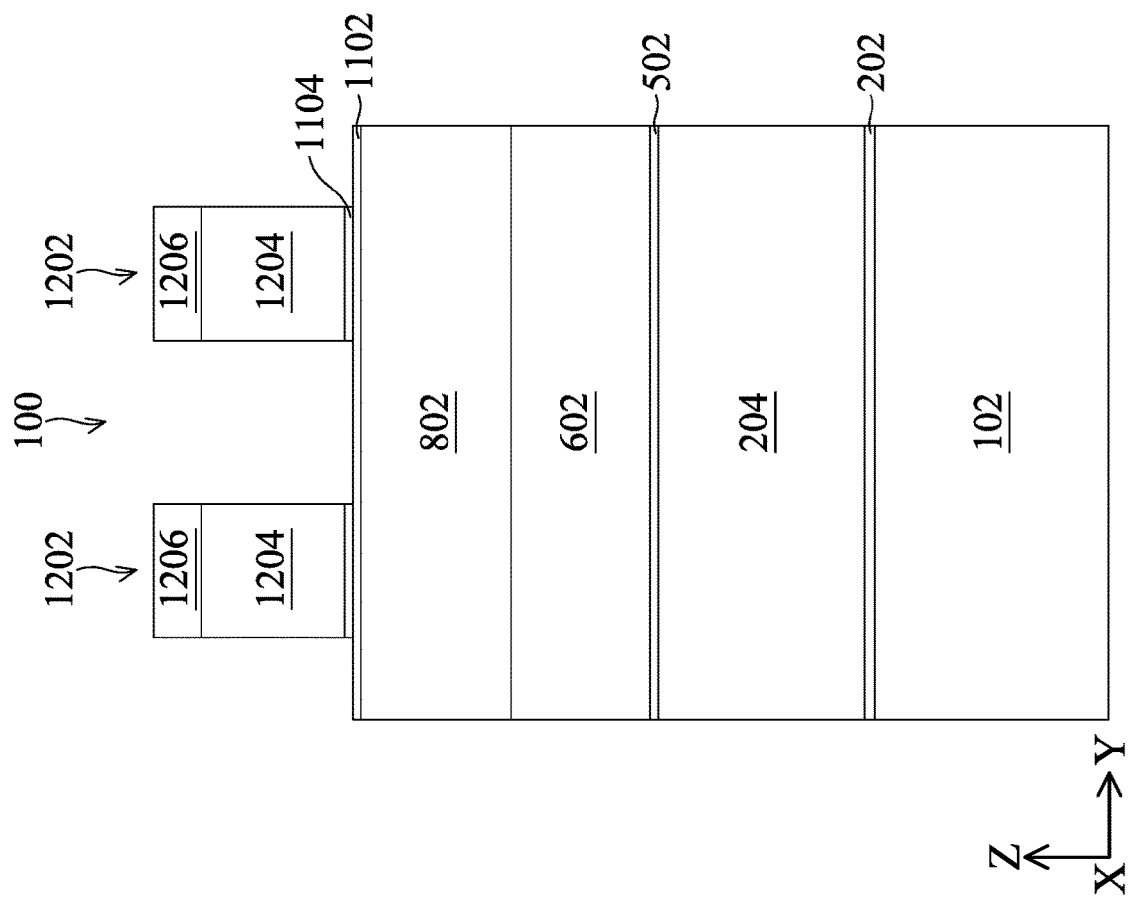
Figure 14:
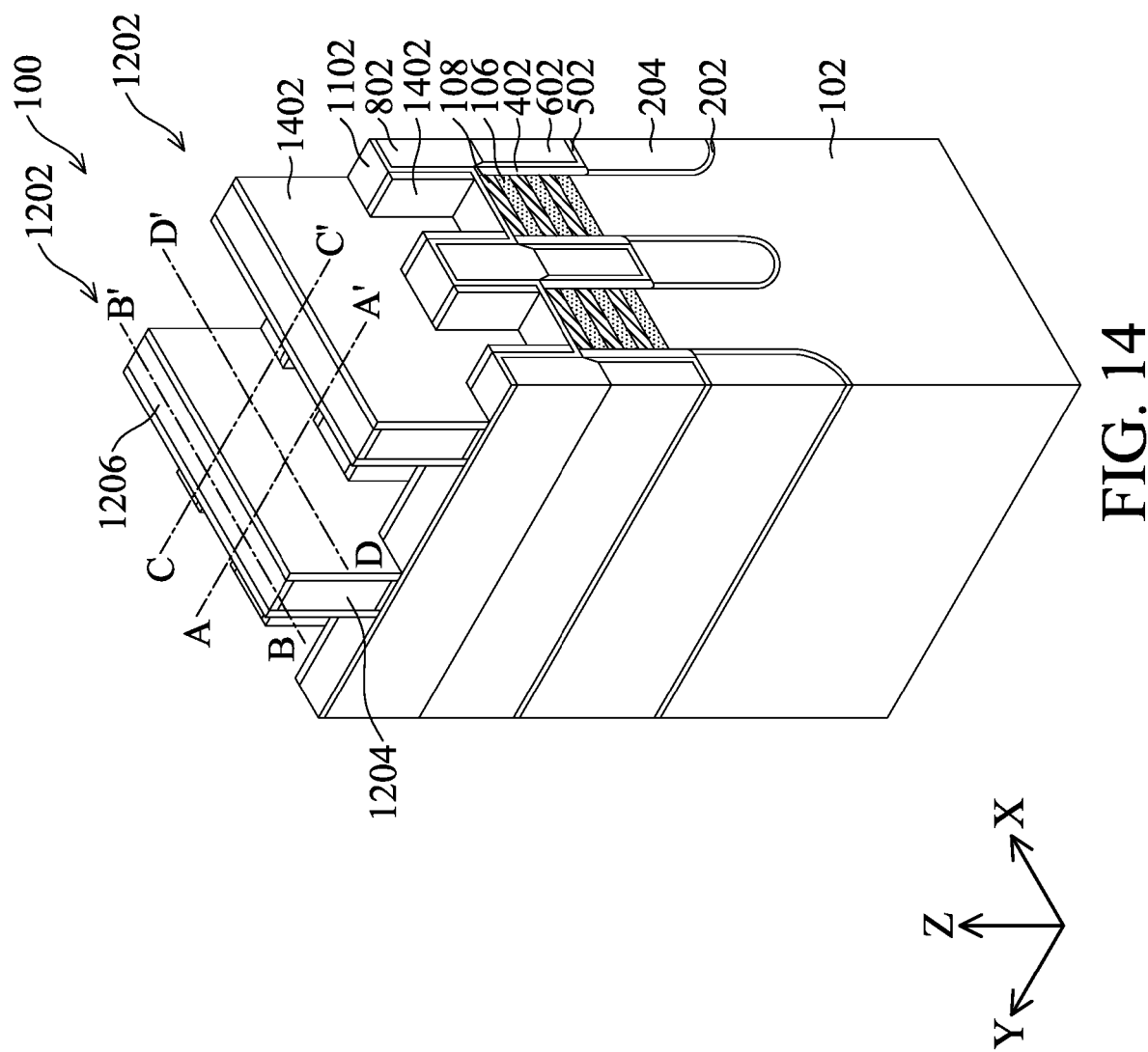

Referring to FIGS. 12 and 13A to 13D, dummy gate structures 1202 may be formed over the fins 112, the cladding layer 402, the dielectric features 802, and the cap layer 1102. The dummy gate structure 1202 may be configured to extend along the X-direction and wrap around the top surfaces and side surfaces of the dielectric features 802, as shown in FIGS. 12 and 13B. In some embodiments, to form the dummy gate structures 1202, a dummy gate material of a dummy gate electrode 1204 is formed over the oxide layer 1104. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material may be deposited using CVD, PVD, ALD, PECVD), LPCVD, ALCVD, APCVD, other suitable methods, or combinations thereof. Then, hard mask layers 1206 are formed over the dummy gate material and directly overlies the fins 112. In some embodiments, the hard mask layers 1206 may be formed using photolithography and removal (e.g., etching) processes. In some embodiments, each of the hard mask layers 1206 may include multiple layers, such as a silicon nitride layer and a silicon oxide layer. After the formation of the hard mask layers 1206, a removal process (e.g., etching) may be performed to remove portions of the dummy gate material and the oxide layer 1104 that do not directly underlie the hard mask layers 1206, without substantial damages to the cap layer 1102, thereby forming the dummy gate structures 1202 each having the oxide layer 1104, the dummy gate electrode 1204, and the hard mask layer 1206. The oxide layer 1104 may also be referred to as dummy gate dielectric. The dummy gate structures 1202 may undergo a gate replacement process through subsequent processing to form metal gates, such as a high-k metal gate, as discussed in greater detail below.

Referring to FIGS. 14 and 15A to 15D, gate spacers 1402 are formed on sidewalls of the dummy gate structures 1202 and over top surface of the cap layer 1102. The gate spacers 1402 may include silicon nitride (Si$_3$N$_4$), silicon oxide (SiO$_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 1402 may include a single layer or a multi-layer structure. In some embodiments, the gate spacers 1402 may be formed by depositing a spacer layer (containing the dielectric material) conformally over the cap layer 1102 and the dummy gate structures 1202, followed by an anisotropic etching process to remove top portions of the spacer layer from the top surfaces of the cap layer 1102 and the dummy gate structures 1202. After the etching process, portions of the spacer layer on the sidewalls of the dummy gate structures 1202 and the cap layer 1102 (on the sidewalls of the dielectric features 802) substantially remain and become the gate spacers 1402. In some embodiments, the anisotropic etching process is a dry (e.g., plasma) etching process. Additionally or alternatively, the formation of the gate spacers 1402 may also involve chemical oxidation, thermal oxidation, ALD, CVD, and/or other suitable methods. The gate spacers 1402 may also be interchangeably referred to as the top spacers.

Figure 16A:
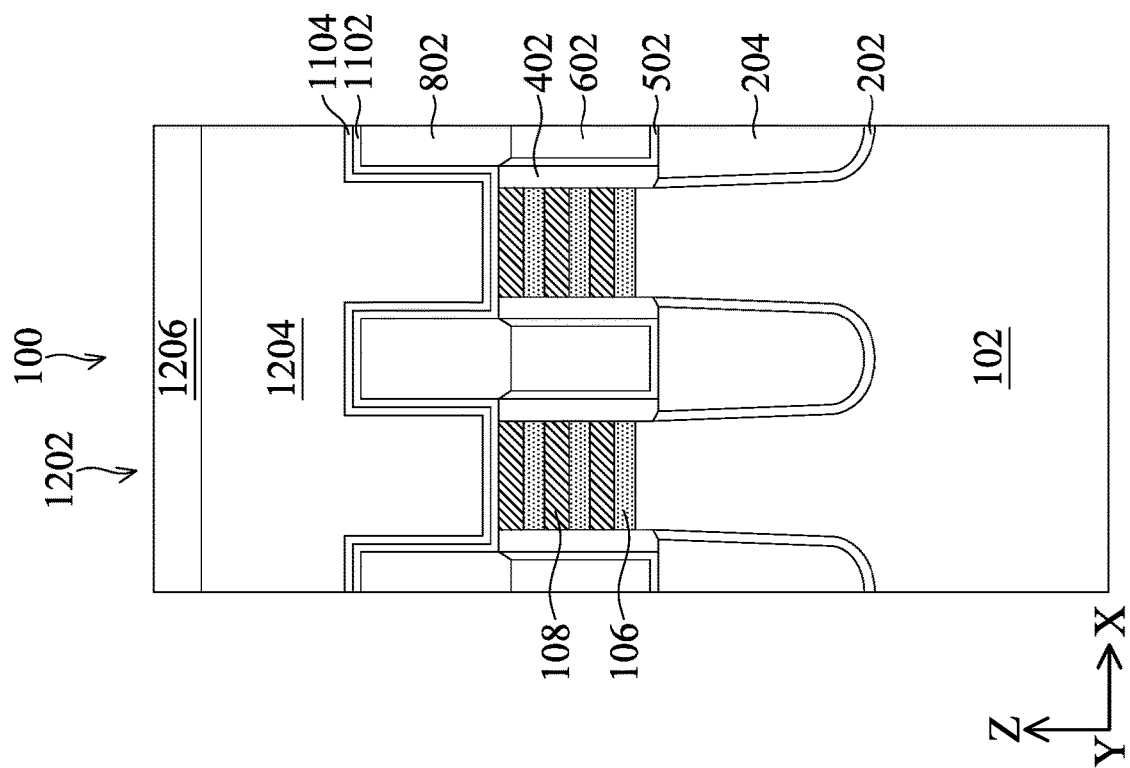
Figure 16B:
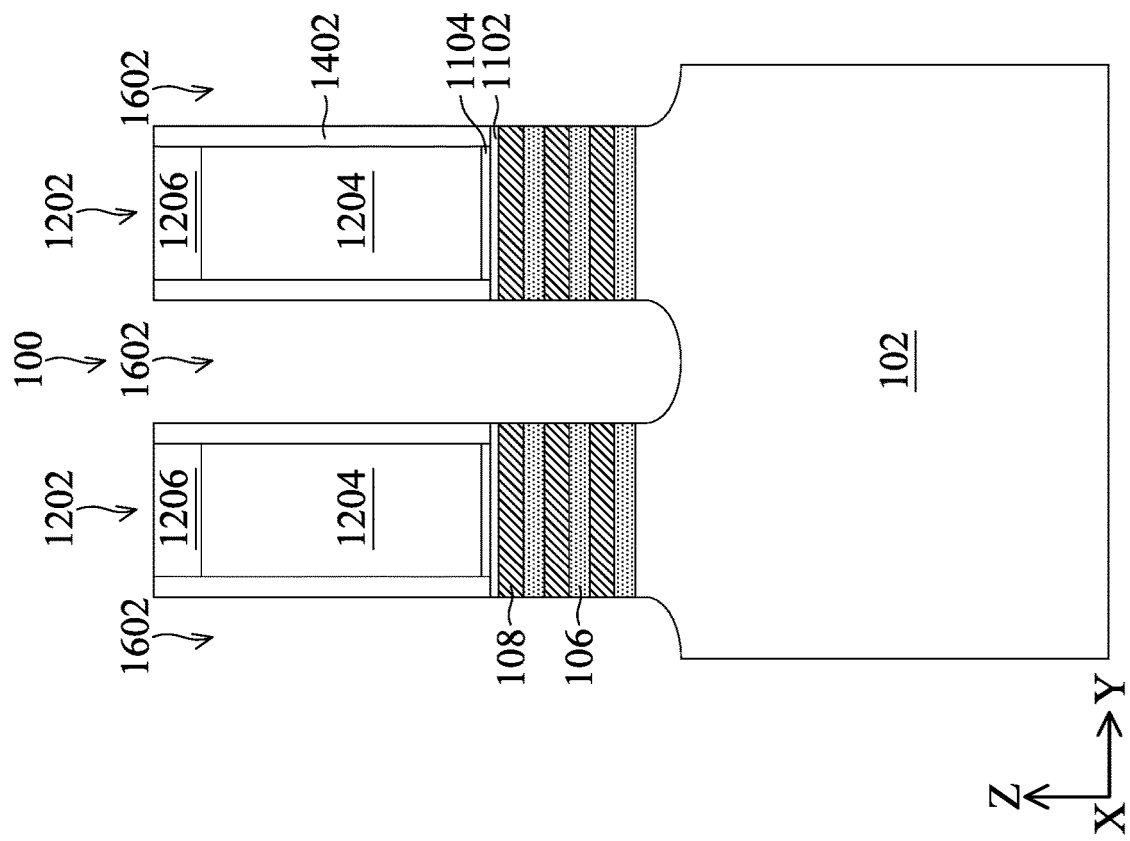
Figure 16C:
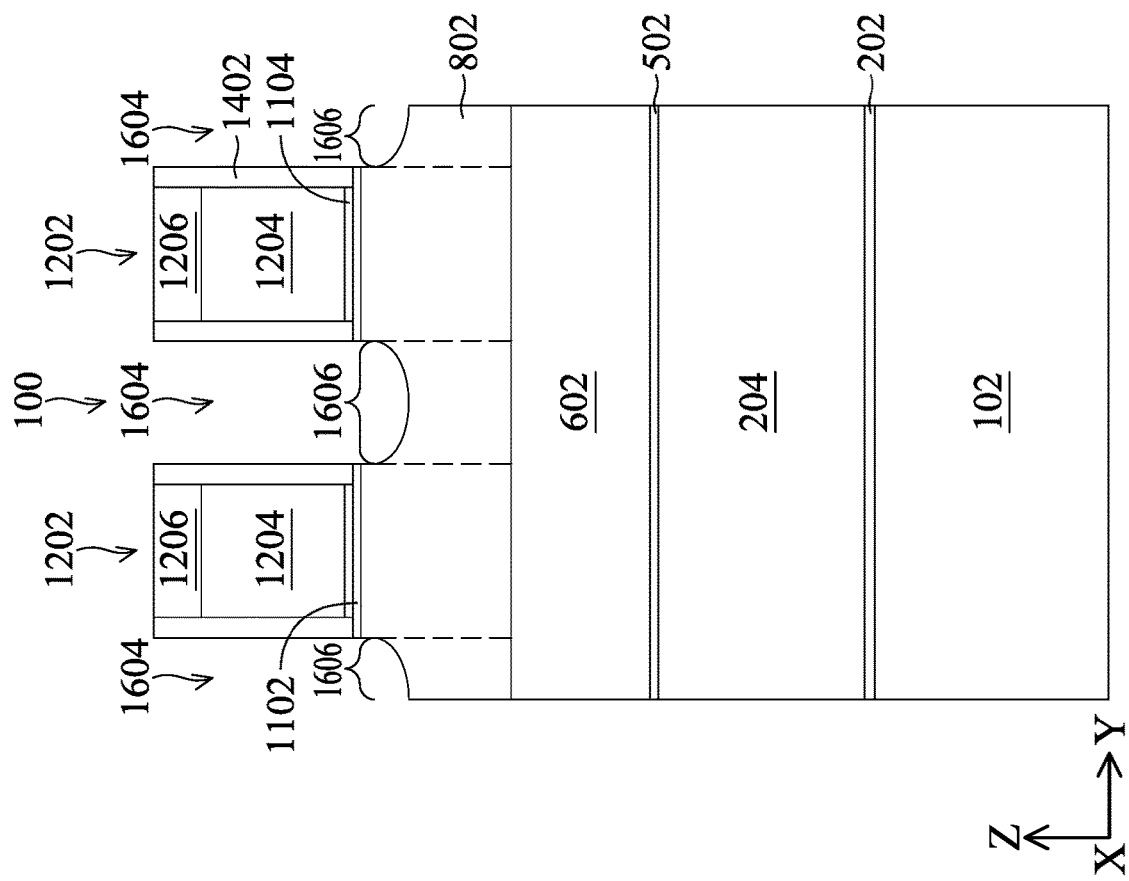
Figure 16D:
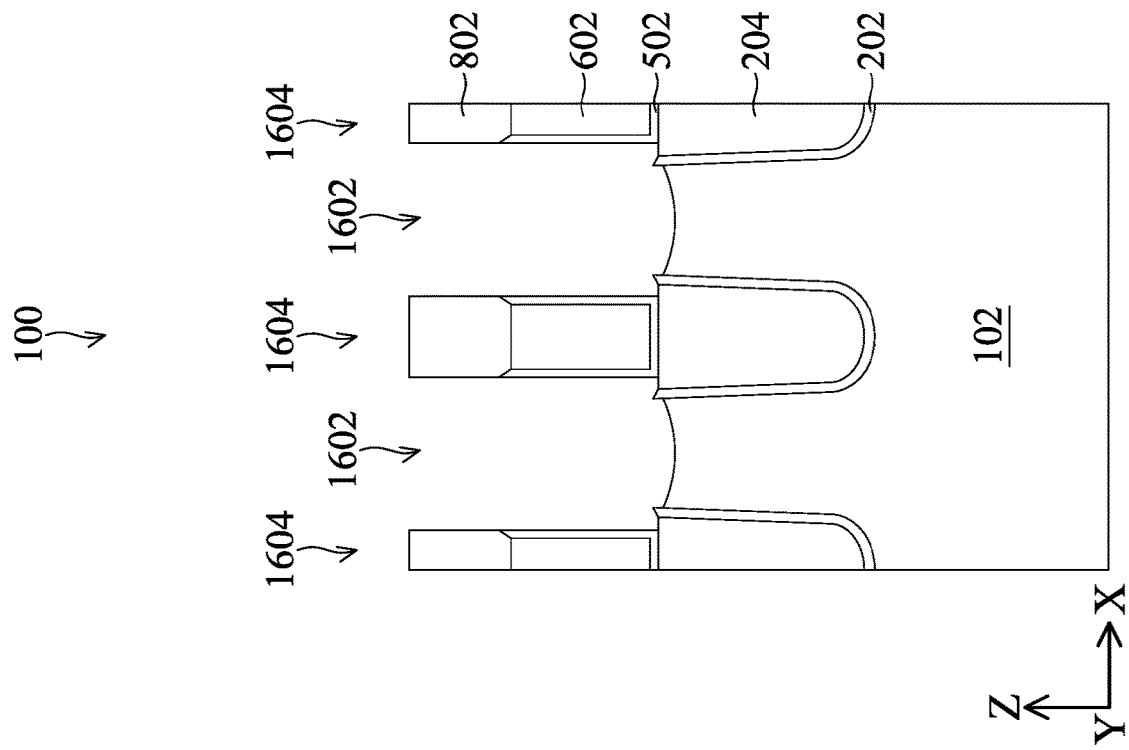
Figure 17B:
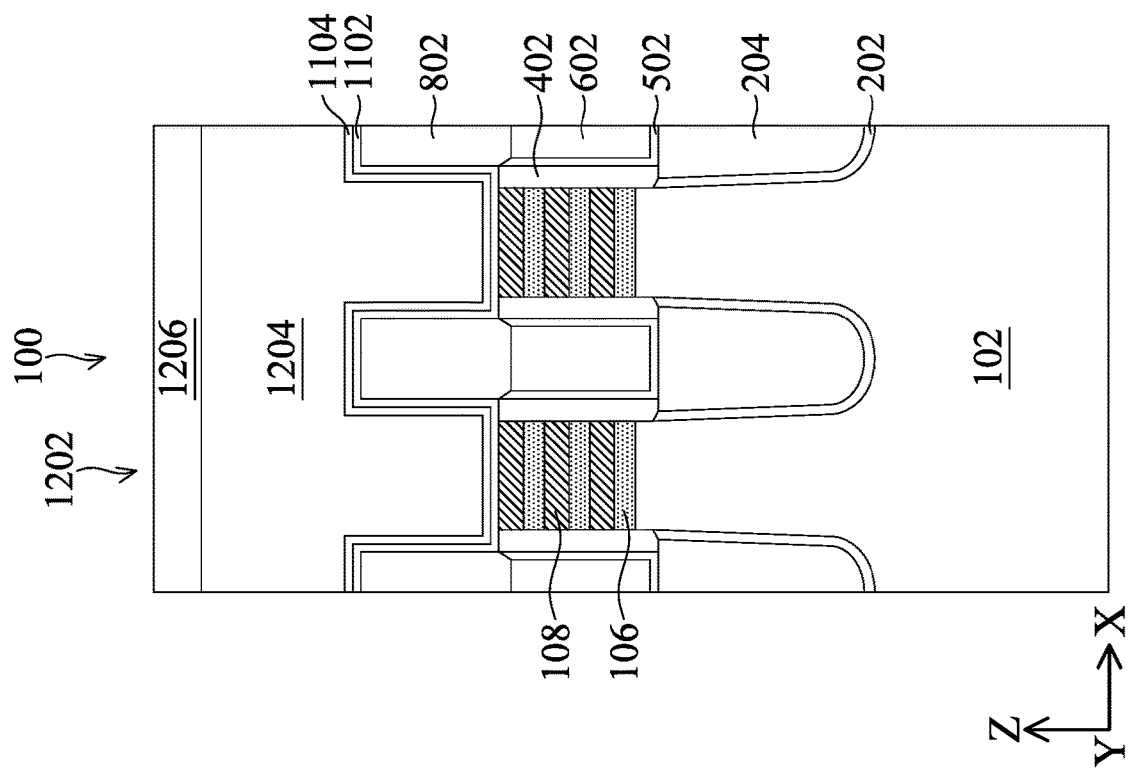
Figure 17A:
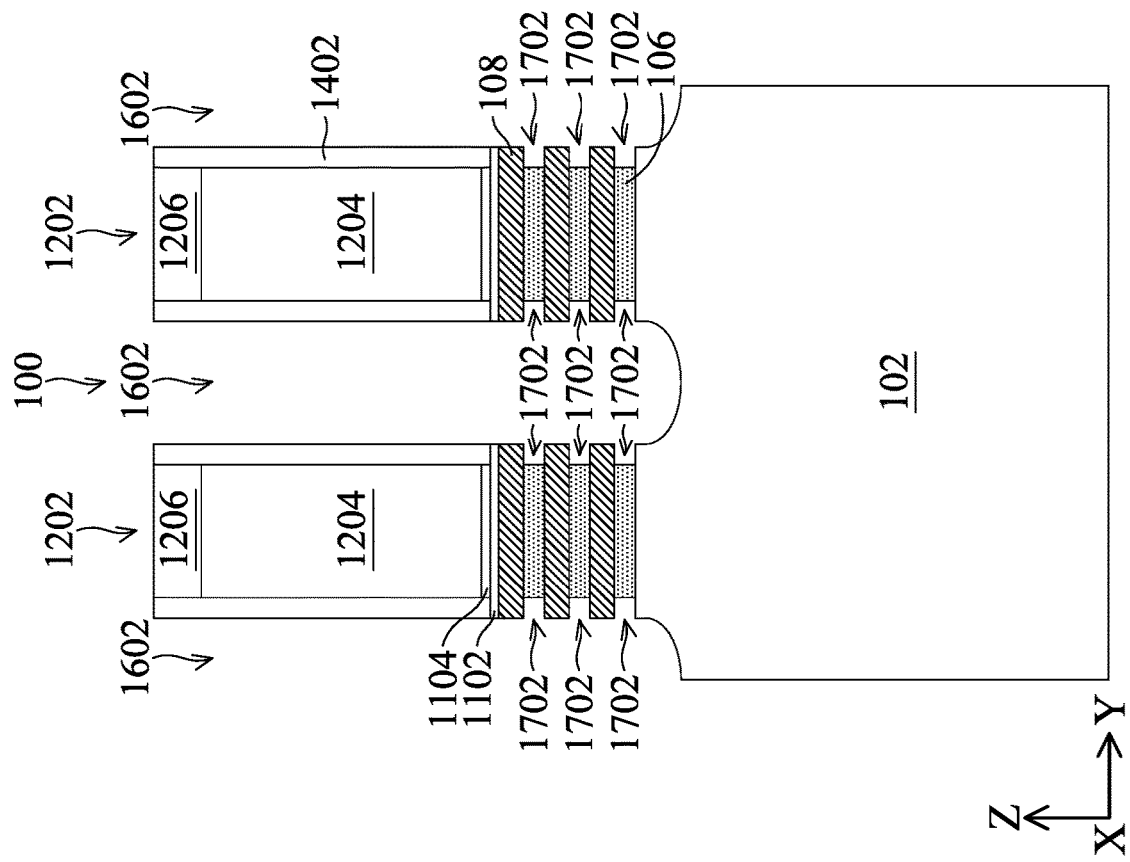
Figure 17D:
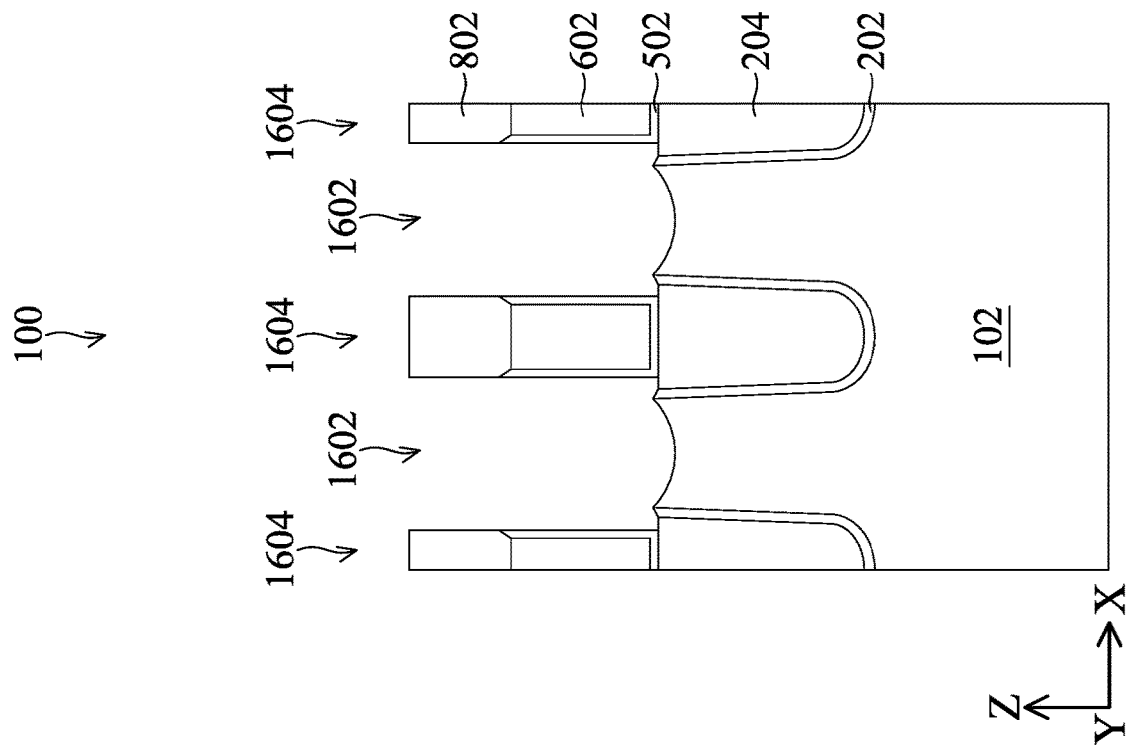
Figure 17C:
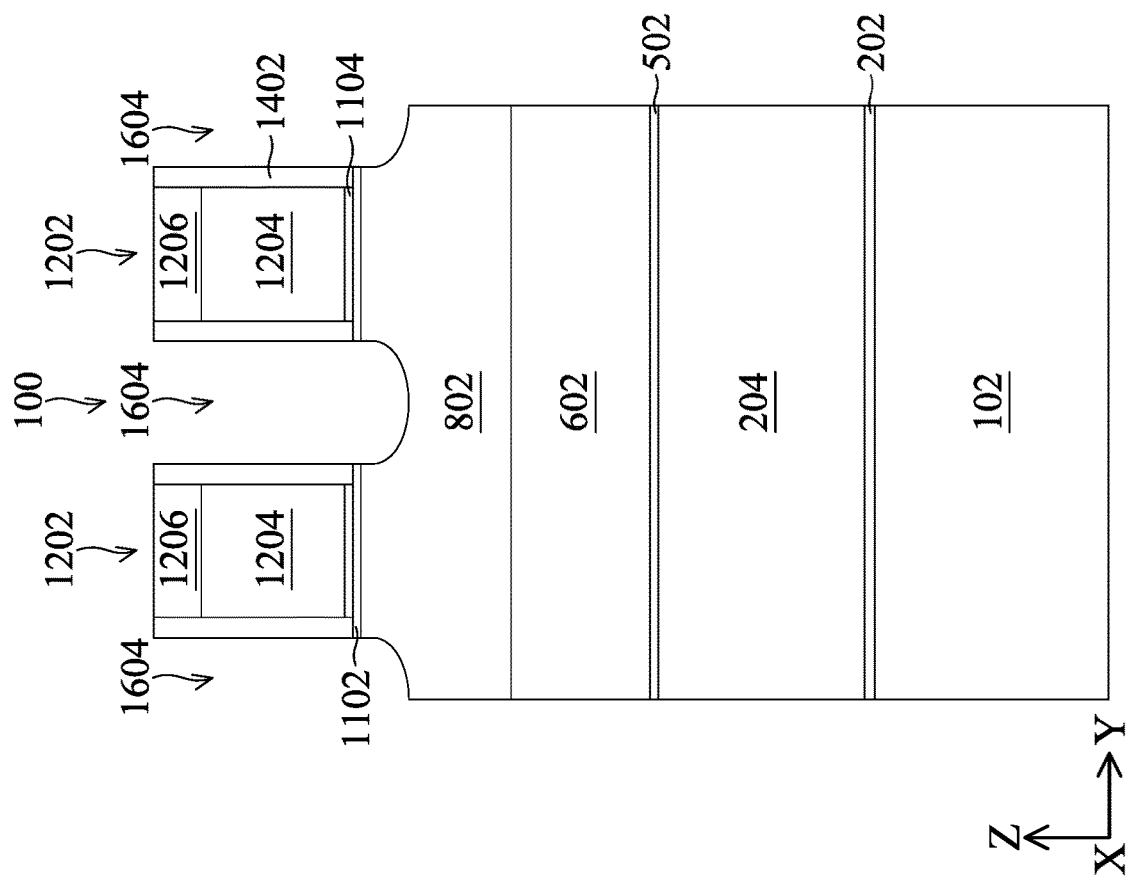

Referring to FIGS. 16A to 16D, the fins 112 are recessed to form source/drain trenches 1602 passing through the cap layer 1102 and in the fins 112. Specifically, the source/drain trenches 1602 may be formed by performing one or more etching processes to remove portions of the cap layer 1102, the semiconductor layers 106, the semiconductor layers 108, and the substrate 102 that do not vertically overlap or be covered by the dummy gate structures 1202 and the gate spacers 1402. In some embodiments, a single etchant may be used to remove the cap layer 1102, the semiconductor layers 106, the semiconductor layers 108, and the substrate 102, whereas in other embodiments, multiple etchants may be used to perform the etching process. As shown in FIGS. 16A and 16D, portions of the substrate 102 are etched, so that the source/drain trenches 6202 each has a concave surface in the substrate 102, and the concave surface is lower than the top surfaces of the isolation feature 204. Further, as shown in FIG. 16D, the gate spacers 1402 on the sidewalls of the cap layer 1102 as well as the cladding layer 402 below them are also removed during the formation of the source/drain trenches 1602. In some embodiments, top portions of the dielectric features 802 are recessed during the formation of the source/drain trenches 1602, so that recesses 1604 are formed through the cap layer 1102 and in the dielectric features 802, thereby forming recessed portions 1606 of the dielectric features 802, as shown in FIGS. 16C and 16D.

Referring to FIGS. 17A to 17D, side portions of the semiconductor layers 106 are removed via a selective etching process. Specifically, the selective etching process is performed that selectively etches the side portions of the semiconductor layers 106 and the cladding layer 402 below the gate spacers 1402 through the source/drain trenches 1602, with minimal (or no) etching of semiconductor layers 108, such that gaps 1702 are formed between the semiconductor layers 108 as well as between the semiconductor layers 108 and the substrate 102, below the gate spacers 1402 and the cap layer 1102. The etching process is configured to laterally etch (e.g., along the Y-direction) the semiconductor layers 106 and the cladding layer 402 below the gate spacers 1402. The selective etching process is a dry etching process, a wet etching process, other suitable etching process, or combinations thereof.

Figure 18B:
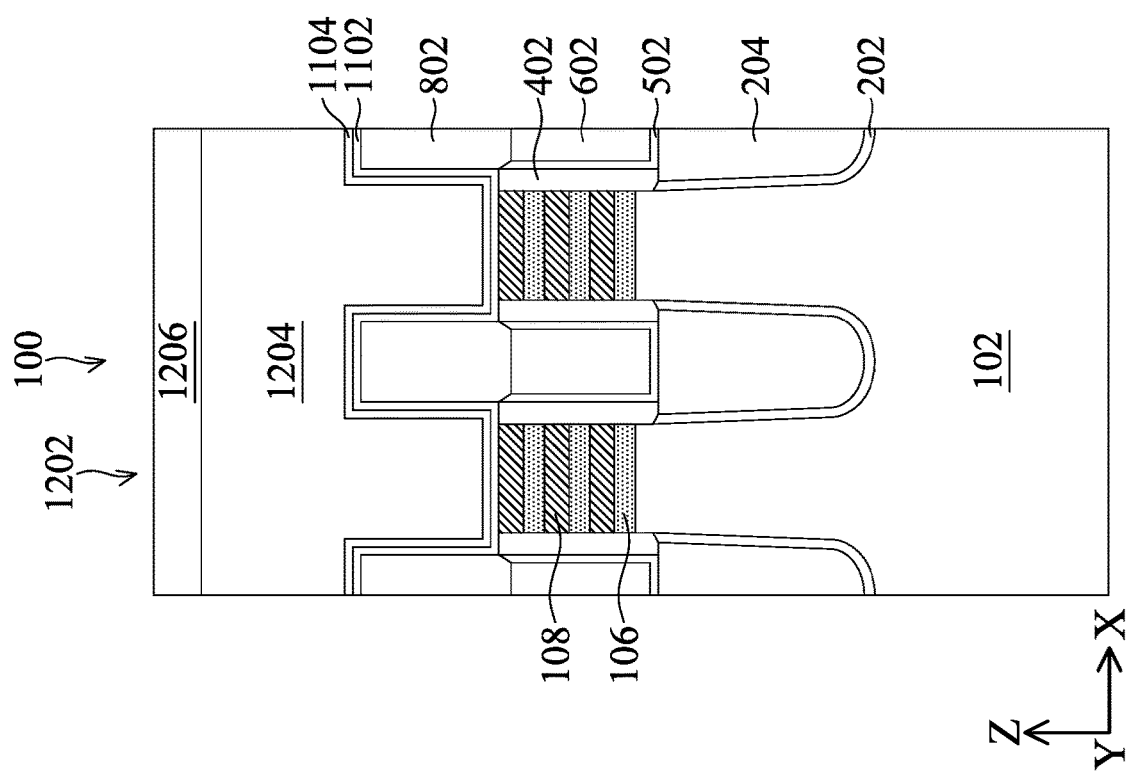
Figure 18A:
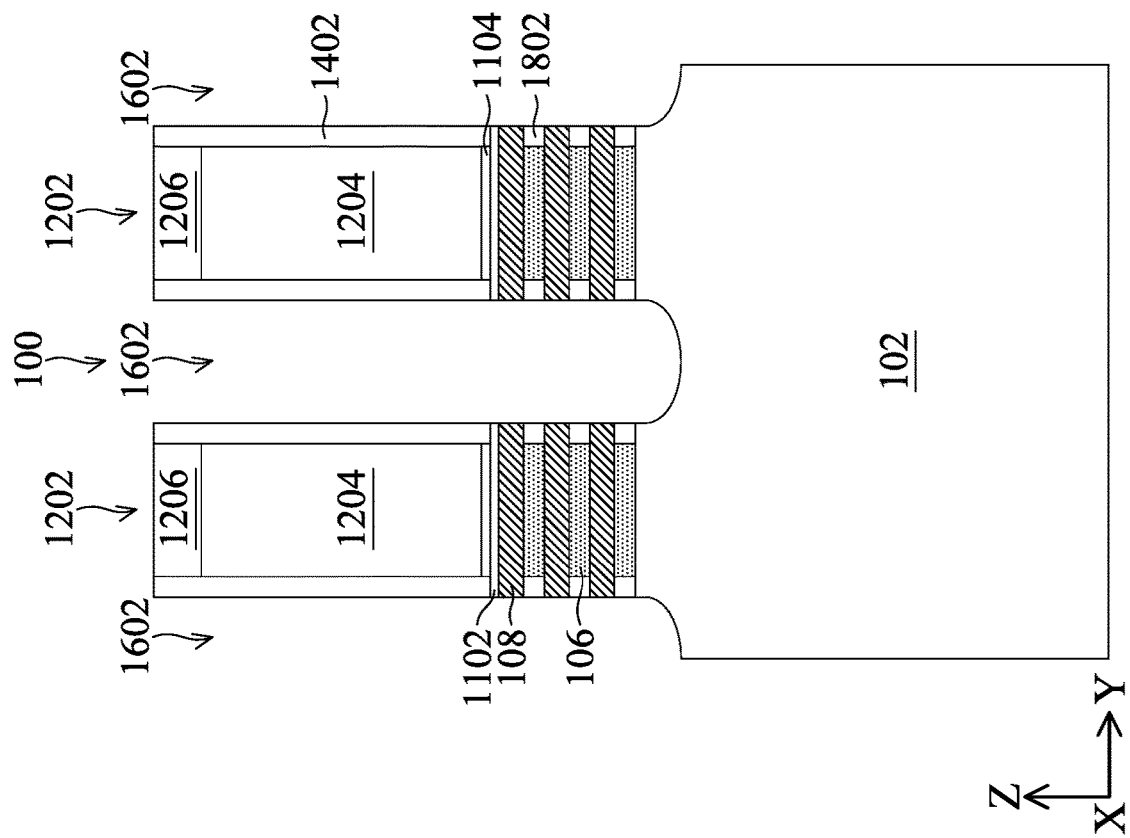
Figure 18D:
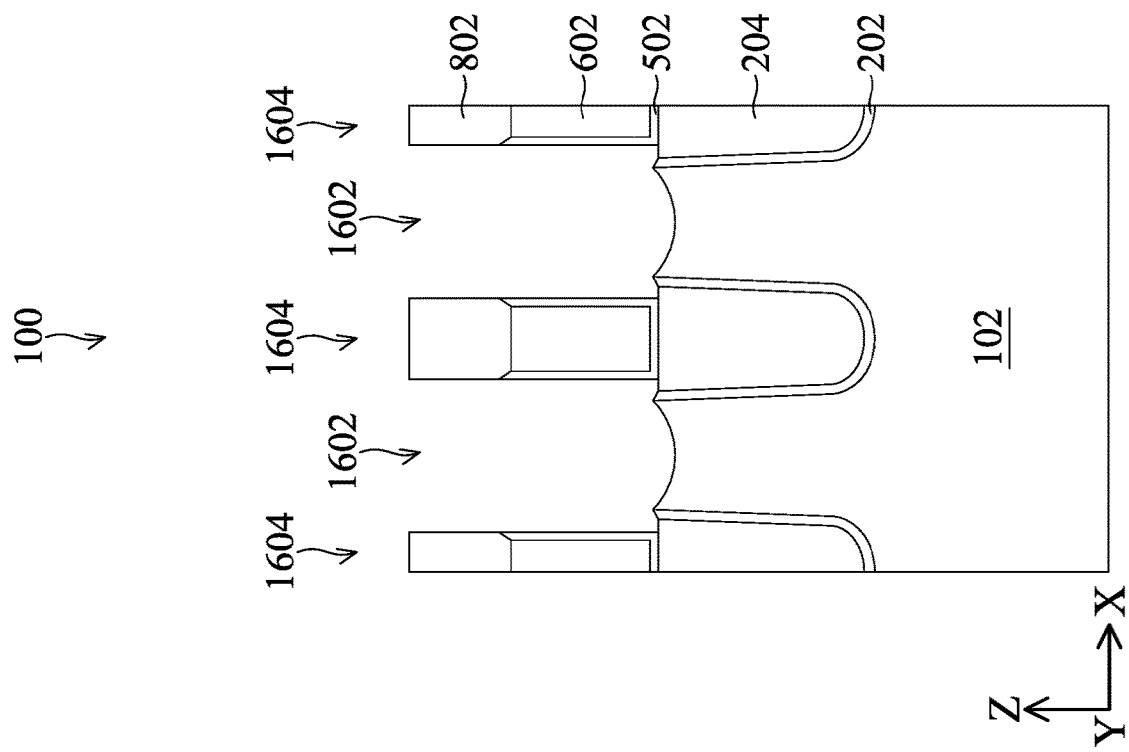
Figure 18C:
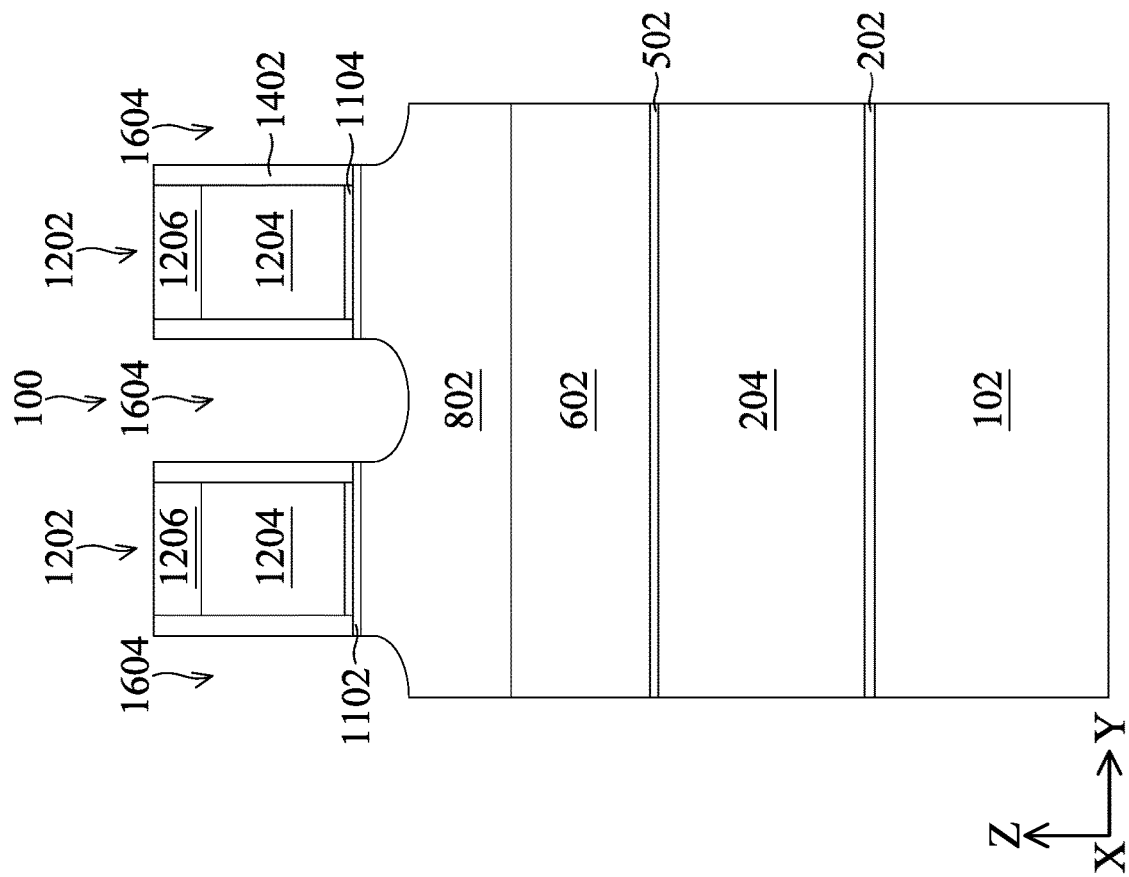
Figure 19D:
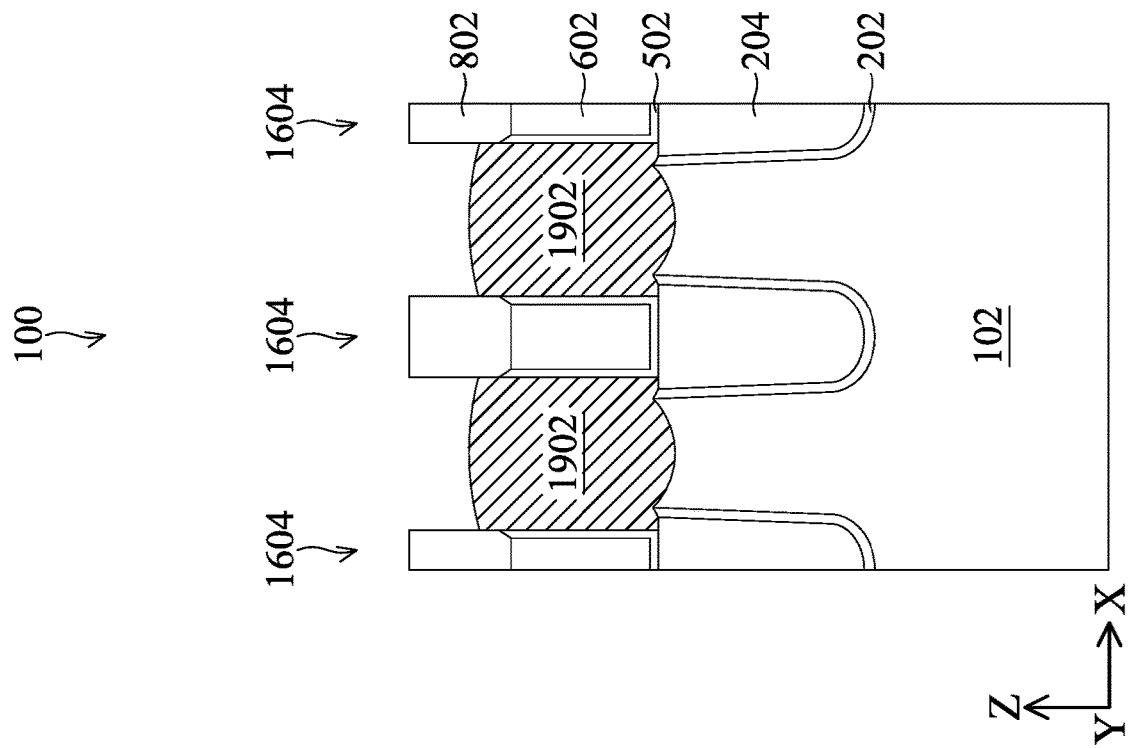
Figure 19C:
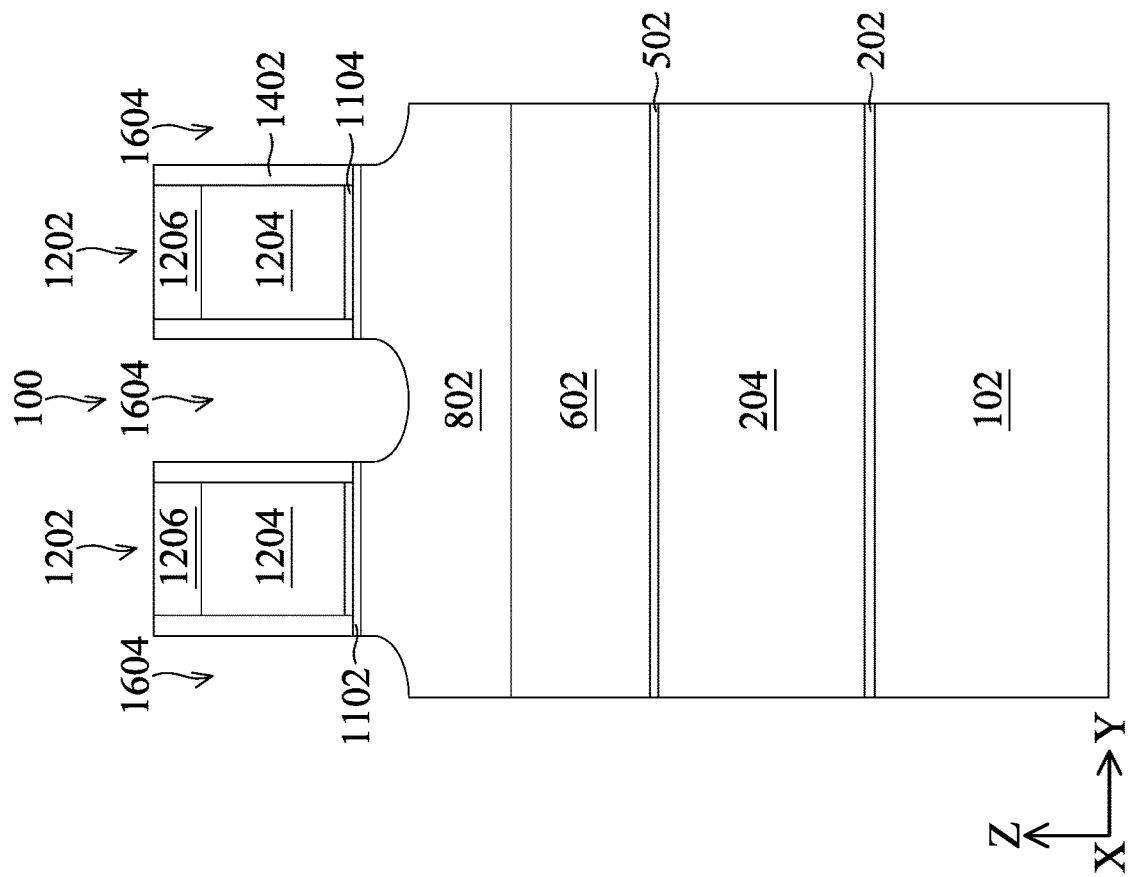

Referring to FIGS. 18A to 18D, inner spacers 1802 are formed to fill the gaps 1702. In some embodiments, sidewalls of the inner spacers 1802 are aligned to sidewalls of the gate spacers 1402, the cap layer 1102, and the semiconductor layers 108, as shown in FIG. 18A. In order to form the inner spacers 1802, a deposition process forms a spacer layer into the source/drain trenches 1602 and the gaps 1702, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 1602. The deposition process is configured to ensure that the spacer layer fills the gaps 1702 between the semiconductor layers 108 as well as between the semiconductor layer 108 and the substrate 102 under the gate spacers 1402 and the cap layer 1102. An etching process is then performed that selectively etches the spacer layer to form inner spacers 1802 (as shown in FIG. 18A) with minimal (to no) etching of the semiconductor layer 108, the substrate 102, the dummy gate structures 1202, and the gate spacers 1402. The spacer layer (and thus inner spacers 1802) includes a material that is different than a material of the semiconductor layers 108 and a material of the gate spacers 1402 to achieve desired etching selectivity during the etching process. In some embodiments, the inner spacers 1802 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacer layer 1802 includes a low-k dielectric material, such as those described herein.

Referring to FIGS. 19A to 19D, source/drain features 1902 are formed in the source/drain trenches 1602, so that the source/drain features 1902 pass through the 1102 and in the fins 112. The semiconductor layers 108 that extend from one source/drain feature 1902 to the other source/drain feature 1902 may form channels of the GAA device, so that the semiconductor layers 108 may also be referred to as channel layers. One or more epitaxy processes may be employed to grow the source/drain features 1902. In some embodiments, the source/drain features 1902 may have top surfaces that extend higher than the top surface of the topmost semiconductor layer 108 (e.g., in the Z-direction). Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1902 may include any suitable semiconductor materials. For example, the source/drain features 1902 in an n-type GAA device may include silicon (Si), silicon carbide (SiC), silicon phosphide (SiP), silicon arsenide (SiAs), silicon phosphoric carbide (SiPC), or combinations thereof; while the source/drain features 1902 in a p-type GAA device may include silicon (Si), silicon germanium (SiGe), germanium (Ge), silicon germanium carbide (SiGeC), or combinations thereof. The source/drain features 1902 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 1902. The annealing processes may include rapid thermal annealing (RTA) and/or laser annealing processes.

As discussed above, the recesses 1604 are formed through the cap layer 1102 and in the dielectric features 802, so that sidewalls of the cap layer 1102 over the dielectric features 802 are exposed. If an undesired epi layer is grown from the exposed sidewalls of the cap layer 1102 during the formation of the source/drain features 1902, such undesired epitaxial epi layer may merge the two source/drain features 1902 shown in FIG. 19D. In order to prevent such undesirable layer growth, the cap layer 1102 is formed to be thin, with a thickness in a range from about 0.5 nm to about 2 nm, as discussed above. In some embodiments, the cap layer 1102 is fully oxidized into the oxidized cap layer, or it is omitted entirely to prevent the growth of such an undesired epi layer.

Figure 20B:
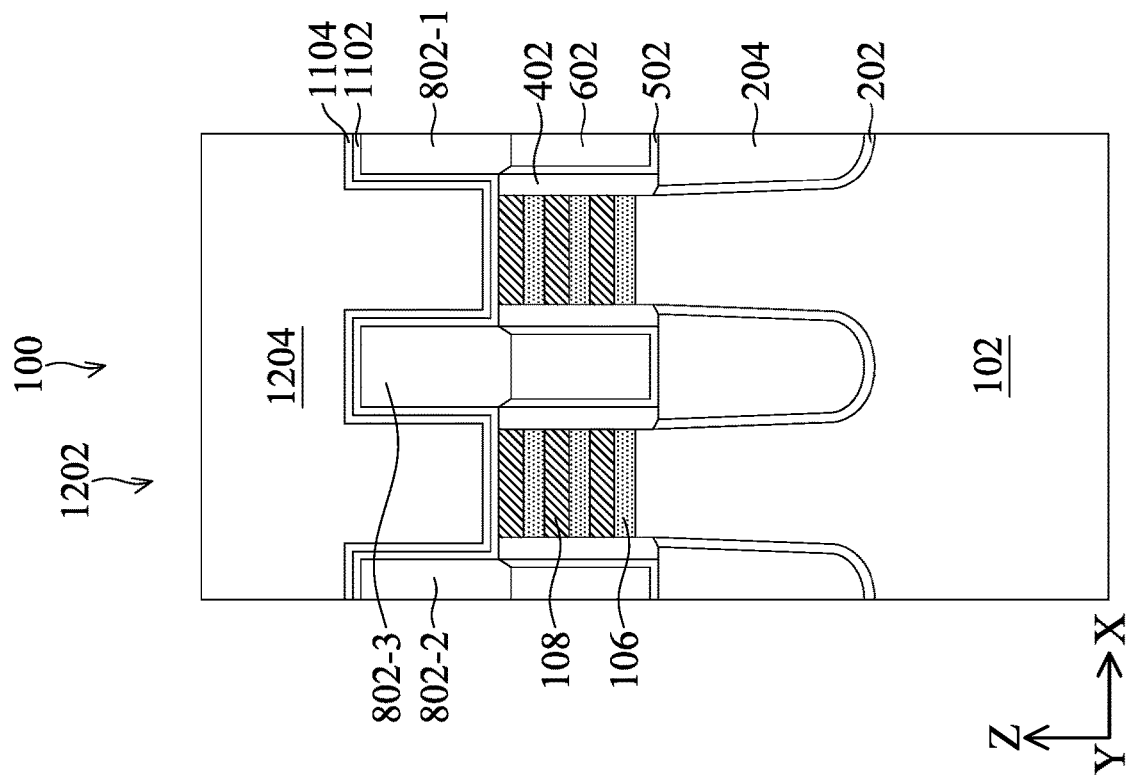
Figure 20A:
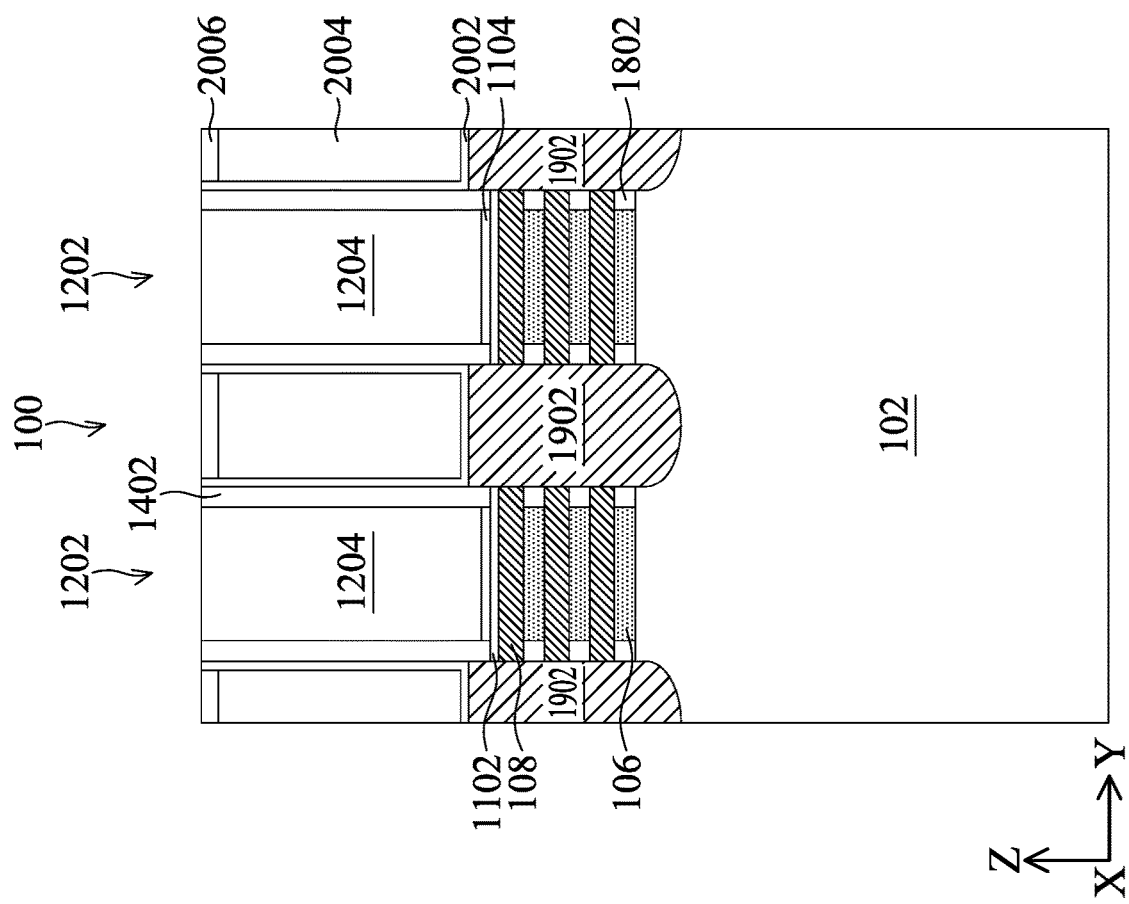

Referring to FIGS. 20A to 20D, a contact etch stop layer (CESL) 2002 over the source/drain features 1902 and an interlayer dielectric (ILD) layer 2004 over the CESL 2002 are formed to fill the space between the gate spacers 1402 and in the recesses 1604. Specifically, the CESL 2002 is conformally formed on the sidewalls of the gate spacers 1402, over the top surfaces of the source/drain features 1902, on the sidewalls of the cap layer 1102, on the sidewalls and top surfaces of the dielectric features 802, as shown in FIGS. 20A and 20C. The ILD layer 2004 is formed over and between the CESL 2002 to fill a remaining portion of the recess 1604 (or in the recessed portions 1606). The CESL 2002 includes a material that is different than ILD layer 2004. The CESL 2002 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 2004 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 2004 may be formed by PECVD (plasma enhanced CVD), FCVD (flowable CVD), or other suitable methods.

Subsequent to the deposition of the CESL 2002 and the ILD layer 2004, a CMP process and/or other planarization process is performed on the CESL 2002, the ILD layer 2002, the gate spacers 1402, and the hard mask layer 1206 until the top surfaces of the dummy gate electrodes 1204 are exposed. In some embodiments, the ILD layer 2004 is recessed to a level below the top surfaces of the dummy gate electrodes 1204 and an ILD protection layer 2006 is formed over the ILD layer 2004 to protect the ILD layer 2004 from subsequent etching processes. As shown in FIGS. 20A to 20D, the ILD layer 2004 is surrounded by the CESL 2002 and the ILD protection layer 2006. In some embodiments, the ILD protection layer 2006 includes a material that is the same as or similar to that in the CESL 2002. In some other embodiments, the ILD protection layer 2006 includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

Figure 21A:
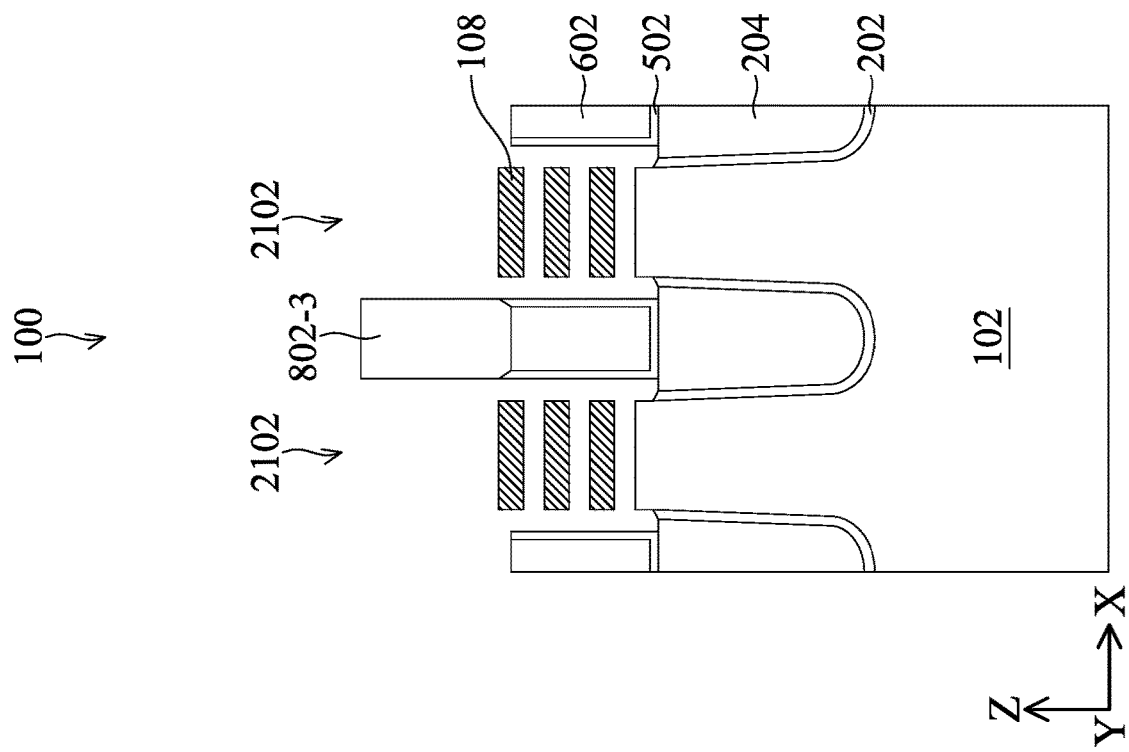
Figure 21B:
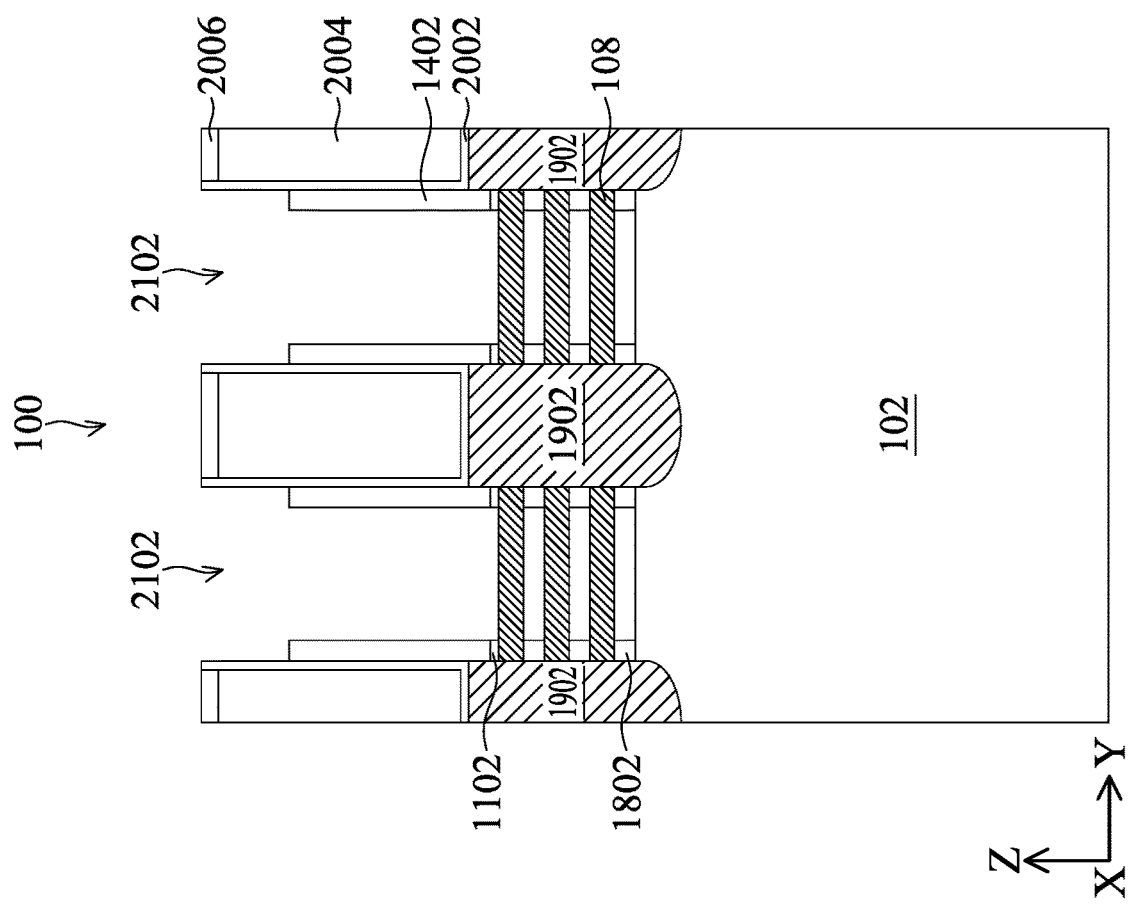

Referring to FIGS. 21A to 21D, the dummy gate structures 1202 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 1202. Then, the dummy gate structures 1202 are selectively etched through the masking element. The gate spacers 1402 may be used as the masking element or a part thereof. In some embodiments, the gate spacers 1402 are also partially recessed, as shown in FIGS. 21A and 21C. Etch selectivity may be achieved by selecting the appropriate etching chemicals, and the dummy gate structures 1202 may be removed without substantially affecting the CESL 2002, the ILD layer 2004, and the ILD protection layer 2006. In some embodiments, a portion of the cap layer 1102 that directly underlies the dummy gate structures 1202 is removed and other portions of the cap layer 1102 sandwiched between the gate spacer 1402 and the topmost surface of the semiconductor layers 108 remain. The removal of the dummy gate structures 1202 creates gate trenches 2102. The gate trenches 2102 expose the top surfaces of the topmost semiconductor layers 108 and the cladding layer 402 that underlies the dummy gate structures 1202. Further, in some embodiments, portions of the dielectric features 802 that directly underlies the dummy gate structures 1202 are removed, such as the dielectric features 802-1 and 802-2 shown in FIG. 20B, and the dielectric feature 802-3 shown in FIG. 21B remain.

Still referring to FIGS. 21A to 21D, the semiconductor layers 106 of the fins 112 and the cladding layer 402 are selectively removed through the gate trenches 2102, using a wet or dry etching process for example, so that the semiconductor layers 108 and are exposed in the gate trench 2102 to form nanostructures. Such a process may also be referred to as a wire release process, a nanowire release process, a nanosheet release process, a nanowire formation process, a nanosheet formation process, or a wire formation process. In some embodiments, the removal of the semiconductor layers 106 and the cladding layer 402 causes the exposed semiconductor layers 108 to be spaced apart from each other in the vertical direction (e.g., in the Z-direction). The exposed semiconductor layers 108 extend longitudinally in the horizontal direction (e.g., in the Y-direction), and each connects one source/drain feature 1902 to another source/drain feature 1902.

Referring to FIGS. 22A to 22D, portions of the dielectric liner 502, the filler layer 602, and the remaining dielectric features 802 exposed in the gate trenches 2102 are trimmed. In some embodiments, two etching processes are designed to target the materials of the dielectric liner 502 and the filler layer 602, respectively. For example, a first etching process (such as a wet etching or a plasma etching) is performed to remove the dielectric liner 502 from the sidewalls of the filler layer 602. Then, a second etching process (such as another wet etching or another plasma etching) is performed to laterally etch the filler layer 602 along the X-direction. The first and the second etching processes are designed to laterally etch the dielectric liner 502 and the filler layer 602 along the X-direction by isotropic plasma etching or chemical etching. The etching processes may also reduce the width (along the X-direction) of the dielectric features 802. The resultant structure is shown in FIG. 22B according to some embodiments. In some embodiments, a portion of the dielectric liner 502 remains below the filler layer 602. In various embodiments, it may use one etching process to etch both the dielectric liner 502 and the filler layer 602 or use more than two etching processes to achieve the same or similar results as discussed above. Further, in some embodiments, the etching processes are configured to selectively etch the dielectric liner 502, the filler layer 602, and the dielectric features 802 with minimal (to no) etching of other features, such as the CESL 2002, the ILD protection layer 2006, the gate spacers 1402, the isolation feature 204, the inner spacers 1802, the semiconductor layers 108, and the substrate 102.

Figure 23A:
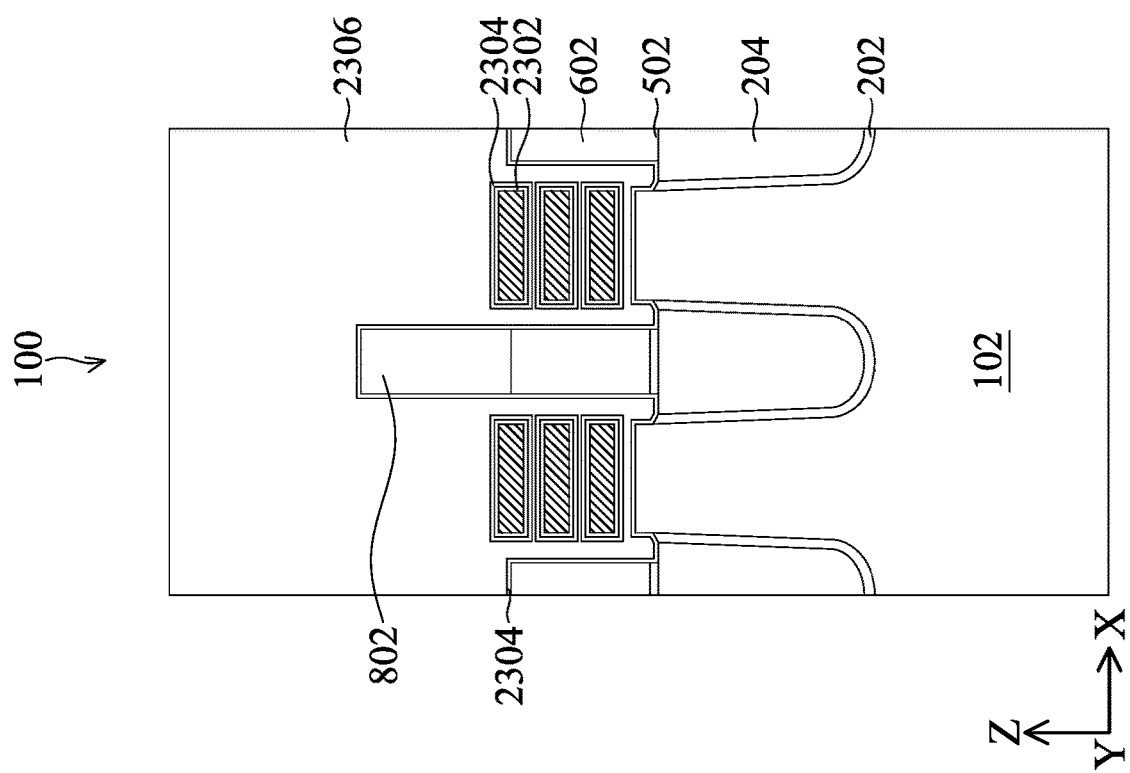
Figure 23B:
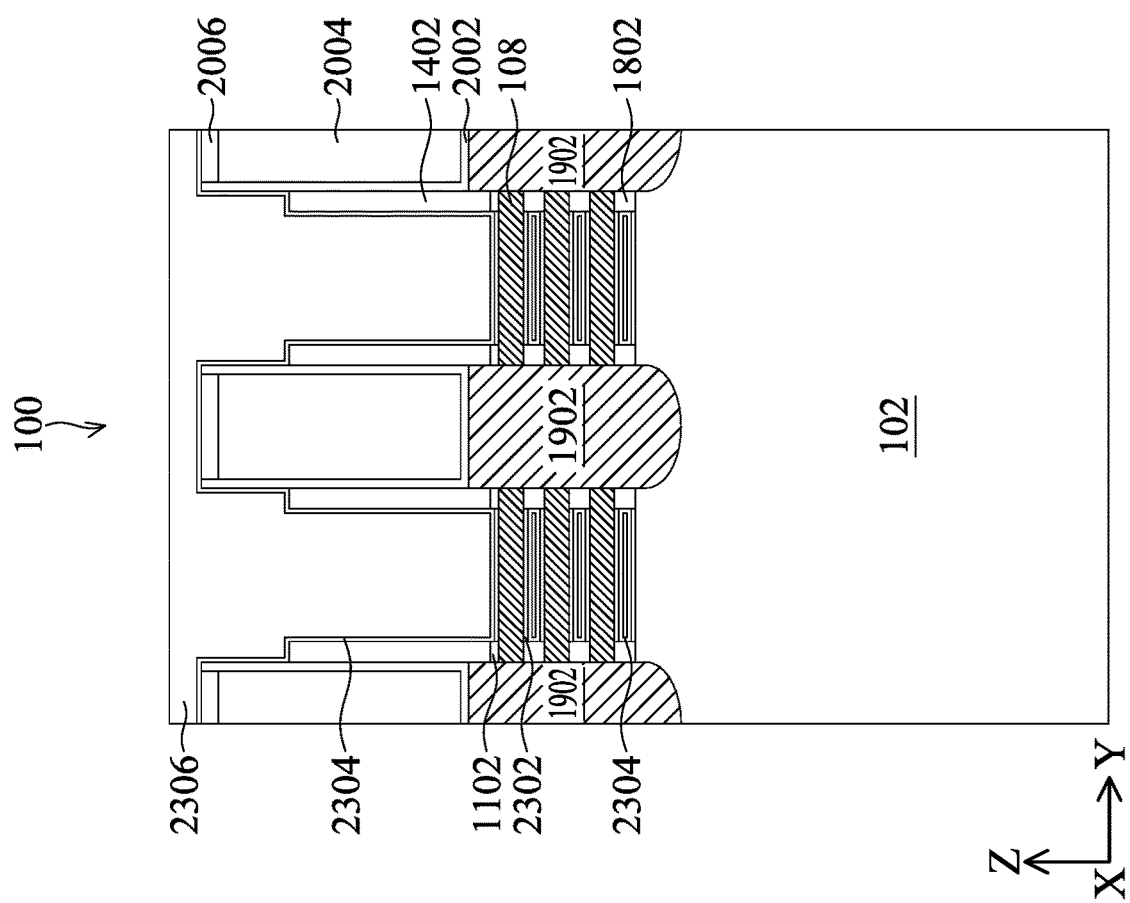

Referring to FIGS. 23A to 23D, interfacial layer 2302 are formed in the gate trenches 2102. Specifically, the interfacial layer 2302 are formed to wrap around the exposed semiconductor layers 108, as shown in FIG. 23B. In some embodiments, the interfacial layer 2302 may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

Still referring to FIGS. 23A to 23D, a gate dielectric layer 2304 and a gate electrode 2306 over the gate dielectric layer 2304 are formed in the gate trenches 2102. In some embodiments, the gate dielectric layer 2304 is formed to wrap around the semiconductor layers 108 and the interfacial layers 2302. Additionally, the gate dielectric layer 2304 also formed on sidewalls of the inner spacers 1802, the gate spacers 1402, the CESL 2002, the filler layer 602, and the dielectric features 802, as well as over the top surface of the filler layer 602, the dielectric features 802, and the ILD protection layer 2006. The gate dielectric layer 2304 may include a dielectric material having a dielectric constant greater than a dielectric constant of $SiO_2$, which is approximately 3.9. For example, the gate dielectric layer 2304 may include hafnium oxide ($HfO_2$), which has a dielectric constant in a range from about 18 to about 40. Alternatively, the gate dielectric layer 2304 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers—2304 may be formed by ALD, PVD, CVD, oxidation, and/or other suitable methods.

The gate electrode 2306 is formed to fill the remaining spaces of the gate trenches 2102 and over the gate dielectric layer 2304 in such a way that the gate electrode 2306 wraps around the semiconductor layers 108, the gate dielectric layer 2304, and the interfacial layers 2302. The gate electrode layer 2306, the gate dielectric layer 2304, and the interfacial layers 2302 may be collectively called as gate structure wrapping around the semiconductor layers 108. The gate electrode 2306 may include a single layer or alternatively a multi-layer structure. In some embodiments, the gate electrode 2306 may include a capping layer, a barrier layer, an n-type work function metal layer, a p-type work function metal layer, and a fill material (not shown).

The capping layer may be formed adjacent to the gate dielectric layer 2304 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

Figure 24A:
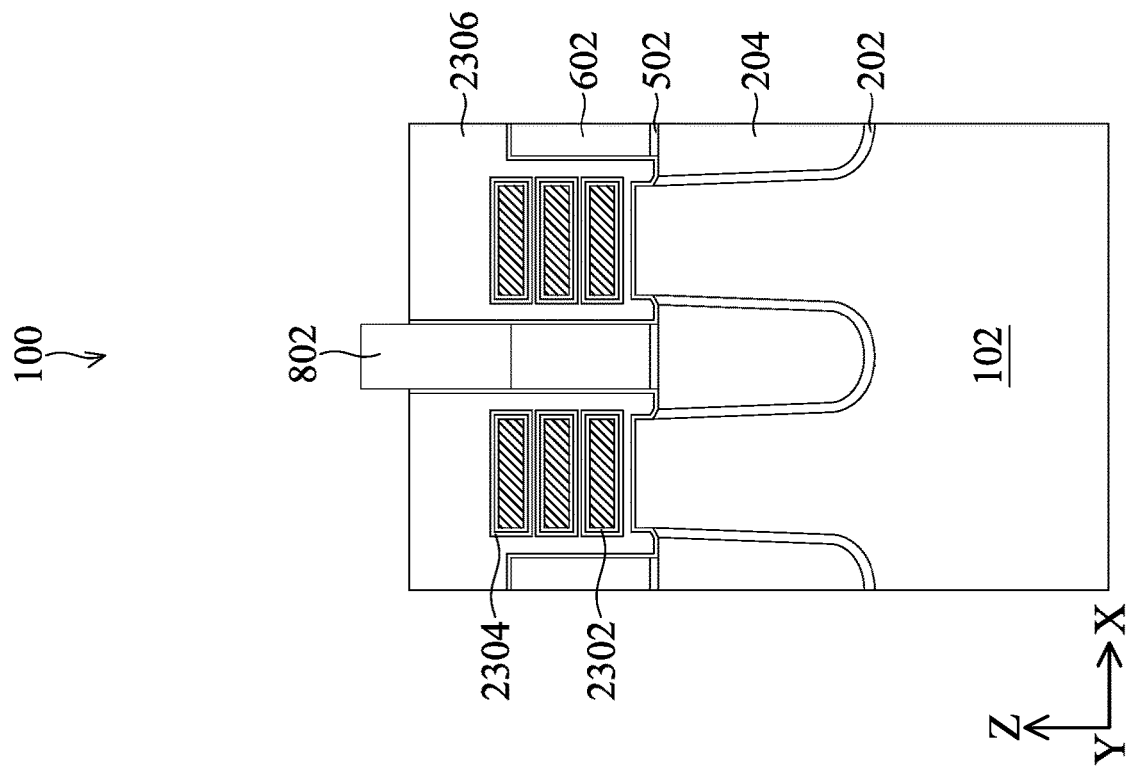
Figure 24B:
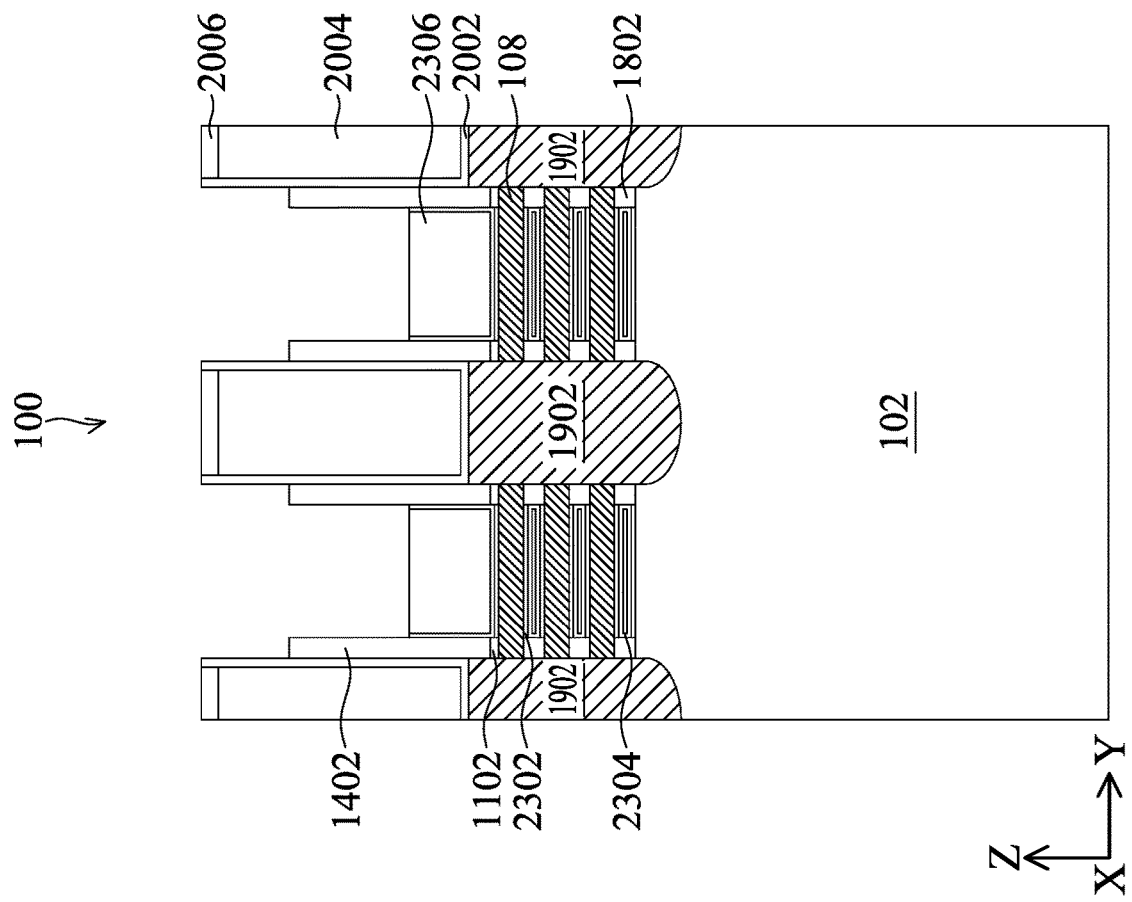
Figure 24D:
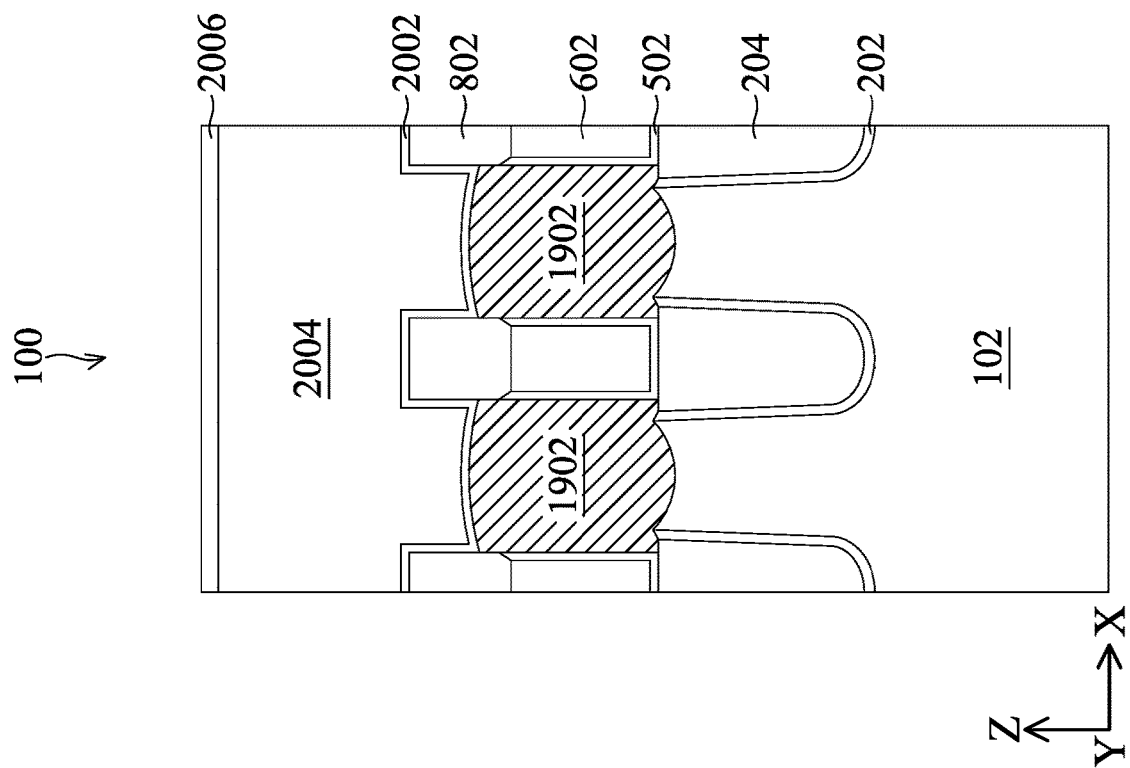
Figure 24C:
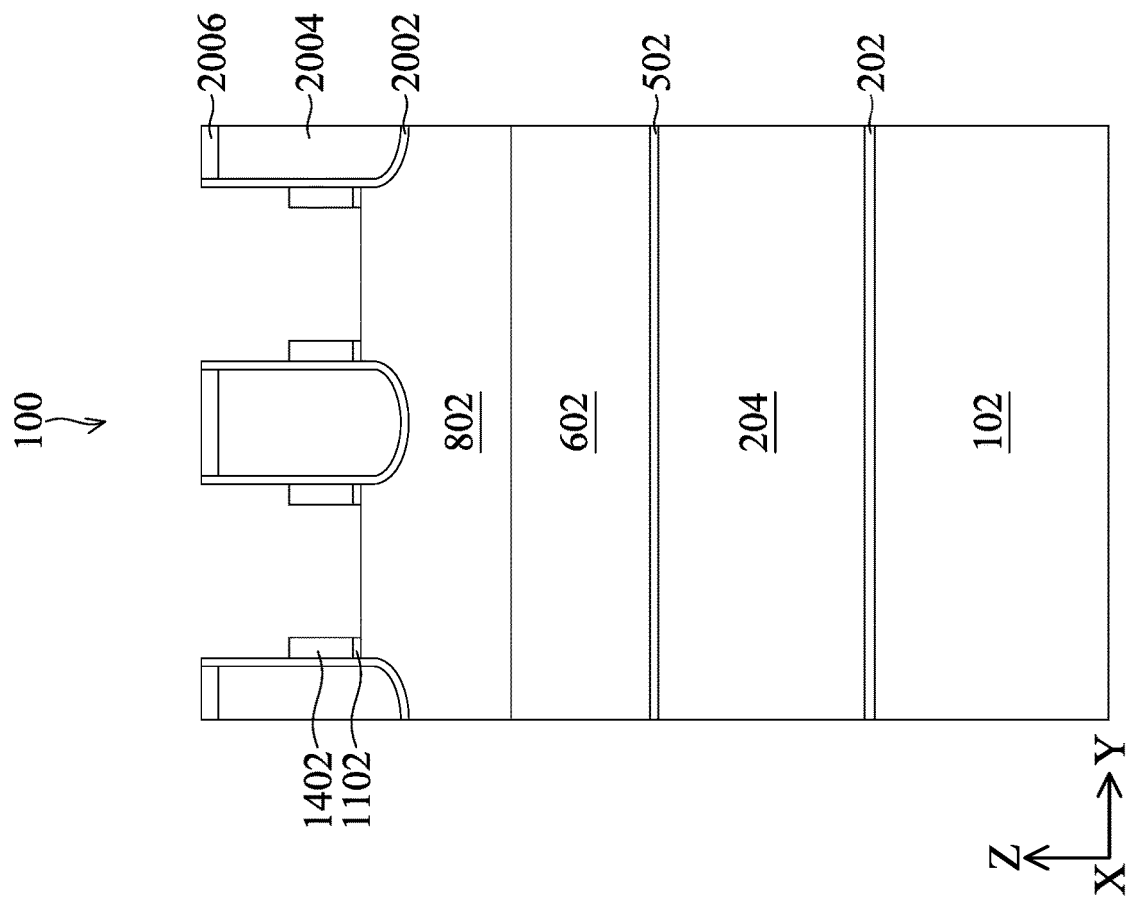
Figure 25B:
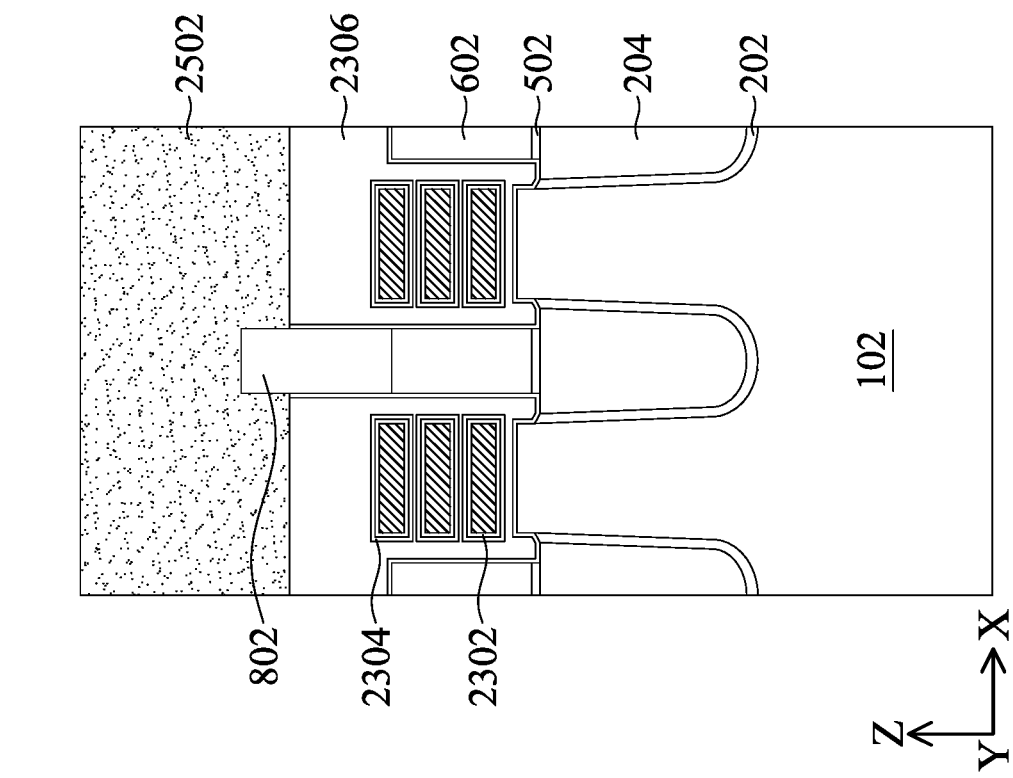
Figure 25A:
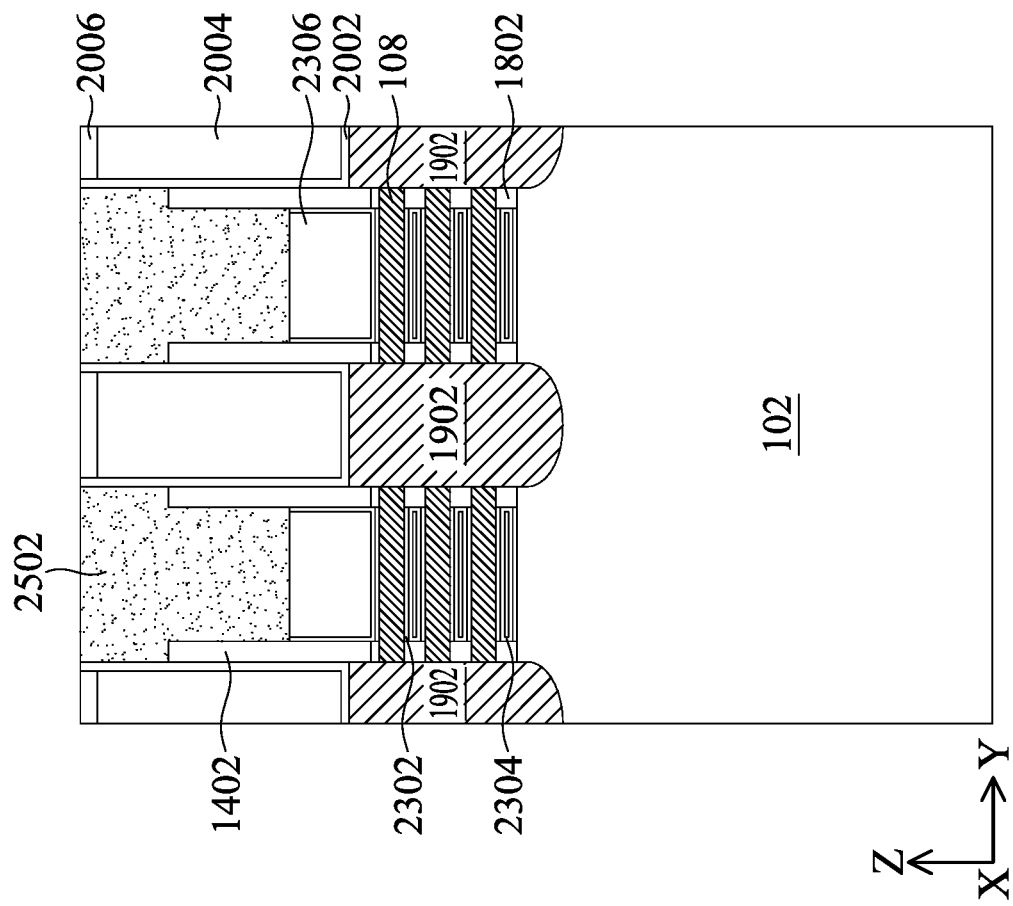
Figure 25D:
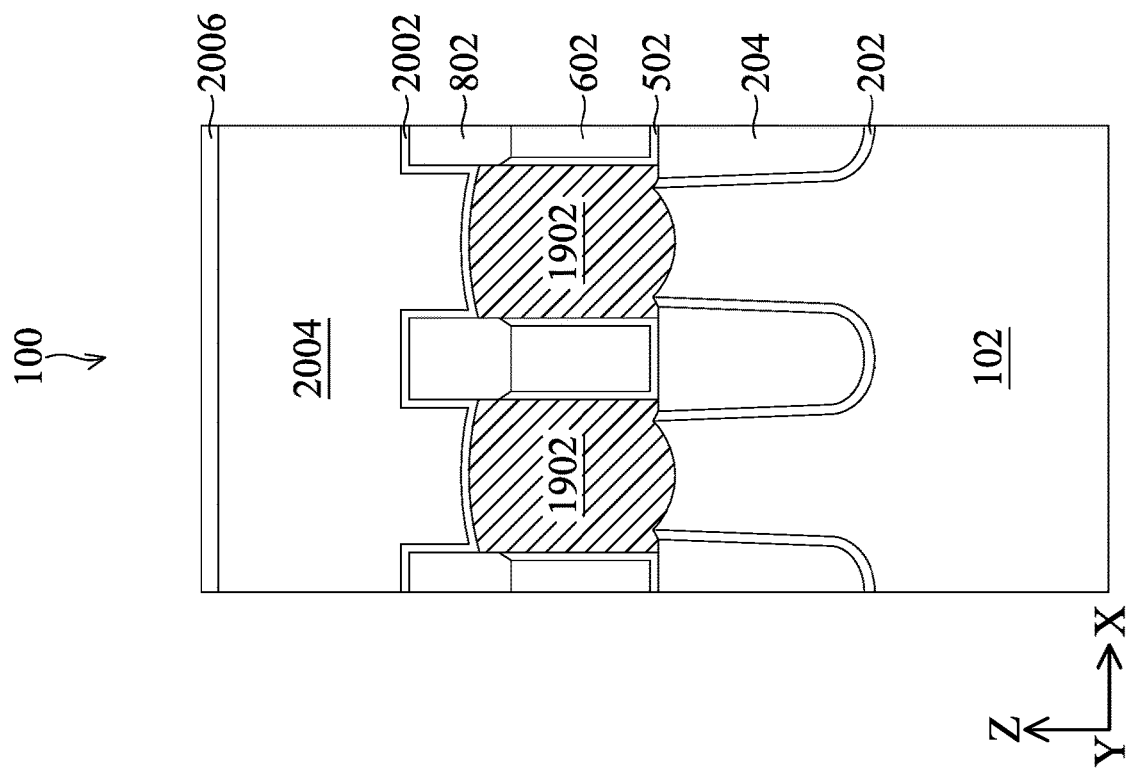
Figure 25C:
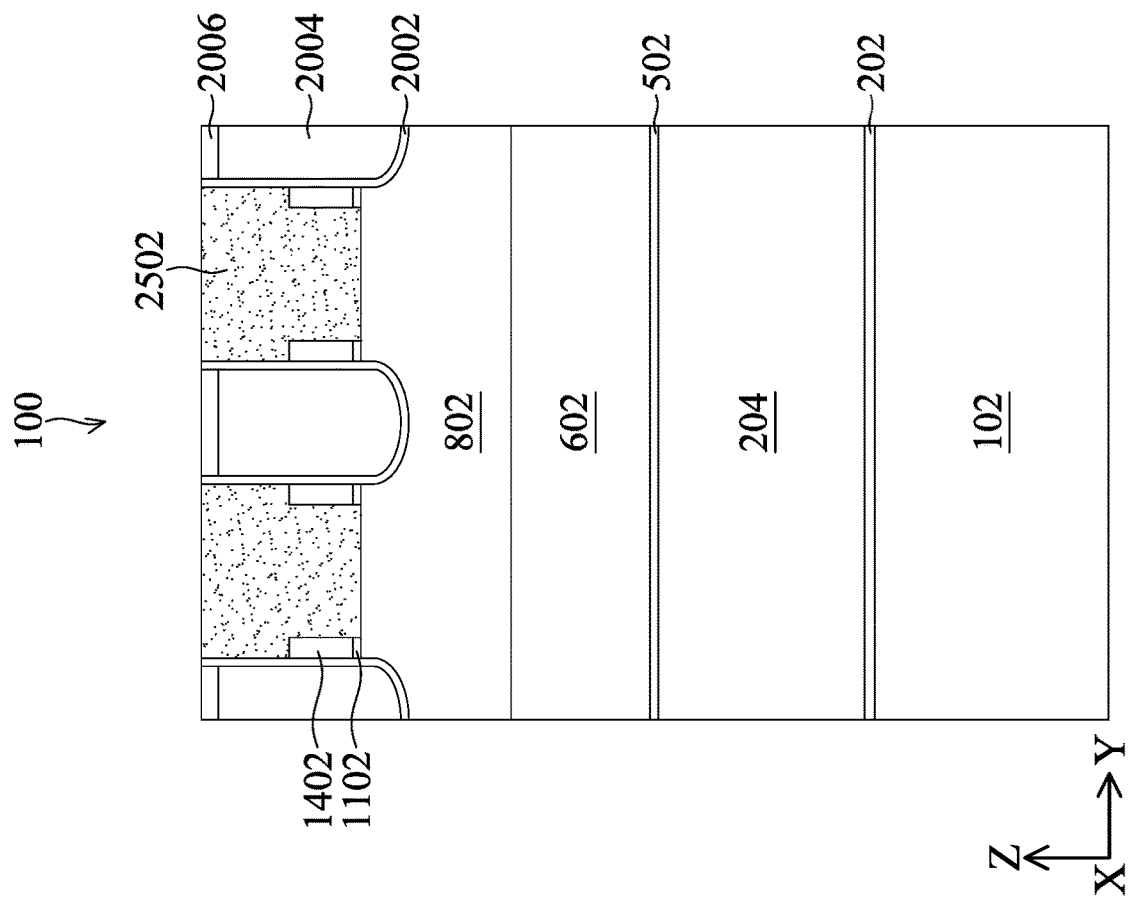

Referring to FIGS. 24A to 24D, the gate electrode layer 2306 is recessed such that its top surface is below the top surface of the dielectric features 802, but above the top surfaces of the filler layer 602. As shown in FIGS. 24A and 24B, gate electrode layer 2306 is effectively cut or separated. This process may also be referred to as self-aligned cut metal gate process (or self-aligned metal gate cut process) because it cuts metal gates without using a photolithography process in this stage and the location of the cuts is predetermined by the location of the dielectric features 802. The self-aligned cut metal gate process is more advantageous than the photolithographic cut metal gate process in that the former is less affected by the photolithography overlay window or shift. This further enhances device down-scaling. As shown in FIG. 24B, the gate electrode layer 2306 is not cut at the locations of the filler layers 602 on which the dielectric features 802 (as the dielectric features 802-1 and 802-2 shown in FIG. 20B) are removed. In other words, as shown in FIG. 24B, the gate electrode layer 2306 to the left and to the right of the dielectric feature 802 remains connected as one continuous gate electrode layer and functions as one gate. The recessing of the gate electrode layer 2306 may implement a wet etching or a dry etching process that selectively etches the gate electrode layer 2306. In some embodiments, the etching process also etches the gate dielectric layer 2304 such that the gate dielectric layer 2304 over the top surfaces and top sidewalls of the dielectric features 802 are removed. In some embodiments, portions of the gate dielectric layer 2304 on the sidewalls of the gate spacers 1402, on the sidewalls of the CESL 2002, and over the ILD protection layer 2006 may also be removed and etched.

Referring to FIGS. 25A to 25D, a dielectric capping layer 2502 is formed over the gate electrode layer 2306 and over the dielectric features 802. In some embodiments, the dielectric capping layer 2502 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric capping layer 2502 protects the gate electrode layer 2306 from etching and CMP processes that are used for etching S/D contact holes in subsequent processes. The dielectric capping layer 2502 may be formed by depositing one or more dielectric materials over the recessed gate electrode layer 2306, the dielectric features 802, and the gate spacers 1402 and performing a CMP process to the one or more dielectric materials. In further fabrication, source/drain contacts, source/drain contact vias, gate vias, and interconnect layers are formed over the workpiece 100 to complete GAA devices.

The embodiments disclosed herein relate to semiconductor structures and their manufacturing methods, and more particularly to semiconductor devices comprising a gate-all-around (GAA) structure having the thinned cap layer over the dielectric features used for cut metal gate process. Furthermore, the present embodiments provide one or more of the following advantages. The thinned cap layer may prevent an undesired epitaxial (epi) layer from growing from the thinned cap layer during source/drain epi growth. This may prevent the undesired epi layer from growing in such a way that it merges two source/drain features of two respective GAA devices.

Thus, one of the embodiments of the present disclosure describes a method for manufacturing a semiconductor structure that includes forming a fin over a substrate. The fin includes first semiconductor layers and second semiconductor layers alternating stacked. In some embodiments, the method further includes forming an isolation feature around the fin, forming a dielectric feature over the isolation feature, forming a cap layer over the fin and the dielectric feature, oxidizing the cap layer to form an oxidized cap layer, forming source/drain features passing through the cap layer and in the fin, removing the second semiconductor layers in the fin to form nanostructures, and forming a gate structure wrapping around the nanostructures.

In another of the embodiments, discussed is a method for manufacturing a semiconductor structure that includes forming a fin extending in a first direction and over a substrate. The fin comprises first semiconductor layers and second semiconductor layers alternating stacked. In some embodiments, the method further includes forming an isolation feature extending in the first direction and arranged with the fin in a second direction perpendicular to the first direction, forming a dielectric feature extending in the first direction and over the isolation feature, forming an oxide layer over the fin and the dielectric feature, recessing the fin to form source/drain trenches and recessing the dielectric feature to form a recess, forming source/drain features in the source/drain trenches, removing the second semiconductor layers in the fin to form a gate trench, and forming a gate structure in the gate trench, wherein the gate structure wraps around the first semiconductor layers.

In yet another of the embodiments, discussed is a semiconductor structure including a substrate, nanostructures extending longitudinally in a first direction and over the substrate, and a source/drain feature over the substrate. The nanostructures connect the source/drain feature in the first direction. In some embodiments, the semiconductor structure further includes a gate structure, an isolation feature, a dielectric feature, and an interlayer dielectric layer. The gate structure wraps around the nanostructures. The isolation feature extends in the first direction and arranged with the gate structure and the source/drain feature in a second direction perpendicular to the first direction. The dielectric feature extends in the first direction and over the isolation feature. The dielectric feature has a recessed portion. The interlayer dielectric layer is over the source/drain feature and in the recessed portion of the dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a fin over a substrate, wherein the fin comprises first semiconductor layers and second semiconductor layers alternating stacked;
    forming an isolation feature around the fin;
    forming a dielectric feature over the isolation feature;
    forming a cap layer over the fin and the dielectric feature;
    oxidizing the cap layer to form an oxidized cap layer;
    forming source/drain features in the fin;
    removing the second semiconductor layers in the fin to form nanostructures; and
    forming a gate structure wrapping around the nanostructures.

2. The method of claim 1, wherein the cap layer is fully oxidized into the oxidized cap layer.

3. The method of claim 1, wherein an upper portion of the cap layer is oxidized into the oxidized cap layer.

4. The method of claim 3, wherein the cap layer has a thickness in a range from about 0.5 nanometers to about 2 nanometers.

5. The method of claim 1, further comprising:
    forming an oxide layer over the oxidized cap layer during the oxidizing of the cap layer.

6. The method of claim 5, wherein the oxide layer is formed by plasma-enhanced chemical vapor deposition.

7. The method of claim 5, wherein the oxide layer and the oxidized cap layer comprise silicon oxide.

8. The method of claim 1, further comprising:
    forming source/drain trenches passing through the cap layer and in the fin, while forming a recess in the dielectric feature; and
    forming the source/drain features in the source/drain trenches.

9. The method of claim 8, wherein sidewalls of the cap layer are exposed after forming the recess.

10. The method of claim 9, further comprising:
    forming a contact etch stop layer on the sidewalls of the cap layer and on the sidewalls and top surfaces of the dielectric feature; and
    forming an interlayer dielectric layer to fill a remaining portion of the recess.

11. The method of claim 1, wherein the cap layer is formed by an epitaxial process.

12. A method for manufacturing a semiconductor structure, comprising:
    forming a fin extending in a first direction and over a substrate, wherein the fin comprises first semiconductor layers and second semiconductor layers alternating stacked;
    forming an isolation feature extending in the first direction and arranged with the fin in a second direction perpendicular to the first direction;
    forming a cladding layer on a sidewall of the fin;
    forming a dielectric feature extending in the first direction and over the isolation feature;
    forming an oxide layer over the fin, the cladding layer, and the dielectric feature;
    recessing the fin to form source/drain trenches and recessing the dielectric feature to form a recess;
    forming source/drain features in the source/drain trenches;
    removing the second semiconductor layers in the fin to form a gate trench; and
    forming a gate structure in the gate trench, wherein the gate structure wraps around the first semiconductor layers.

13. The method of claim 12, further comprising:
    forming a cap layer over the fin and the dielectric feature before forming the oxide layer.

14. The method of claim 13, further comprising:
    forming a dummy gate structure extending in the second direction and over the fin and the cap layer;
    forming gate spacers on sidewalls of the dummy gate structure and over the cap layer; and
    removing the dummy gate structure.

15. The method of claim 14, further comprising:
    forming inner spacers in the gaps, wherein sidewalls of the inner spacers are aligned to sidewalls of the cap layer over the fin.

16. The method of claim 13, further comprising:
    removing side portions of the second semiconductor layers to form gaps below the cap layer and between the first semiconductor layers after the forming of the formation of the source/drain trenches.

17. The method of claim 13, further comprising:
    forming a contact etch stop layer in the recess and on a sidewall of the cap layer; and
    forming an interlayer dielectric layer on the contact etch stop layer and filling the recess.

18. The method of claim 13, wherein the cap layer comprises silicon and the oxide layer comprises silicon oxide.

19. The method of claim 12, wherein a top portions of the dielectric feature is recessed during the recessing of the fin.

20. A method for manufacturing a semiconductor structure, comprising:
    forming a fin having a base portion and a stack portion over the base portion, wherein the stack portion comprises first semiconductor layers and second semiconductor layers alternating stacked;
    forming an isolation feature around the base portion;
    forming a dielectric feature over the isolation feature;
    forming a cap layer over the fin and the dielectric feature;
    forming an oxide layer over the cap layer, wherein a portion of the oxide layer is formed by oxidizing an upper portion of the cap layer;
    forming source/drain trenches in the fin and recesses in the dielectric feature, wherein the recesses expose sidewalls of the cap layer;
    forming source/drain features in the fin;
    forming a contact etch stop layer in the recesses and in contact with the sidewalls of the cap layer;

removing the second semiconductor layers in the fin to form a gate trench exposing the first semiconductor layers; and forming a gate structure in the gate trench, wherein the gate structure wraps around the first semiconductor layers.

\* \* \* \* \*